United States Patent
Hara et al.

(10) Patent No.: US 11,302,718 B2
(45) Date of Patent: Apr. 12, 2022

(54) ACTIVE MATRIX SUBSTRATE AND PRODUCTION METHOD THEREFOR

(71) Applicant: Sharp Kabushiki Kaisha, Sakai (JP)

(72) Inventors: Kengo Hara, Sakai (JP); Tohru Daitoh, Sakai (JP); Hajime Imai, Sakai (JP); Tetsuo Kikuchi, Sakai (JP); Hideki Kitagawa, Sakai (JP); Teruyuki Ueda, Sakai (JP); Masahiko Suzuki, Sakai (JP); Setsuji Nishimiya, Sakai (JP); Toshikatsu Itoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 217 days.

(21) Appl. No.: 16/613,873

(22) PCT Filed: May 11, 2018

(86) PCT No.: PCT/JP2018/018366
§ 371 (c)(1),
(2) Date: Nov. 15, 2019

(87) PCT Pub. No.: WO2018/212100
PCT Pub. Date: Nov. 22, 2018

(65) Prior Publication Data
US 2020/0185425 A1    Jun. 11, 2020

(30) Foreign Application Priority Data
May 18, 2017   (JP) .............................. JP2017-098951

(51) Int. Cl.
*H01L 27/12*       (2006.01)
*G02F 1/1362*      (2006.01)
(Continued)

(52) U.S. Cl.
CPC ........ *H01L 27/1225* (2013.01); *G02F 1/1368* (2013.01); *G02F 1/136286* (2013.01);
(Continued)

(58) Field of Classification Search
CPC . H01L 27/1225; H01L 27/124; H01L 27/127; H01L 27/1288; H01L 29/78648;
(Continued)

(56) References Cited

U.S. PATENT DOCUMENTS 8,963,154 B2    2/2015  Park et al.
2005/0139924 A1  6/2005  Kim et al.
(Continued)

FOREIGN PATENT DOCUMENTS

JP    2005-197727 A    7/2005
JP    2008-032899 A    2/2008
(Continued)

OTHER PUBLICATIONS

Official Communication issued in International Patent Application No. PCT/JP2018/018366, dated Jul. 24, 2018.

*Primary Examiner* — Elias Ullah
(74) *Attorney, Agent, or Firm* — Keating & Bennett, LLP

(57) ABSTRACT

Each of pixel regions of an active matrix substrate (1002) includes: a lower insulating layer (5); an oxide semiconductor layer (7) that is arranged on the lower insulating layer and includes an active region (7a) of an oxide semiconductor TFT; an upper insulating layer (9) that is arranged on a portion of the oxide semiconductor layer so as not to be in contact with the lower insulating layer; an upper gate layer (10) that is arranged on the upper insulating layer and includes an upper gate electrode (10a) and one of a plurality of gate bus lines (GL); and a source electrode and a drain electrode, wherein: the oxide semiconductor layer 7 further includes an extension region (7e) that extends from the
(Continued)

active region (7a) in a direction x different from a channel length direction y of the oxide semiconductor TFT as seen from a normal direction to the substrate; and the extension region (7e) is arranged on the substrate side of one of the plurality of gate bus lines (GL) with an upper insulating layer (9) interposed therebetween, and includes a portion that extends so as to overlap with the one of the plurality of gate bus lines.

10 Claims, 66 Drawing Sheets

(51) Int. Cl.
*G02F 1/1368* (2006.01)
*G02F 1/1343* (2006.01)
(52) U.S. Cl.
CPC .......... *H01L 27/124* (2013.01); *H01L 27/127* (2013.01); *H01L 27/1288* (2013.01); *G02F 1/13685* (2021.01); *G02F 1/134363* (2013.01); *G02F 1/136295* (2021.01); *G02F 2201/40* (2013.01)
(58) Field of Classification Search
CPC .......... H01L 29/7869; G02F 1/136286; G02F 1/1368; G02F 1/134363; G02F 1/136295; G02F 1/13685; G02F 2201/40; G09F 9/00; G09F 9/30
See application file for complete search history.

(56) References Cited

U.S. PATENT DOCUMENTS

| | | |
|---|---|---|
| 2008/0024416 A1 | 1/2008 | Onogi et al. |
| 2009/0323005 A1 | 12/2009 | Ota |
| 2011/0024755 A1 | 2/2011 | Korenari et al. |
| 2012/0138922 A1 | 6/2012 | Yamazaki et al. |
| 2013/0320334 A1 | 12/2013 | Yamazaki et al. |
| 2014/0042429 A1* | 2/2014 | Park .................. H01L 29/7869 257/43 |
| 2014/0286076 A1 | 9/2014 | Aoki et al. |
| 2015/0108467 A1 | 4/2015 | Moriguchi et al. |
| 2015/0323823 A1 | 11/2015 | Yamazaki et al. |
| 2017/0317217 A1 | 11/2017 | Ito et al. |

FOREIGN PATENT DOCUMENTS

| | | |
|---|---|---|
| JP | 2010-008758 A | 1/2010 |
| JP | 2011-049529 A | 3/2011 |
| JP | 2012-134475 A | 7/2012 |
| JP | 2014-007399 A | 1/2014 |
| JP | 2014-039009 A | 2/2014 |
| JP | 2014-209727 A | 11/2014 |
| JP | 2016-154245 A | 8/2016 |
| WO | 2012/086513 A1 | 6/2012 |
| WO | 2016/076168 A1 | 5/2016 |

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

ACTIVE MATRIX SUBSTRATE AND PRODUCTION METHOD THEREFOR

TECHNICAL FIELD

The present invention relates to an active matrix substrate using an oxide semiconductor and a method for manufacturing the same.

BACKGROUND ART

Display devices having an active matrix substrate on which a switching element is provided for each pixel have been widely used. An active matrix substrate including thin film transistors (hereinafter "TFTs") as switching elements is referred to as a TFT substrate. Note that in the present specification, a portion of a TFT substrate that corresponds to a pixel of a display device may also be referred to as a pixel. A TFT provided as a switching element for each pixel of the active matrix substrate is referred to as a "pixel TFT".

In some cases, peripheral circuits such as driving circuits are monolithically (integrally) formed on the active matrix substrate. In such a case, TFTs used in the peripheral circuits are referred to as "circuit TFTs".

In recent years, it has been proposed in the art to use an oxide semiconductor, instead of an amorphous silicon or a polycrystalline silicon, as the material of the active layer of a TFT. Such a TFT is referred to as an "oxide semiconductor TFT". An oxide semiconductor has a higher mobility than an amorphous silicon. Therefore, an oxide semiconductor TFT is capable of operating at a higher speed than an amorphous silicon TFT. Since oxide semiconductor films are formed by a simpler process than polycrystalline silicon films, it can be applied to devices that are required to have large areas.

For example, the mobility of an In—Ga—Zn—O-based oxide semiconductor (In:Ga:Zn=1:1:1) is higher than (about 20 times) that of an amorphous silicon, but is at present lower than that of a polycrystalline silicon. Therefore, when oxide semiconductor TFTs are used as pixel TFTs, the ON current may possibly be lower than when polycrystalline silicon TFTs are used. In order to increase the ON current, one may consider using oxide semiconductor TFTs having a double gate structure, for example. In the present specification, the structure in which the gate electrode is arranged on the substrate side of the oxide semiconductor layer and on the side opposite to the substrate is referred to as the "double gate structure". The gate electrode arranged on the substrate side of the oxide semiconductor layer will be referred to as the "lower gate electrode", and the gate electrode arranged on the oxide semiconductor layer will be referred to as the "upper gate electrode".

An active matrix substrate using oxide semiconductor TFTs having the double gate structure is disclosed in Patent Document No. 1, for example.

CITATION LIST

Patent Literature

Patent Document No. 1: International Publication WO2016/076168 pamphlet

SUMMARY OF INVENTION

Technical Problem

However, according to a study by the present inventors, if oxide semiconductor TFTs having the double gate structure are used as pixel TFTs, when patterning the gate insulating layer between the oxide semiconductor layer and the upper gate electrode (referred to as the "upper insulating layer"), the surface of the gate insulating layer between the oxide semiconductor layer and the lower gate electrode (referred to as the "lower insulating layer") may be etched (over-etched). If such over-etching occurs, it may possibly lower the reliability of the oxide semiconductor TFTs. The details will be described later. Note that similar problems may occur also with oxide semiconductor TFTs of the single gate structure having the upper gate electrode (referred to as the "top gate structure").

An object of one embodiment of the present invention is to provide an active matrix substrate having oxide semiconductor TFTs that can have a high reliability.

Solution to Problem

An active matrix substrate according to one embodiment of the present invention is an active matrix substrate having a display region including a plurality of pixel regions, the active matrix substrate including: a substrate; a plurality of gate bus lines and a plurality of source bus lines supported on the substrate; and oxide semiconductor TFTs arranged respectively in the plurality of pixel regions, wherein: each of the plurality of pixel regions includes: a lower insulating layer supported on the substrate; an oxide semiconductor layer arranged on the lower insulating layer, wherein the oxide semiconductor layer includes an active region of the oxide semiconductor TFT; an upper insulating layer arranged on a portion of the oxide semiconductor layer so as not to be in contact with the lower insulating layer; an upper gate layer arranged on the upper insulating layer, wherein the upper gate layer includes an upper gate electrode that overlaps with a portion of the active region of the oxide semiconductor layer as seen from a normal direction to the substrate, and one of the plurality of gate bus lines formed integral with the upper gate electrode; and a source electrode and a drain electrode that are in contact with the active region of the oxide semiconductor layer; the oxide semiconductor layer further includes an extension region that extends from the active region in a direction different from a channel length direction of the oxide semiconductor TFT as seen from the normal direction to the substrate; and the extension region is arranged on the substrate side of the one of the plurality of gate bus lines with the upper insulating layer interposed therebetween, and includes a portion that extends so as to overlap with the one of the plurality of gate bus lines.

In one embodiment, in the oxide semiconductor layer, the extension region extends to overlap with the one of the plurality of gate bus lines so as to connect between the active regions of two adjacent ones of the plurality of pixel regions.

In one embodiment, an almost entirety of a lower surface of the one of the plurality of gate bus lines is in contact with the upper insulating layer, and an almost entirety of a lower surface of the upper insulating layer is in contact with the oxide semiconductor layer.

In one embodiment, the each of the plurality of pixel regions further includes: a lower gate layer that is arranged between the substrate and the lower insulating layer; and a gate contact portion that electrically connects together the lower gate layer and the upper gate layer; as seen from the normal direction to the substrate, the lower gate layer includes a lower gate electrode that overlaps with at least a portion of the active region of the oxide semiconductor layer, and a lower gate extension that extends from the lower gate electrode to the gate contact portion; and in the gate contact portion, the extension region of the oxide semiconductor layer includes a portion that is arranged on the substrate side of the upper gate layer with the upper insulating layer interposed therebetween.

An active matrix substrate according to another embodiment of the present invention is an active matrix substrate having a display region including a plurality of pixel regions, the active matrix substrate including: a substrate; a plurality of gate bus lines and a plurality of source bus lines supported on the substrate; and oxide semiconductor TFTs arranged respectively in the plurality of pixel regions, wherein: each of the plurality of pixel regions includes: a lower gate layer that is supported on the substrate and includes a lower gate electrode; a lower insulating layer that covers the lower gate layer; an oxide semiconductor layer that is arranged on the lower insulating layer and includes an active region of the oxide semiconductor TFT, wherein at least a portion of the active region overlaps with the lower gate layer as seen from a normal direction to the substrate; an upper insulating layer arranged on a portion of the oxide semiconductor layer so as not to be in contact with the lower insulating layer; an upper gate layer arranged on the upper insulating layer; a source electrode and a drain electrode that are in contact with the active region of the oxide semiconductor layer; and a gate contact portion that electrically connects together the lower gate layer and the upper gate layer; as seen from the normal direction to the substrate, the upper gate layer includes an upper gate electrode that overlaps with a portion of the active region of the oxide semiconductor layer, and an upper gate extension that extends from the upper gate electrode to the gate contact portion; the oxide semiconductor layer further includes an extension region that extends from the active region in a direction different from a channel length direction of the oxide semiconductor TFT as seen from the normal direction to the substrate; and in the gate contact portion, the extension region includes a portion that is arranged on the substrate side of the upper gate extension with the upper insulating layer interposed therebetween.

In one embodiment, the lower gate layer includes one of the plurality of gate bus lines that is formed integral with the lower gate electrode.

In one embodiment, the gate contact portion includes a gate connecting portion that is provided in a layer the upper gate layer; the gate contact portion includes: a first portion that connects together the gate connecting portion and the upper gate layer in a first opening that exposes a portion of the upper gate layer; and a second portion that connects together the gate connecting portion and the lower gate layer in a second opening that exposes a portion of the lower gate layer; and the first portion and the second portion are arranged spaced apart from each other.

In one embodiment, as seen from the normal direction to the substrate, the gate connecting portion extends from the first portion to the second portion so as to overlap with the lower gate layer.

In one embodiment, as seen from the normal direction to the substrate, the first portion is arranged so as not to overlap with the lower gate layer.

In one embodiment, the gate contact portion includes a gate connecting portion that is provided in a layer the upper gate layer; and the gate connecting portion is in contact with the upper gate layer and the lower gate layer in a single opening that exposes a portion of the upper gate layer and a portion of the lower gate layer.

In one embodiment, an outer edge of the extension region of the oxide semiconductor layer is located inside an outer edge of the upper gate layer; and in the single opening, the gate connecting portion is in contact with a side surface of the upper gate layer and a side surface of the upper insulating layer, and is not in contact with a side surface of the extension region of the oxide semiconductor layer.

In one embodiment, the gate connecting portion is formed by using a same conductive film as the source electrode.

In one embodiment, the each of the plurality of pixel regions further includes a transparent electrode that is arranged on the oxide semiconductor TFT with an insulating film interposed therebetween; and the gate connecting portion is formed by using a same conductive film as the transparent electrode.

In one embodiment, the oxide semiconductor layer includes an In—Ga—Zn—O-based semiconductor.

In one embodiment, the In—Ga—Zn—O-based semiconductor includes a crystalline portion.

A method for manufacturing an active matrix substrate according to one embodiment of the present invention is a method for manufacturing an active matrix substrate having a display region including a plurality of pixel regions, the active matrix substrate including a plurality of gate bus lines and a plurality of source bus lines arranged in the display region, and oxide semiconductor TFTs arranged respectively in the plurality of pixel regions, the method including the steps of: (A) forming a lower insulating layer on a substrate; (B) forming an oxide semiconductor film, an upper insulating film and an upper gate conductive film in this order on the lower insulating layer; (C) patterning the upper gate conductive film by using a first mask so as to form an upper gate layer including an upper gate electrode of the oxide semiconductor TFT; (D) patterning the upper insulating film by using the first mask or the upper gate layer as a mask so as to form an upper insulating layer; and (E) after the step (D), patterning the oxide semiconductor film by using a second mask different from the first mask and the upper gate layer as a mask so as to form an oxide semiconductor layer including an active region of the oxide semiconductor TFT.

In one embodiment, the method further includes the steps of: before the step (A), forming a lower gate layer including a lower gate electrode of the oxide semiconductor TFT on the substrate; and after the step (E), forming a gate contact portion that electrically connects together the upper gate layer and the lower gate layer.

In one embodiment, the upper gate layer or the lower gate layer includes one of the plurality of gate bus lines.

In one embodiment, in the step (E), the oxide semiconductor film is patterned under conditions such that the oxide semiconductor film is etched to an inside of an outer edge of the upper gate layer as seen from a normal direction to the substrate.

In one embodiment, the oxide semiconductor film includes an In—Ga—Zn—O-based semiconductor.

Advantageous Effects of Invention

According to one embodiment of the present invention, there is provided an active matrix substrate having oxide semiconductor TFTs that can have a high reliability.

DESCRIPTION OF EMBODIMENTS

First Embodiment

An active matrix substrate of the first embodiment will now be described with reference to the drawings. An active matrix substrate having a gate driver monolithically formed thereon and having a source driver mounted thereon will be described below as an example. Note that with the active matrix substrate of the present embodiment, it is only required that oxide semiconductor TFTs having an upper gate electrode (top gate structure TFTs or double gate structure TFTs) be formed as pixel TFTs.

First, the outline of the structure of the active matrix substrate will be described.

Figure 1:
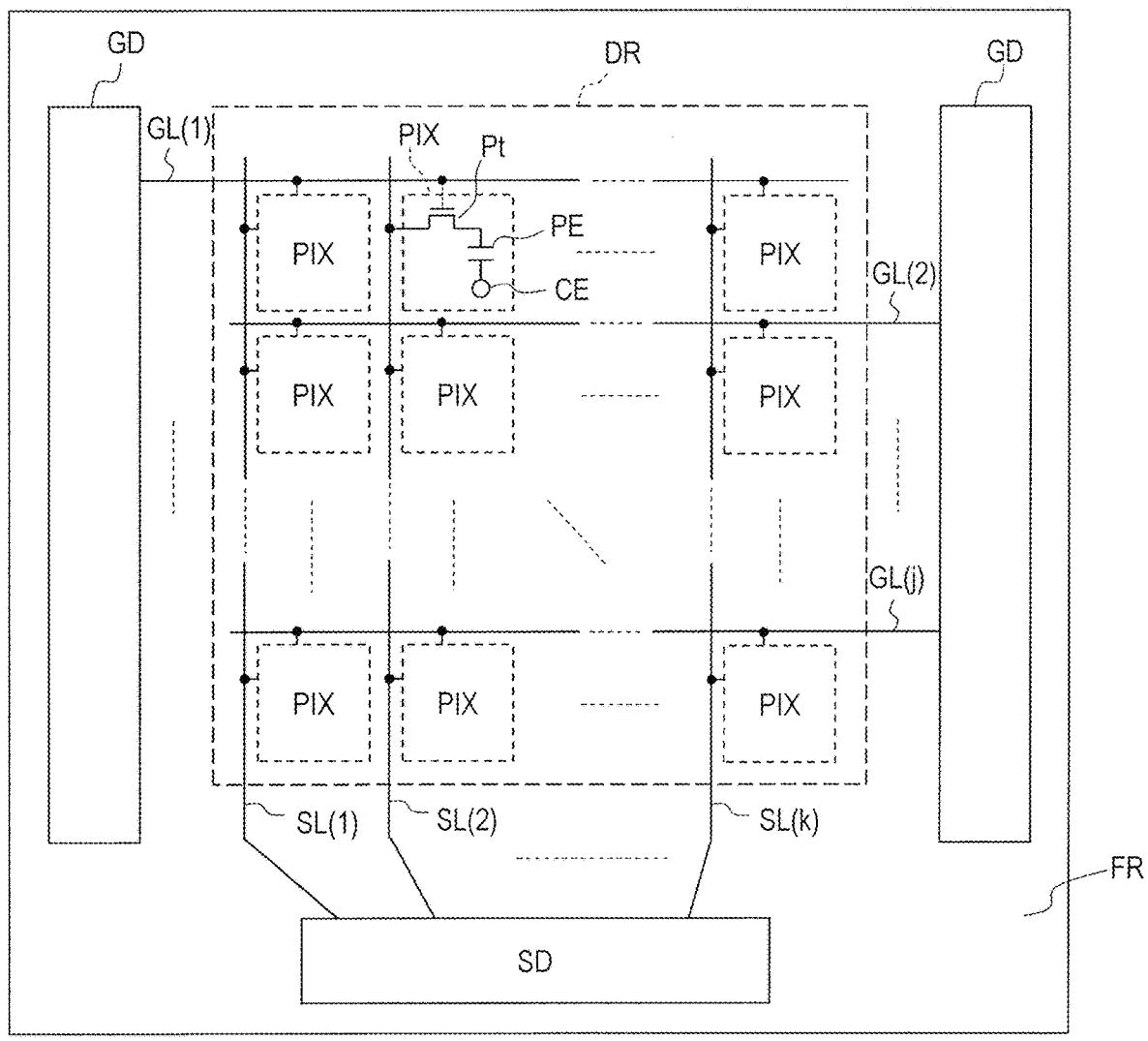
FIG. 1 is a schematic diagram showing an example of a planar structure of an active matrix substrate of a first embodiment.
Figure 1:
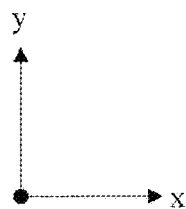

FIG. 1 is a schematic diagram showing an example of a planar structure of an active matrix substrate of the present embodiment.

The active matrix substrate includes a display region DR, and a region (a non-display region or a bezel region) FR other than the display region DR. The display region DR includes pixel regions PIX that are arranged in a matrix pattern. A pixel region PIX (which may be referred to simply as a "pixel") is a region that corresponds to a pixel of a display device. The non-display region FR is a region that is located around the display region DR and that does not contribute to display.

The display region DR includes a plurality of gate bus lines GL(1) to GL(j) (j is an integer of two or more; they will hereinafter be referred to collectively as the "gate bus line GL") extending in the x direction (which may be referred to as the row direction or the second direction), and a plurality of source bus lines SL(1) to SL(k) (k is an integer of two or more; they will hereinafter be referred to collectively as the "source bus line SL") extending in the y direction (which may be referred to as the column direction or the first direction). Each pixel region PIX is defined by a gate bus line GL and a source bus line SL, for example. The gate bus lines GL are connected to the respective terminals of the gate driver GD. The source bus lines SL are connected to the respective terminals of the source driver SD.

Each pixel region PIX includes a thin film transistor (pixel TFT) Pt and a pixel electrode PE. The thin film transistor Pt includes an upper gate electrode and a lower gate electrode (not shown). These gate electrodes are each electrically connected to the corresponding gate bus line GL. The source electrode of the thin film transistor Pt is electrically connected to the corresponding source bus line SL, and the drain electrode is electrically connected to the pixel electrode PE. When an active matrix substrate is applied to a display device of a transverse electric field mode such as the FFS (Fringe Field Switching) mode, an electrode (common electrode) CE that is common for a plurality of pixels is provided on the active matrix substrate. When an active matrix substrate is applied to a display device of a vertical electric field mode, the common electrode CE is provided on the counter substrate, which is arranged so as to oppose the active matrix substrate with the liquid crystal layer interposed therebetween.

A gate driver GD for driving gate bus lines GL, for example, is provided integrally (monolithically) in the non-display region FR. Although not shown in the figures, peripheral circuits such as the source switching (Source Shared driving: SSD) circuit for driving source bus lines SL in a time-division manner may be integrally provided in the non-display region FR.

The specific structure of a pixel region PIX of an active matrix substrate of the present embodiment will now be described.

Figure 2A:
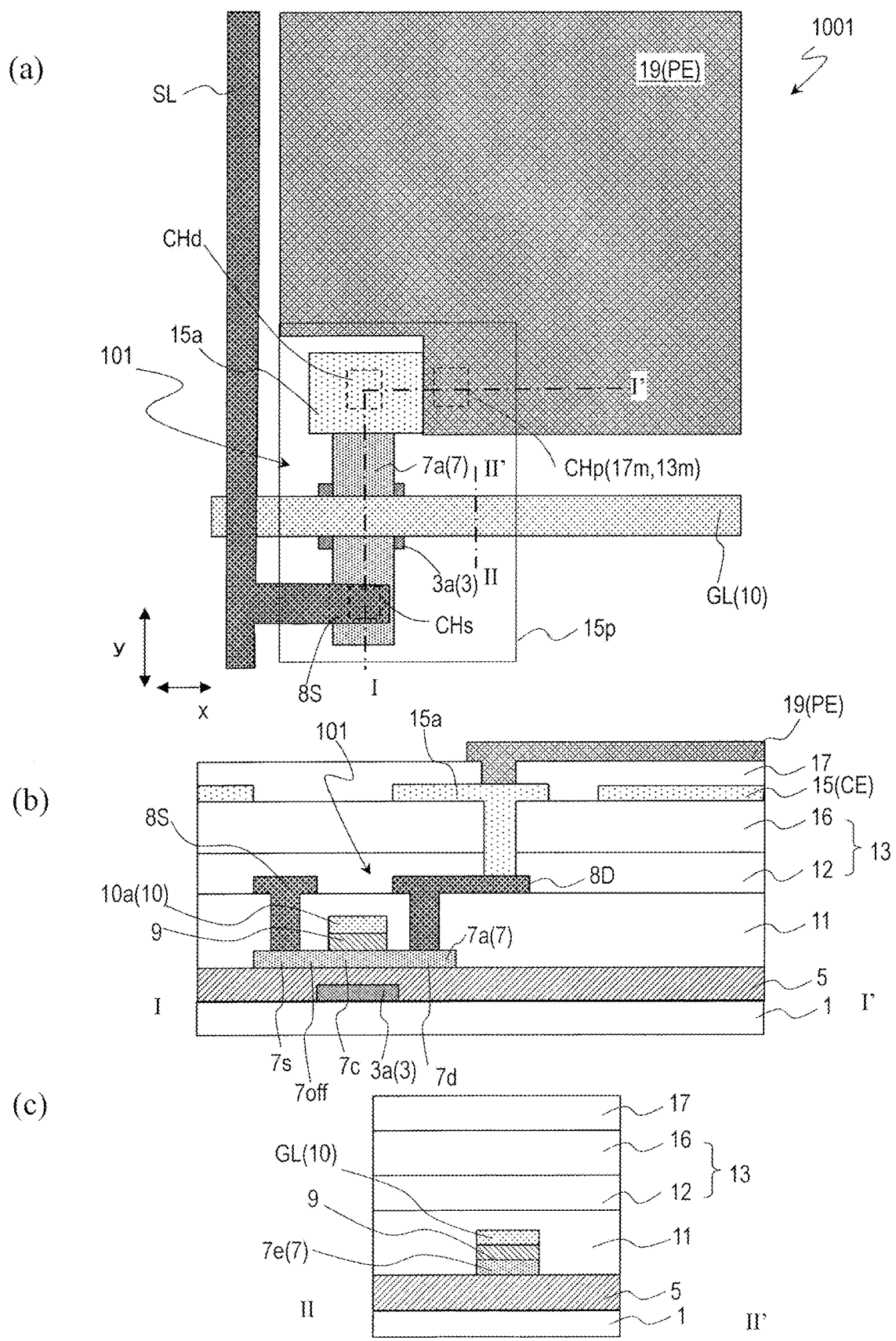
FIG. 2A(a) is a plan view illustrating a pixel region PIX of an active matrix substrate 1001 of the first embodiment, FIG. 2A(b) and FIG. 2A(c) are schematic cross-sectional views taken along line I-I' and line respectively.

FIG. 2A(a) is a plan view illustrating a pixel region PIX of the active matrix substrate 1001 of the present embodiment. FIGS. 2A(b) and 2A(c) are schematic cross-sectional views taken along line I-I' and line II-II', respectively, of FIG. 2A(a). The active matrix substrate 1001 is applied to a liquid crystal display device of an FFS mode, for example. Note that in the description hereinbelow, elements of substantially the same function will be denoted by like reference numerals and may not be further described below.

A pixel region PIX is a region that is surrounded by source bus lines SL extending in the y direction and gate bus lines GL extending in the x direction crossing the source bus lines SL. The pixel region PIX includes a substrate 1, a TFT (pixel TFT) 101 supported on the substrate 1, a lower transparent electrode 15, and an upper transparent electrode 19. Although not shown in the figures, an upper transparent electrode 19 has a slit or a cutout portion for each pixel. In this example, a lower transparent electrode 15 is the common electrode CE, and the upper transparent electrode 19 is the pixel electrode PE.

The TFT 101 is an oxide semiconductor TFT having the double gate structure, for example. The TFT 101 includes an oxide semiconductor layer 7 having an active region 7a, a lower gate electrode 3a arranged on the substrate 1 side of the oxide semiconductor layer 7 with a lower insulating layer interposed therebetween, an upper gate electrode 10a arranged over the oxide semiconductor layer 7 (on the opposite side to the substrate 1) with an upper insulating layer 9 interposed therebetween, a source electrode 8S and a drain electrode 8D. The lower gate electrode 3a and the upper gate electrode 10a are electrically connected to the corresponding gate bus line GL, and the source electrode 8S is electrically connected to the corresponding source bus line SL. The drain electrode 8D is electrically connected to the pixel electrode PE. The lower gate electrode 3a is arranged so as to overlap with a portion of the active region 7a as seen from the normal direction to the substrate 1. Note that there is no limitation as long as the lower gate electrode 3a overlaps with at least a portion of the active region 7a, and may overlap with the entire active region 7a. The upper gate electrode 10a is arranged so as to overlap with a portion of the active region 7a as seen from the normal direction to the substrate 1.

The structure of each pixel region PIX will be described in greater detail.

The pixel region PIX includes a lower gate layer 3 supported on the substrate 1, the lower insulating layer 5 covering the lower gate layer 3, the oxide semiconductor layer 7 arranged on the lower insulating layer 5, and an upper gate layer 10 arranged on the oxide semiconductor layer 7 with the upper insulating layer 9 interposed therebetween. The oxide semiconductor layer 7 includes the active region 7a of the TFT 101. The lower gate layer 3 includes the lower gate electrode 3a of the TFT 101. The upper gate layer 10 includes the upper gate electrode 10a of the TFT 101. The upper insulating layer 9 is arranged on a portion of the oxide semiconductor layer 7 so as not to be in contact with the lower insulating layer 5. The upper insulating layer 9 may be arranged only between the oxide semiconductor layer 7 and the upper gate layer 10.

One of the lower gate electrode 3a and the upper gate electrode 10a may be formed integral with the corresponding one of the gate bus lines GL (e.g., may be a part of the gate bus line GL) by using the same conductive film as the gate bus line GL. That is, one of the lower gate layer 3 and the upper gate layer 10 may include the gate bus line GL formed integral with the lower gate electrode 3a or the upper gate electrode 10a. In this example, the upper gate layer 10 includes the upper gate electrode 10a, and the gate bus line GL formed integral with the upper gate electrode 10a. The lower gate layer 3 is formed in an island shape in the pixel region PIX.

The oxide semiconductor layer 7 includes the active region 7a located in the region where the TFT 101 is formed (TFT formation region) and an extension region 7e that extends from the active region 7a, as seen from the normal direction to the substrate 1. The extension region 7e is arranged on the substrate 1 side of the upper gate layer 10 with the upper insulating layer 9 interposed therebetween. The extension region 7e may extend in a direction different from the channel length direction of the TFT 101 from the active region 7a. The active region 7a and the extension region 7e are formed integral with each other.

In this example, the extension region 7e is arranged on the substrate 1 side of the gate bus line GL of the upper gate layer 10 with the upper insulating layer 9 interposed therebetween, and includes a portion that extends from the active region 7a so as to overlap with the gate bus line GL (herein, extends in the x direction), as seen from the normal direction to the substrate 1. If an oxide semiconductor is present as the extension region 7e under the gate bus line GL, it is possible to reduce the step of the gate bus line GL. Depending on the channel length L/the channel width W, the ON current may be allowed to flow (detour) through the extension region 7e, thereby increasing the effective channel width.

The extension region 7e of the oxide semiconductor layer 7 may extend so as to connect between active regions 7a of two pixel regions PIX that are adjacent to each other in the x direction so as to overlap with the gate bus line GL as seen from the normal direction to the substrate 1. For example, the oxide semiconductor layer 7 may have such a pattern that active regions 7a of a plurality of pixel regions PIX that are arranged in the x direction are connected together via the extension region 7e. The outer edge of the extension region 7e may be aligned with the outer edge of the gate bus line GL or may be located inside the outer edge of the gate bus line GL. Note that even if the extension region 7e of the oxide semiconductor layer 7 is located under the gate bus line GL with the upper insulating layer 9 interposed therebetween, this does not hinder the operation of the active matrix substrate because the extension region 7e and the gate bus line GL are insulated from each other by the upper insulating layer 9.

As will be described later, the oxide semiconductor layer 7 can be formed for example by patterning the oxide semiconductor film after patterning the upper gate electrode 10a and the upper insulating layer 9. Then, when patterning the upper insulating layer 9, the oxide semiconductor film can be made to function as an etch stop, thereby suppressing the over-etching of the lower insulating layer 5. In this case, generally the entirety of the lower surface of the upper insulating layer 9 may be in contact with the oxide semiconductor layer 7. Note that depending on the patterning conditions of the oxide semiconductor layer 7, a portion (outer edge portion) of the lower surface of the upper insulating layer 9 may not be in contact with the oxide semiconductor layer 7.

The source electrode 8S and the drain electrode 8D are electrically connected to the active region 7a of the oxide semiconductor layer 7. The source electrode 8S and the drain electrode 8D may be formed by using the same conductive film as the source bus line SL (FIG. 1). In the present specification, a layer that is formed by using the same conductive film as the source bus line SL is referred to as a "source metal layer". Similarly, a layer that is formed by using the same conductive film as the gate bus line GL is referred to as a "gate metal layer".

The oxide semiconductor layer 7, the upper insulating layer 9 and the upper gate electrode 10a (the upper gate layer 10) may be covered by an inorganic insulating layer (passivation film) 11. In this example, the source electrode 8S is in contact with a portion of the active region 7a on the first inorganic insulating layer 11 and in a source opening CHs formed in the first inorganic insulating layer 11. The drain electrode 8D is in contact with another portion of the active region 7a on the first inorganic insulating layer 11 and in a drain opening CHd formed in the first inorganic insulating layer 11. In the present specification, a portion of the active region 7a that is in contact with the source electrode 8S is referred to as a source contact region 7s, and a portion thereof that is in contact with the drain electrode 8D is referred to as a drain contact region 7d. A region that is located between the source contact region 7s and the drain contact region 7d and overlaps with at least one of the lower gate electrode 3a and the upper gate electrode 10a, as seen from the normal direction to the substrate 1, is a "channel region 7c". The active region 7a may further include an offset region 7 off that is located between the channel region 7c and the source contact region 7s and/or the drain contact region 7d.

The upper insulating layer 9 may be formed only between the oxide semiconductor layer 7 and the upper gate layer 10.

Then, the channel region 7c of the oxide semiconductor layer 7 and the region of the active region 7a other than the channel region (the offset region 7 off, the contact regions 7s and 7d) can be made to be in contact with different insulating films. As an example, when the upper insulating layer 9 is formed by using an oxide film such as a silicon oxide film, the oxidation deficiency that has occurred in the channel region 7c of the oxide semiconductor layer 7 can be reduced by the oxide film, and it is therefore possible to ensure the intended TFT characteristics. When the first inorganic insulating layer 11 is formed by using an insulating film that reduces an oxide semiconductor such as a silicon nitride film, the resistance of a region of the oxide semiconductor layer 7 that is in contact with the first inorganic insulating layer 11 is lowered, and it is therefore possible to suppress the decrease of the ON resistance. Particularly, when the offset region 7 off is in contact with the first inorganic insulating layer 11, it is possible to more effectively suppress the decrease of the ON resistance.

As will be described later, the upper gate layer 10 and the upper insulating layer 9 may be patterned by using the same mask, for example. In such a case, the outer edge of the gate bus line GL or the upper gate electrode 10a (i.e., the outer edge of the upper gate layer 10) and the outer edge of the upper insulating layer 9 may be aligned with each other, as seen from the normal direction to the substrate 1. Generally the entirety of the lower surface of the upper gate layer 10 may be in contact with the upper insulating layer 9.

An interlayer insulating layer 13 is provided on the first inorganic insulating layer 11 and the source electrode 8S and the drain electrode 8D so as to cover the TFT 101. The interlayer insulating layer 13 includes a second inorganic insulating layer 12, and an organic insulating layer 16 arranged on the second inorganic insulating layer 12, for example. Note that the interlayer insulating layer 13 does not need to include the organic insulating layer 16.

The lower transparent electrode 15 is arranged on the interlayer insulating layer 13. The upper transparent electrode 19 is arranged on the lower transparent electrode 15 with a dielectric layer 17 interposed therebetween. One of the lower transparent electrode 15 and the upper transparent electrode 19 (herein, the upper transparent electrode 19) functions as the pixel electrode PE, and the other one (herein, the lower transparent electrode 15) as the common electrode CE. The pixel electrode PE is divided into sections corresponding to pixels. The common electrode CE does not need to be divided into sections corresponding to pixels. The common electrode CE may have an opening 15p over a region where the TFT 101 and a gate contact portion 30 are formed, and may be formed across the entire pixel region PIX other than this region.

The pixel electrode PE is electrically connected to the drain electrode 8D of the TFT 101 in the pixel contact portion. In this example, the pixel electrode PE is electrically connected to the drain electrode 8D via an island-shaped transparent connecting portion 15a that is formed by using the same transparent conductive film as the common electrode CE. The pixel electrode PE is in contact with the transparent connecting portion 15a in an opening 17m formed in the dielectric layer 17. The transparent connecting portion 15a is in contact with the drain electrode 8D in an opening 13m formed in the interlayer insulating layer 13. A contact hole (hereinafter, a "pixel contact hole") CHp including the opening 17m and the opening 13m does not overlap with the drain opening CHd, but the pixel contact hole CHp may partially or entirely overlap with the drain opening CHd, as seen from the normal direction to the substrate 1.

In the example shown in FIG. 2A, the TFT 101 is arranged so that the channel length direction DL of the TFT 101 is the y direction (the direction in which the source bus line SL extends) (vertical TFT arrangement). In the present specification, the channel length direction DL refers to the direction in which the current flows in the channel region 7c in a plane that is parallel to the substrate 1, and the channel width direction DW refers to the direction that is perpendicular to the channel length direction DL. The active region 7a of the semiconductor layer 7 may extend in the y direction so as to cross the gate bus line GL as seen from the normal direction to the substrate 1. Note that the TFT 101 may be arranged so that the channel length direction DL is the x direction (horizontal TFT arrangement).

Although not shown in the figures, a gate contact portion that electrically connects together the lower gate electrode 3a of the TFT 101 and the upper gate electrode 10a (or the gate bus line GL) may be provided in the pixel region PIX.

Note that the lower gate electrode 3a does not need to be in an island shape. For example, the lower gate electrode 3a may be a portion of another gate line extending in the x direction. The other gate line may be electrically connected to the gate bus line GL in the non-display region.

Figure 19:
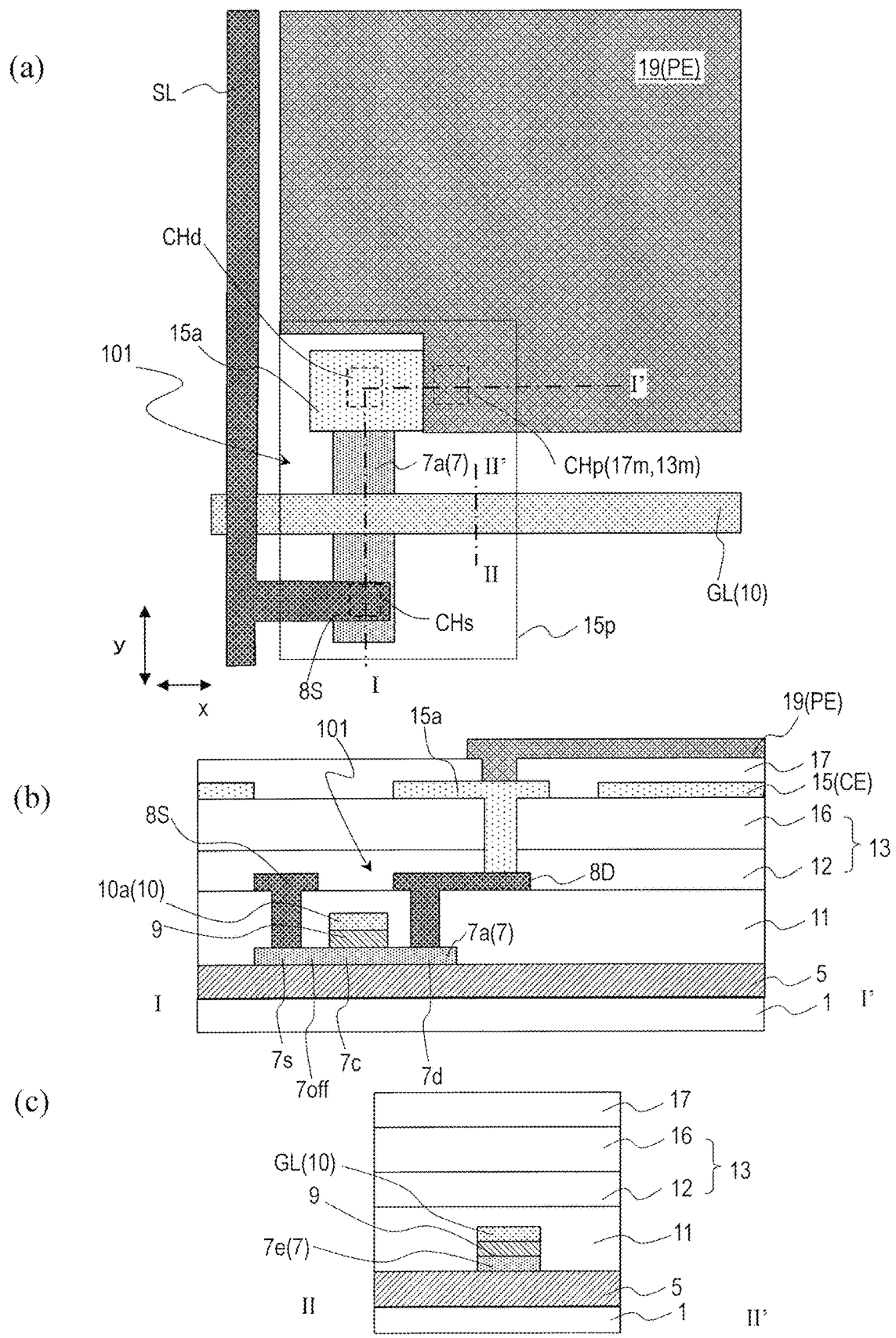
FIG. 19(a) is a plan view illustrating a pixel region PIX of another active matrix substrate of the first embodiment.
FIG. 19(b) and FIG. 19(c) are schematic cross-sectional views taken along line I-I' and line II-II', respectively.

Moreover, although the TFT 101 illustrated in FIG. 2A has the double gate structure, the pixel TFT of the present embodiment may be a top gate structure TFT. As illustrated in FIGS. 19(a) to 19(c), a top gate structure TFT may have a similar configuration to that of the TFT 101 except that the lower gate electrode 3a is absent. Alternatively, with a similar configuration to that of FIG. 2A, the lower gate electrode 3a may function as a light-blocking film, but not as a gate electrode.

Although not shown in the figures, the active matrix substrate 1001 may include a monolithically formed peripheral circuit (e.g., a gate driver). The peripheral circuit includes circuit TFTs. The circuit TFT may be an oxide semiconductor TFT having the double gate structure similar to the TFT 101, for example. Alternatively, as will be described later, the circuit TFT may be a crystalline silicon TFT.

The active matrix substrate 1001 is applicable to a display device of an FFS mode or an IPS mode, for example. The FFS mode is a transverse electric field mode in which a pair of electrodes are provided on one substrate, and an electric field is applied through the liquid crystal molecules in the direction (transverse direction) parallel to the substrate surface. In this example, there is produced an electric field represented by lines of electric force that emerge from the pixel electrode PE, pass through the liquid crystal layer (not shown), and extend to the common electrode CE through the slit-shaped opening of the pixel electrode PE. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

An electrode structure in which the pixel electrode PE is arranged on the common electrode CE with the dielectric layer 17 interposed therebetween is described in International Publication WO2012/086513 pamphlet, for example. Note that the common electrode CE may be arranged on the pixel electrode PE with the dielectric layer 17 interposed therebetween. That is, the lower transparent electrode 15 formed on a lower transparent conductive layer may be the pixel electrode PE, and the upper transparent electrode 19 formed on an upper transparent conductive layer may be the common electrode CE. Such an electrode structure is described for example in Japanese Laid-Open Patent Publication No. 2008-032899 and Japanese Laid-Open Patent Publication No. 2010-008758. Disclosures of International Publication WO2012/086513 pamphlet, Japanese Laid-Open Patent Publication No. 2008-032899 and Japanese Laid-Open Patent Publication No. 2010-008758 are herein incorporated by reference in their entirety.

Note that the active matrix substrate of the present embodiment does not need to have the common electrode CE. Such an active matrix substrate can be used in a display device of a TN (Twisted Nematic) mode, VA (Vertical Alignment), etc. The VA mode and the TN mode are each a vertical electric field mode in which an electric field is applied through the liquid crystal molecules by means of a pair of electrodes arranged with the liquid crystal layer interposed therebetween.

<Method for Manufacturing Active Matrix Substrate 1001>

Next, an example of a method for manufacturing the active matrix substrate 1001 will be described.

FIG. 2B to FIG. 2I are schematic step-by-step diagrams illustrating a method for manufacturing the active matrix substrate 1001. In each figure, (a) is a plan view illustrating a pixel region PIX. In each figure, (b) and (c) are schematic cross-sectional views taken along line I-I' and line II-II', respectively, of FIG. 2A(a).

Figure 2B:
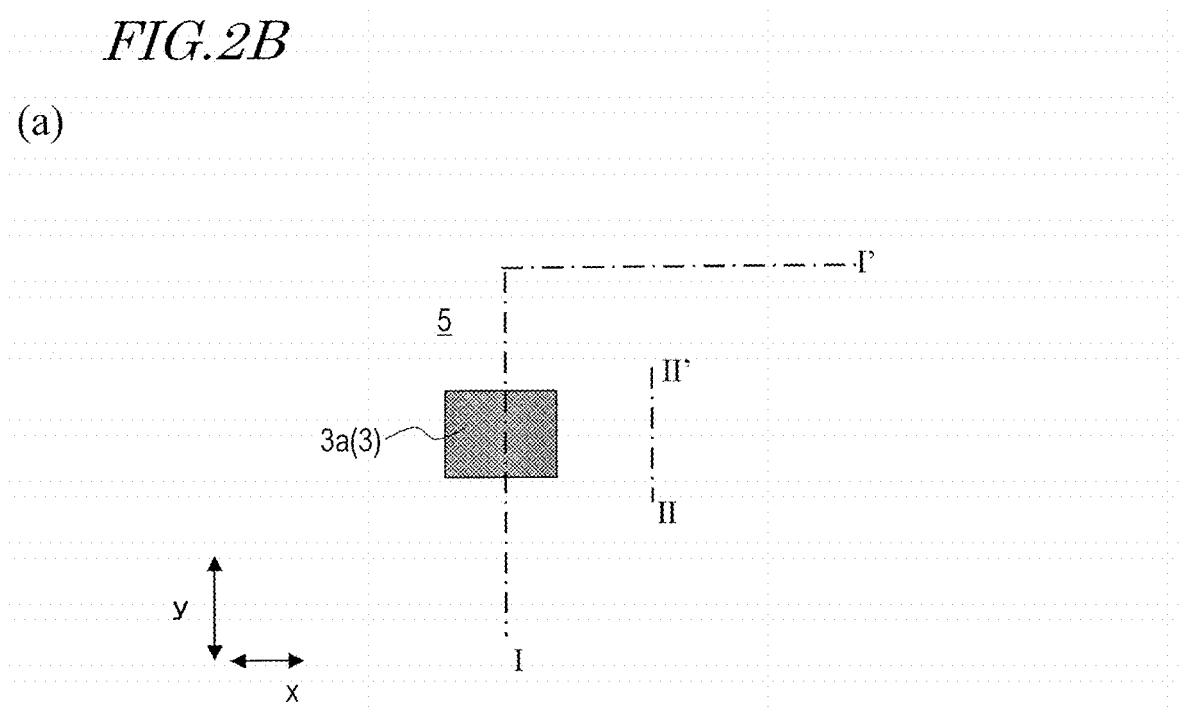
FIGS. 2B(a) to 2B(c) are a plan view and cross-sectional views illustrating a step of a method for manufacturing the active matrix substrate 1001.
Figure 2B:
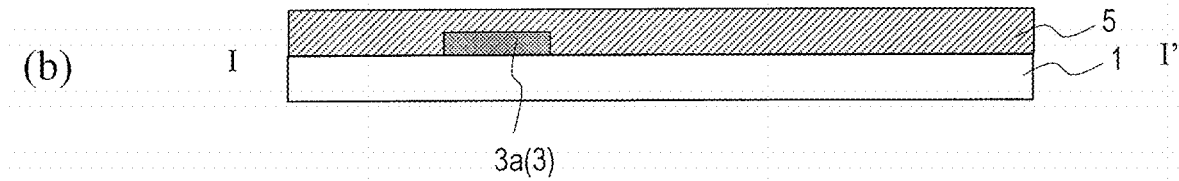
Figure 2B:

First, as shown in FIGS. 2B(a) to 2B(c), an island-shaped lower gate layer 3 is formed on the substrate 1 in each pixel region PIX. Herein, a lower gate conductive film (thickness: 50 nm or more and 500 nm or less, for example) (not shown) is formed on an insulative substrate (e.g., a glass substrate) 1 by a sputtering method, or the like. Then, the lower gate conductive film is patterned, thereby obtaining the lower gate layer 3 that includes the lower gate electrode 3a.

The substrate 1 may be, for example, a glass substrate, a silicon substrate, a heat-resistant plastic substrate (resin substrate), or the like.

The gate conductive film may be, for example, a metal film including an element selected from among aluminum (Al), chromium (Cr), copper (Cu), tantalum (Ta), titanium (Ti), molybdenum (Mo) and tungsten (W), or an alloy film including one or more of these elements as its components. It may be a layered film including a plurality of films of some of these elements. For example, it may be a layered film having a three-layer structure of titanium film-aluminum film-titanium film, or a three-layer structure of molybdenum film-aluminum film-molybdenum film. Note that the gate conductive film is not limited to a three-layer structure, but may have a single-layer or two-layer structure or may have a layered structure of four or more layers. Herein, the lower gate conductive film is a layered film whose lower layer is a Ti film (thickness: 15 to 70 nm) and whose upper layer is a Cu film (thickness: 200 to 400 nm).

Next, lower insulating layer (thickness: 200 nm or more and 500 nm or less, for example) 5 that covers the lower gate layer 3 is formed.

The lower insulating layer 5 may suitably be a silicon oxide ($SiO_2$) layer, a silicon nitride (SiNx) layer, a silicon oxide nitride layer (SiOxNy; x>y) layer, a silicon nitride oxide (SiNxOy; x>y) layer, an aluminum oxide layer, a tantalum oxide layer, or the like. The lower insulating layer 5 may have a layered structure. Herein, by using a CVD method, for example, the lower insulating layer 5 is formed, wherein the lower insulating layer 5 has a structure that forms a layered film whose lower layer is a silicon nitride (SiNx) layer (thickness: 100 to 500 nm) and whose upper layer is a silicon oxide (SiO$_2$) layer (thickness: 20 to 100 nm).

Figure 2C:
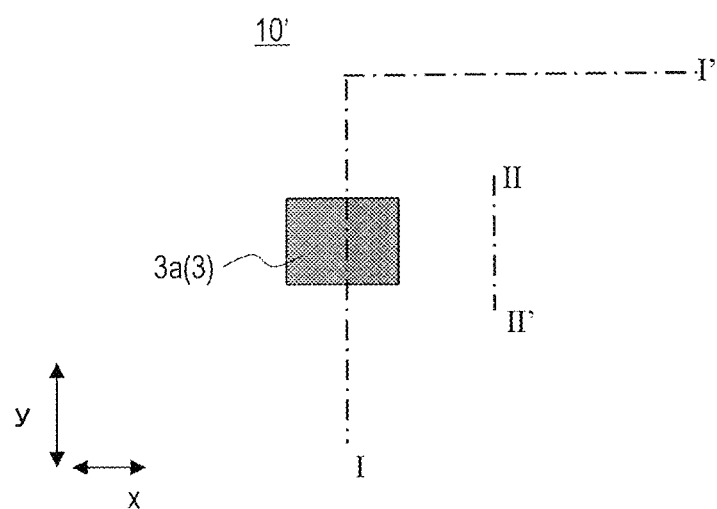
FIGS. 2C(a) to 2C(c) are a plan view and cross-sectional views illustrating a step of the method for manufacturing the active matrix substrate 1001.
Figure 2C:
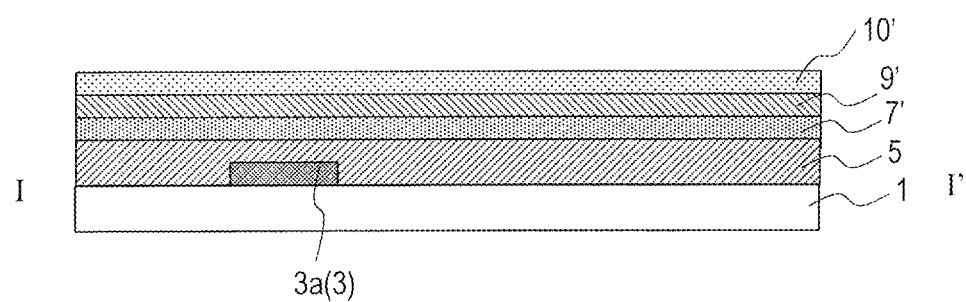
Figure 2C:
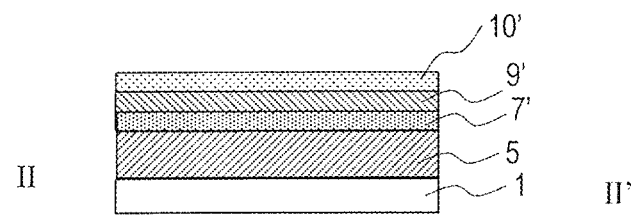

Next, as shown in FIGS. 2C(a) to 2C(c), an oxide semiconductor film (thickness: 15 nm or more and 200 nm or less, for example) 7', an upper insulating film (thickness: 80 nm or more and 250 nm or less, for example) 9' and an upper gate conductive film (thickness: 50 nm or more and 500 nm or less, for example) 10' are formed in this order on the lower insulating layer 5. The oxide semiconductor film 7' and the upper gate conductive film 10' can be formed by using a sputtering method, for example, and the upper insulating film 9' can be formed by a CVD method. Although there is no particular limitation, the oxide semiconductor film 7' may be an In—Ga—Zn—O-based semiconductor film, for example. An insulating film similar to the lower insulating layer 5 (the insulating film illustrated above as the lower insulating layer 5) may be used as the upper insulating film 9'. A conductive film similar to the lower gate conductive film may be used as the upper gate conductive film 10'. Herein, a silicon oxide (SiO$_2$) film is used as the upper insulating film 9', for example. A layered film whose lower layer is a Ti film (thickness: 15 to 70 nm) and whose upper layer is a Cu film (thickness: 200 to 400 nm) is used as the upper gate conductive film 10'.

Herein, after depositing the oxide semiconductor film 7', the upper insulating film 9' and the upper gate conductive film 10' are formed thereon, without patterning the oxide semiconductor film 7'. Then, it is possible to suppress the over-etching of the lower insulating layer 5 in the step of patterning the upper insulating film 9' to be described later.

Figure 2D:
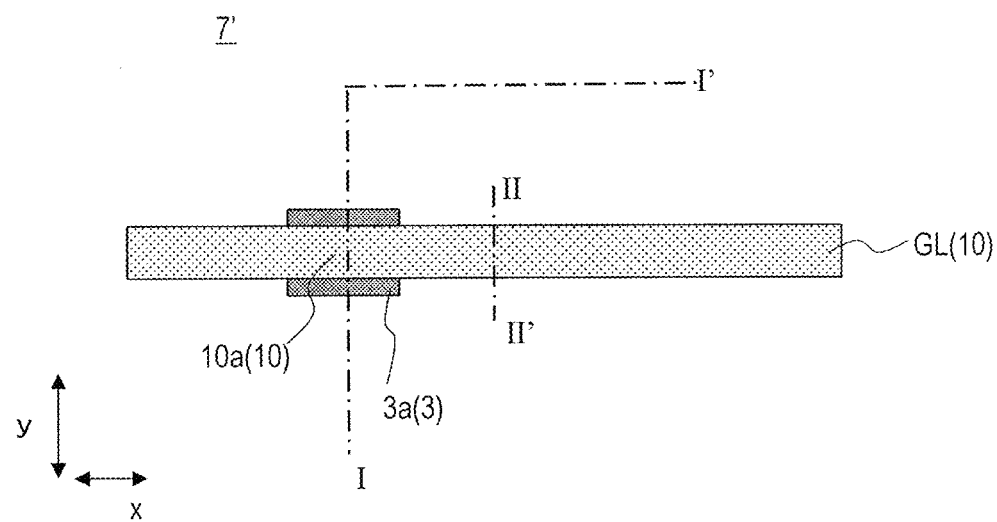
FIGS. 2D(a) to 2D(c) are a plan view and cross-sectional views illustrating a step of the method for manufacturing the active matrix substrate 1001.
Figure 2D:
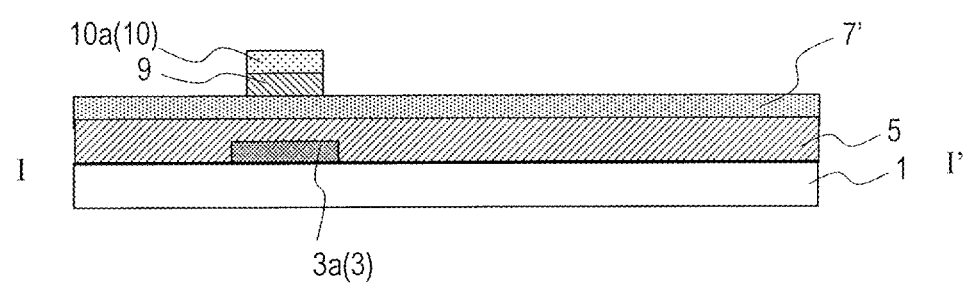
Figure 2D:
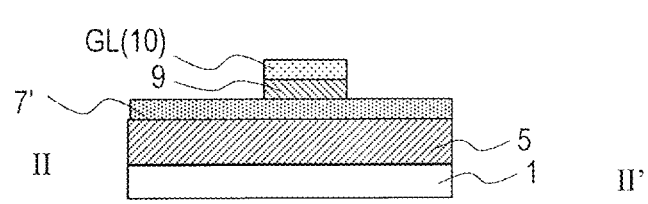

Then, as shown in FIGS. 2D(a) to 2D(c), the upper gate conductive film 10' is patterned by using the first resist mask (not shown), thereby forming the upper gate layer 10 including the upper gate electrode 10a and the gate bus line GL. The patterning of the upper gate conductive film 10' can be performed by wet etching or dry etching.

Then, the upper insulating film 9' is patterned by using the first resist mask described above. The patterning of the upper insulating film 9' can be performed by dry etching, for example. Since the lower insulating layer 5 is covered by the oxide semiconductor film 7', the oxide semiconductor film 7' serves as an etch stop, thereby suppressing the etching of the surface of the lower insulating layer 5. Then, the first resist mask is removed.

In this step, since the upper insulating layer 9 and the upper gate electrode 10a are formed by using the same mask, the side surface of the upper insulating layer 9 and the side surface of the upper gate electrode 10a or the gate bus line GL are aligned with each other in the thickness direction. That is, the outer edge of the upper insulating layer 9 is aligned with the outer edge of the upper gate layer 10 as seen from the normal direction to the substrate 1.

Figure 2E:
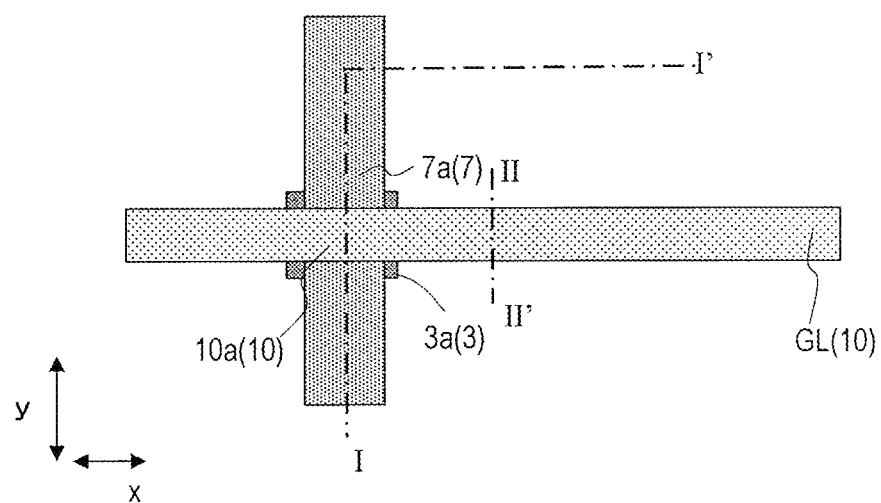
FIGS. 2E(a) to 2E(c) are a plan view and cross-sectional views illustrating a step of the method for manufacturing the active matrix substrate 1001.
Figure 2E:
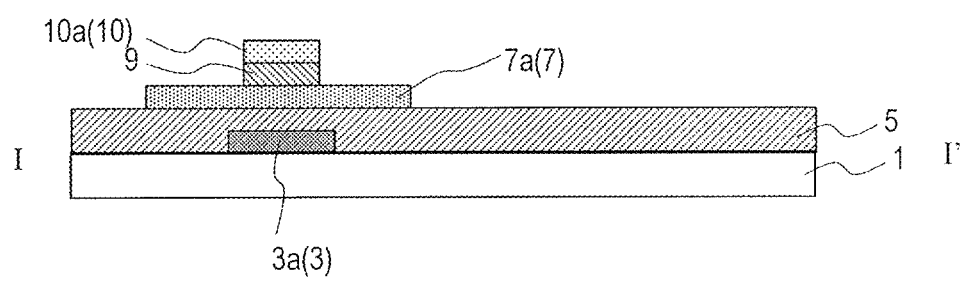
Figure 2E:
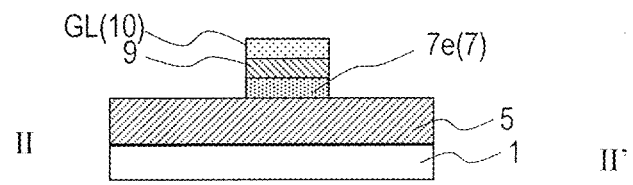

Then, as shown in FIGS. 2E(a) to 2E(c), the oxide semiconductor film 7' is patterned by using a second resist mask (not shown) that defines the active region, thereby obtaining the oxide semiconductor layer 7. The patterning of the oxide semiconductor film 7' is performed by wet etching by using the second resist mask and the upper gate layer 10 as an etching mask, for example. Then, the second resist mask is removed. Thus, the oxide semiconductor layer 7 is obtained, wherein the oxide semiconductor layer 7 includes the active region 7a and the extension region 7e, which extends in the x direction under the gate bus line GL. In this example, the oxide semiconductor layer 7 has one connected pattern for each pixel row (for each row of pixel regions PIX arranged in the x direction). That is, the oxide semiconductor layers 7 of pixel regions PIX that are adjacent to each other in the x direction are formed integral (connected) together, whereas the oxide semiconductor layers of pixel regions PIX adjacent to each other in the y direction are separated from each other (not connected).

As a result, in the region where the upper gate layer 10 is located, a laminate including the upper gate layer 10, the upper insulating layer 9 and the oxide semiconductor layer 7 is formed. Generally the entirety of the lower surface of the upper gate electrode 10a and the gate bus line GL may be in contact with the upper insulating layer 9, and generally the entirety of the lower surface of the upper insulating layer 9 may be in contact with the oxide semiconductor layer 7.

Figure 2F:
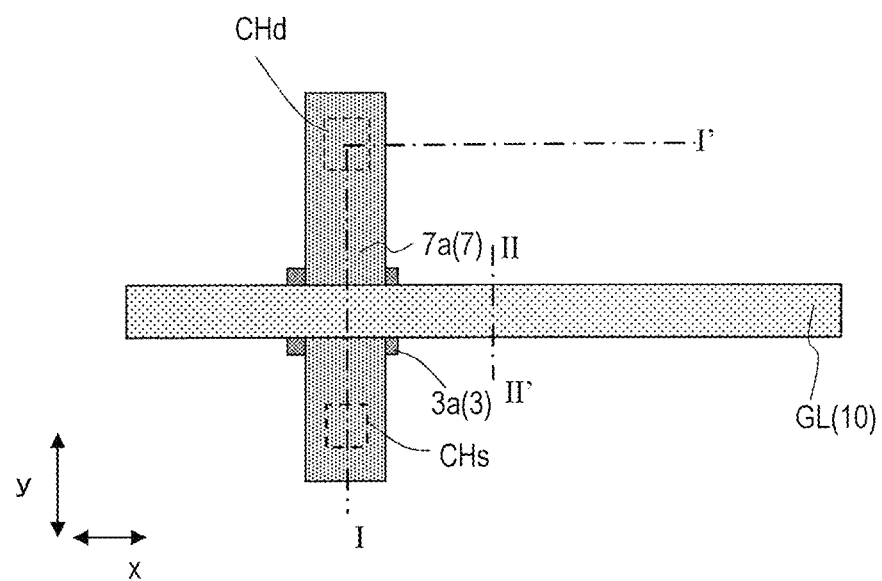
FIGS. 2F(a) to 2F(c) are a plan view and cross-sectional views illustrating a step of the method for manufacturing the active matrix substrate 1001.
Figure 2F:
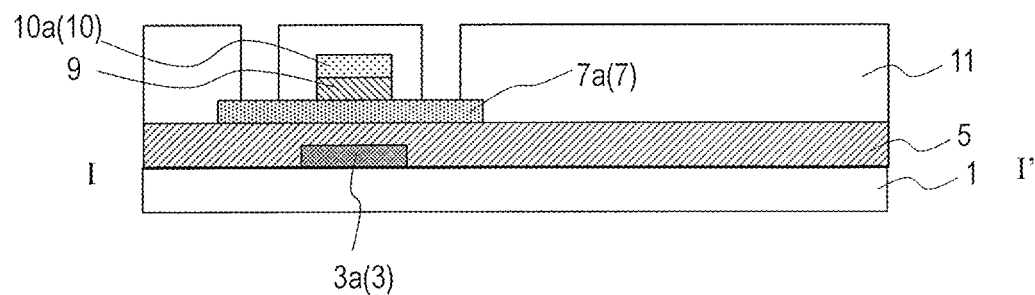
Figure 2F:
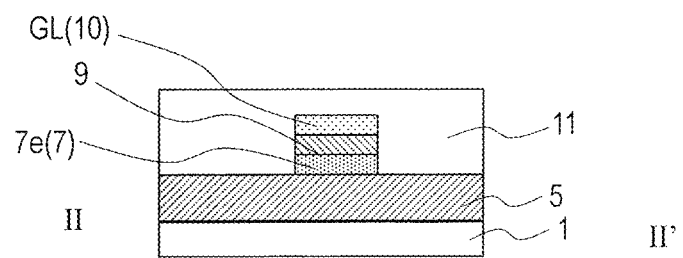

Then, as shown in FIGS. 2F(a) to 2F(c), a first inorganic insulating layer (thickness: 100 nm or more and 500 nm or less) 11 is formed so as to cover the oxide semiconductor layer 7, the upper insulating layer 9 and the upper gate layer 10. Then, openings CHs and CHd that reach the oxide semiconductor layer 7 are formed in the first inorganic insulating layer 11 by dry etching, for example.

The first inorganic insulating layer 11 may be a single layer or a layered structure of a silicon oxide film, a silicon nitride film, a silicon oxide nitride film or a silicon nitride oxide film. Herein, as the first inorganic insulating layer 11, an SiNx layer (thickness: 300 nm) is formed by a CVD method, for example.

Figure 2G:
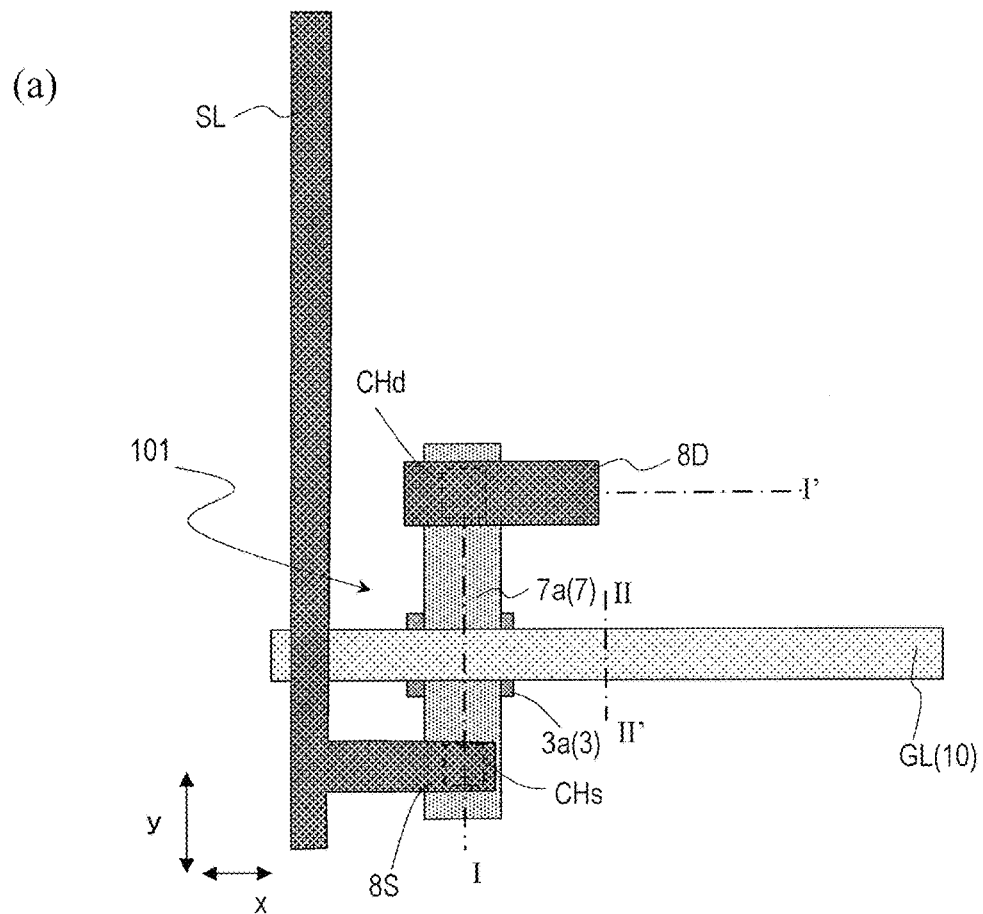
FIGS. 2G(a) to 2G(c) are a plan view and cross-sectional views illustrating a step of the method for manufacturing the active matrix substrate 1001.
Figure 2G:
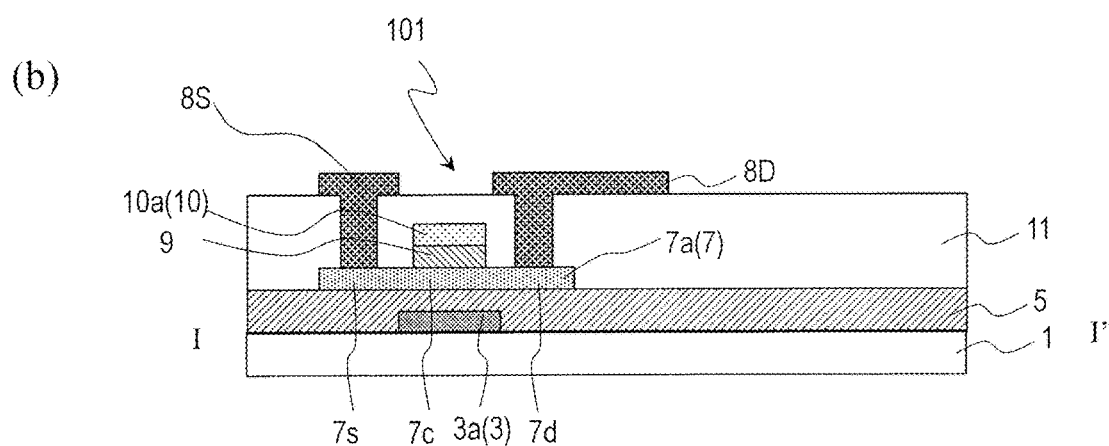
Figure 2G:
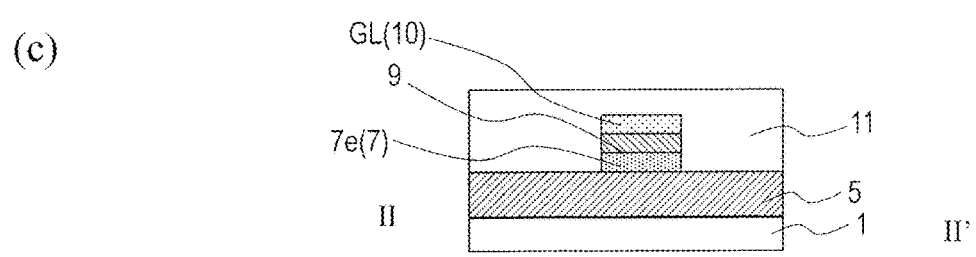

Next, as shown in FIGS. 2G(a) to 2G(c), a source metal layer is formed, wherein the source metal layer includes the source bus line SL, the source electrode 8S and the drain electrode 8D. Herein, a source conductive film (thickness: 50 nm or more and 500 nm or less, for example) is formed on the first inorganic insulating layer 11 and in the openings CHs and CHd, and the source conductive film is patterned. The patterning can be performed by dry etching or wet etching. The source electrode 8S is in contact with the active region 7a of the oxide semiconductor layer 7 in the source opening CHs, and the drain electrode 8D is in contact with the active region 7a in the drain opening CHd. Thus, the TFT 101 is obtained.

The source conductive film may be, for example, a metal film including an element selected from among aluminum (Al), chromium (Cr), copper (Cu), tantalum (Ta), titanium (Ti), molybdenum (Mo) and tungsten (W), or an alloy including one or more of these elements as its components. For example, it may have a three-layer structure of titanium film-aluminum film-titanium film, a three-layer structure of molybdenum film-aluminum film-molybdenum film, or the like. Note that the source conductive film is not limited to a three-layer structure, but may have a single layer, a two-layer structure or a layered structure of four layers or more. Herein, a layered film is used whose lower layer is a Ti film (thickness: 15 to 70 nm) and whose upper layer is a Cu film (thickness: 200 to 400 nm).

Figure 2H:
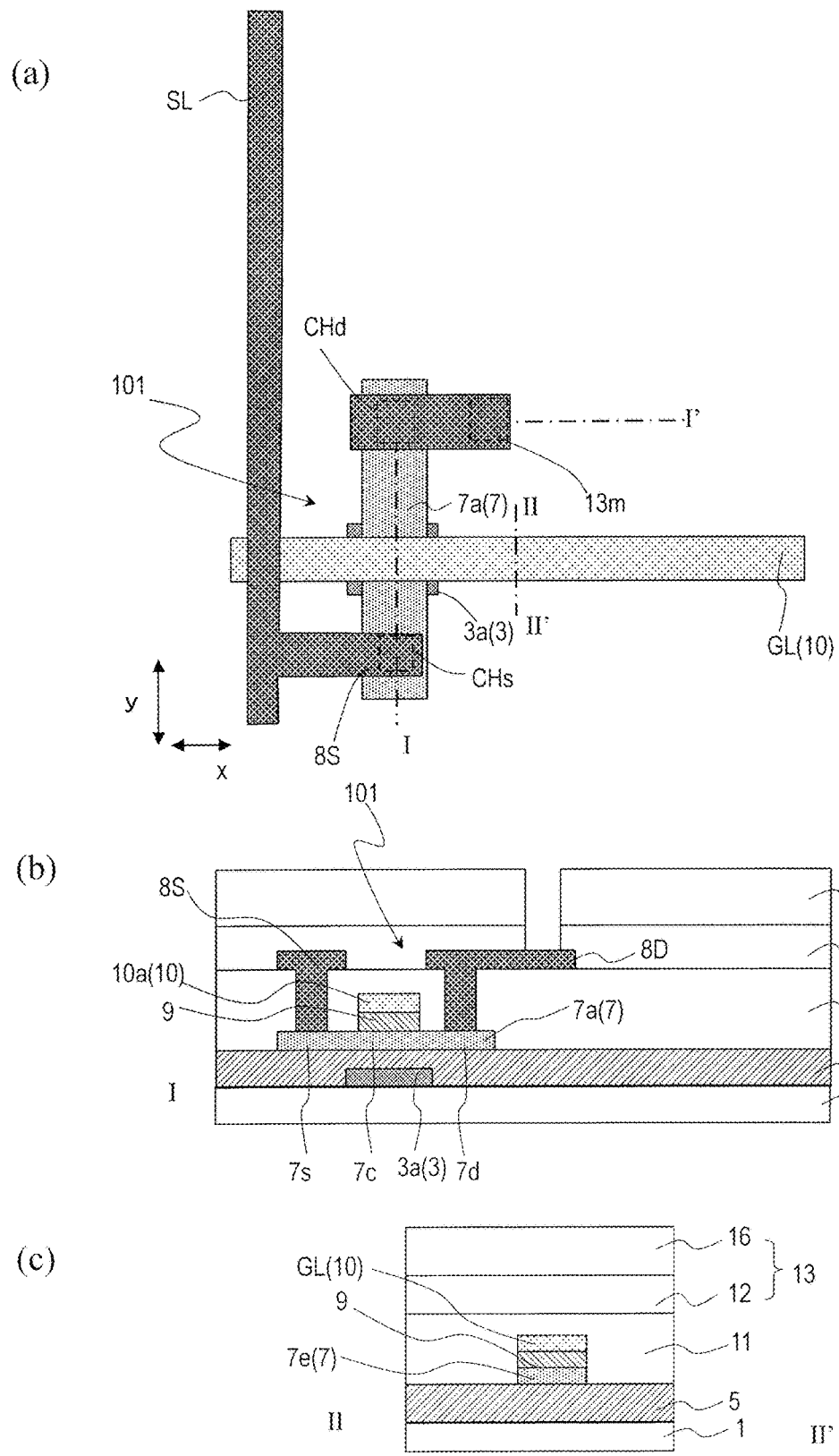
FIGS. 2H(a) to 2H(c) are a plan view and cross-sectional views illustrating a step of the method for manufacturing the active matrix substrate 1001.

Then, as shown in FIGS. 2H(a) to 2H(c), the second inorganic insulating layer (thickness: 100 nm or more and 400 nm or less, for example) 12 and the organic insulating layer (thickness: 1 to 3 μm, preferably 2 to 3 μm, for example) 16 are formed so as to cover the TFT 101. The material of the second inorganic insulating layer 12 may be the same as the material that is illustrated above as the material of the first inorganic insulating layer 11. Herein, an SiNx layer (thickness: 200 nm, for example) is formed by a CVD method as the second inorganic insulating layer 12.

The organic insulating layer 16 may be an organic insulating film including a photosensitive resin material, for example.

Then, the organic insulating layer 16 is patterned to form the opening. Then, the second inorganic insulating layer 12 is etched by using the organic insulating layer 16 as a mask (dry etching). Thus, the opening 13m, which reaches the drain electrode 8D, is formed in the second inorganic insulating layer 12 and the organic insulating layer 16.

Figure 2I:
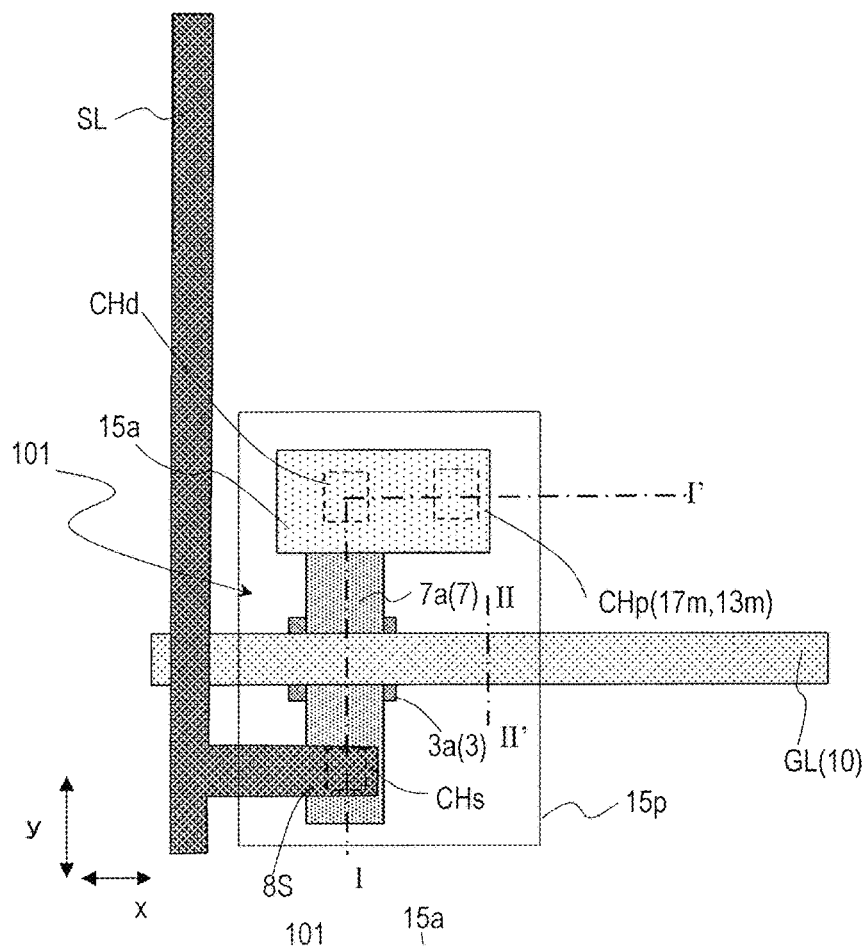
FIGS. 2I(a) to 2I(c) are a plan view and cross-sectional views illustrating a step of the method for manufacturing the active matrix substrate 1001.
Figure 2I:
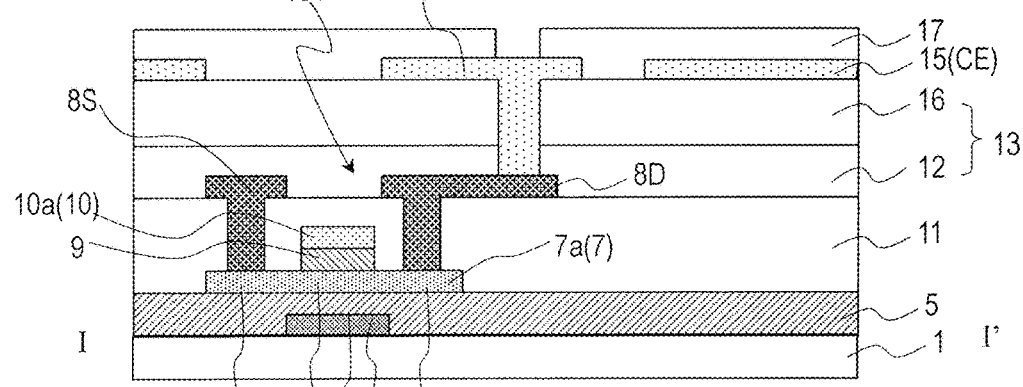
Figure 2I:
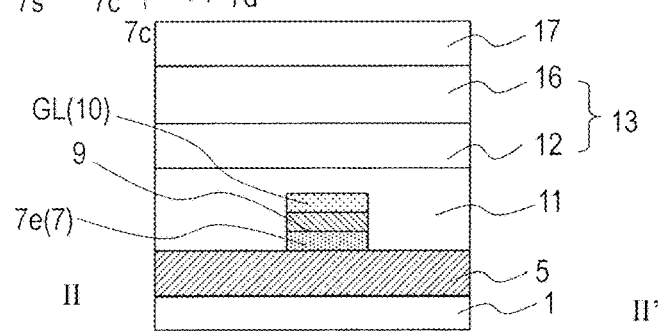

Then, as shown in FIGS. 2I(a) to 2I(c), a lower transparent conductive layer is formed, wherein the lower transparent conductive layer includes the lower transparent electrode 15 and the transparent connecting portion 15a.

First, a first transparent conductive film (thickness: 20 to 300 nm) is formed on the interlayer insulating layer 13 and in the opening 13m. Herein, an indium-zinc oxide film is formed as the first transparent conductive film by a sputtering method, for example. The material of the first transparent electrode film may be a metal oxide such as indium-tin oxide (ITO), indium-zinc oxide and ZnO. Then, the first transparent conductive film is patterned by wet etching, for example. Thus, the lower transparent electrode 15 and the transparent connecting portion 15a are obtained.

The transparent connecting portion 15a is arranged so as to be in contact with the drain electrode 8D in the opening 13m. The lower transparent electrode 15 is formed to extend over a plurality of pixel regions PIX, and functions as the common electrode CE. In this example, the lower transparent electrode 15 includes the opening 15p over the TFT formation region and the pixel contact portion. The transparent connecting portion 15a is arranged inside the opening 15p while being spaced apart from the lower transparent electrode 15, as seen from the normal direction to the substrate 1.

Next, a dielectric layer (thickness: 50 to 500 nm) 17 is formed on the interlayer insulating layer 13 and the lower transparent electrode 15. Then, the opening 17m is formed in the dielectric layer 17 that exposes a portion of the transparent connecting portion 15a. The opening 17m may be arranged so that at least a portion thereof overlaps with the opening 13m of the interlayer insulating layer 13.

The material of the dielectric layer 17 may be the same as the material that is illustrated above as the material of the first inorganic insulating layer 11. Herein, as the dielectric layer 17, an SiN film is formed by a CVD method, for example.

Next, second transparent conductive film (thickness: 20 to 300 nm) is formed on the dielectric layer 17 and in the opening 17m. Then, the second transparent conductive film is patterned so as to form an upper transparent conductive layer including the upper transparent electrode 19 that functions as the pixel electrode PE on the dielectric layer 17. The upper transparent electrode 19 is provided with at least one opening (or a cutout portion) for each pixel.

The material of the second transparent conductive film may be the same as the material that is illustrated above as the material of the first transparent conductive film. The second transparent conductive film may be a single layer or a layered film. Herein, an indium-zinc oxide film is formed by a sputtering method, for example. A portion of the upper transparent electrode 19 may be arranged so as to overlap with the lower transparent electrode 15 with the dielectric layer 17 interposed therebetween, thereby forming an auxiliary capacitor. Thus, the active matrix substrate 1001 shown in FIG. 2A is manufactured.

<Regarding Advantageous Effect of Present Embodiment>

In the present embodiment, the oxide semiconductor layer is patterned after the upper insulating layer 9 is patterned. The advantageous effect of this method will now be described in detail.

While studying the configuration of an active matrix substrate using double gate structure TFTs or top gate structure TFTs, the present inventors found that the following problems arise when the upper insulating layer is formed after the oxide semiconductor layer is patterned.

FIG. 21A to FIG. 21G are schematic step-by-step diagrams illustrating a method for manufacturing an active matrix substrate of a reference example. In each figure, (a) is a plan view illustrating a pixel region PIX. In each figure, (b) and (c) are schematic cross-sectional views taken along line I-I' and line II-II', respectively. In these figures, like elements to those of FIG. 2A to FIG. 2I are denoted by like reference signs.

Figure 21A:
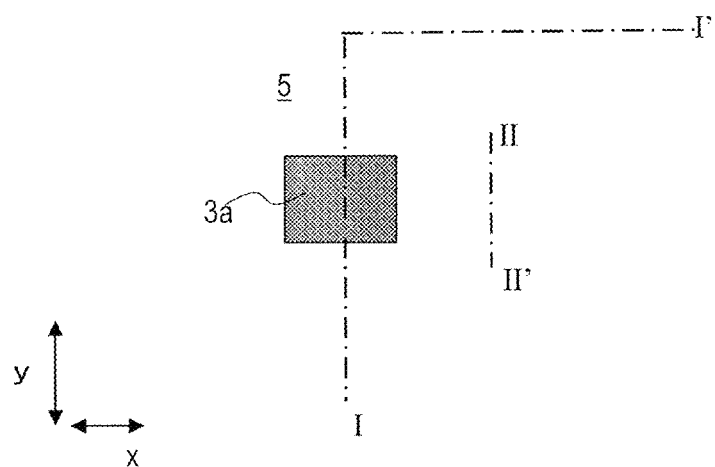
FIGS. 21A(a) to 21A(c) are a plan view and cross-sectional views illustrating a step of a method for manufacturing an active matrix substrate of a reference example.
Figure 21A:
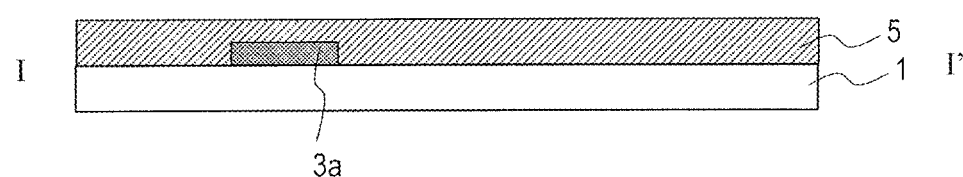
Figure 21A:
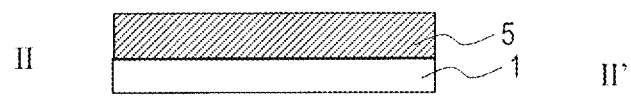

First, as shown in FIGS. 21A(a) to 21A(c), in each pixel region PIX, an island-shaped lower gate electrode 3a and the lower insulating layer 5 that covers the lower gate electrode 3a are formed on the substrate 1.

Figure 21B:
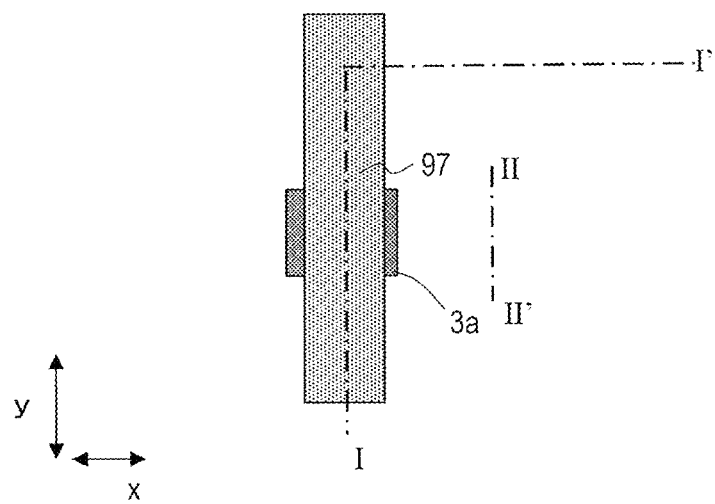
FIGS. 21B(a) to 21B(c) are a plan view and cross-sectional views illustrating a step of the method for manufacturing the active matrix substrate of the reference example.
Figure 21B:
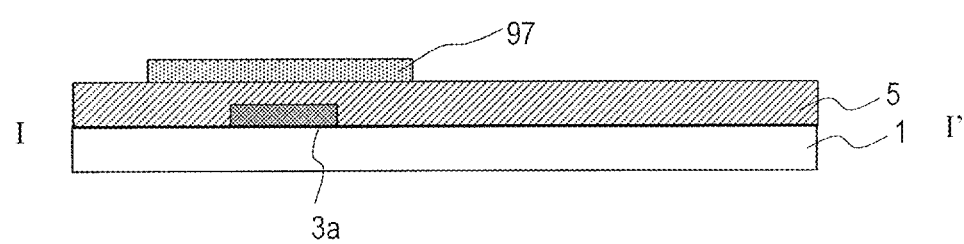
Figure 21B:
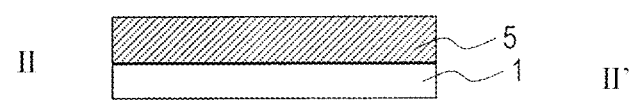

Next, as shown in FIGS. 21B(a) to 21B(c), an oxide semiconductor film is formed on the lower insulating layer 5, and then the oxide semiconductor film is patterned. Thus, an island-shaped oxide semiconductor layer 97 is obtained.

Figure 21C:
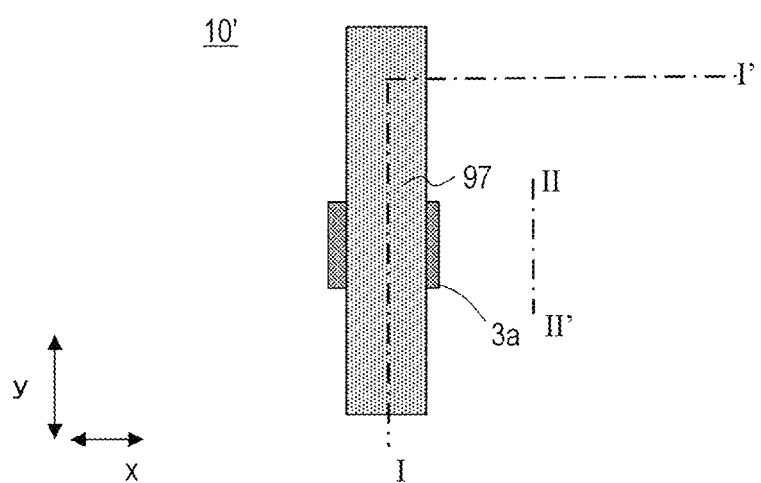
FIGS. 21C(a) to 21C(c) are a plan view and cross-sectional views illustrating a step of the method for manufacturing the active matrix substrate of the reference example.
Figure 21C:
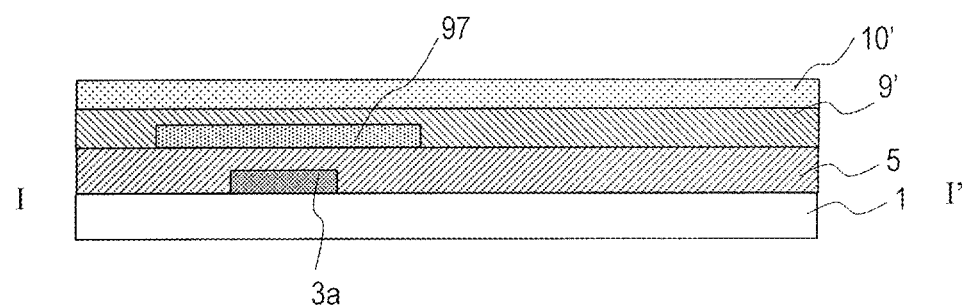
Figure 21C:
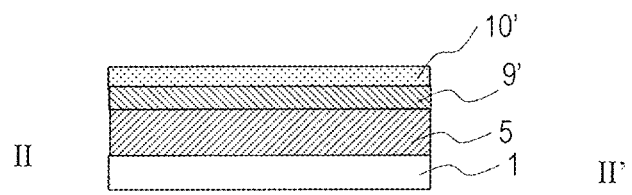

Then, as shown in FIGS. 21C(a) to 21C(c), the upper insulating film 9' and the upper gate conductive film 10' are formed so as to cover the oxide semiconductor layer 97.

Figure 21D:
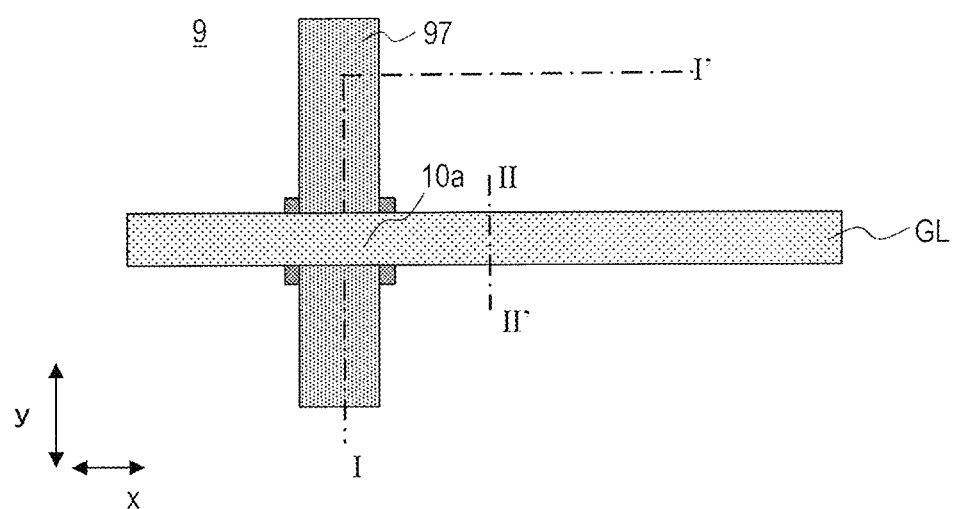
FIGS. 21D(a) to 21D(c) are a plan view and cross-sectional views illustrating a step of the method for manufacturing the active matrix substrate of the reference example.
Figure 21D:
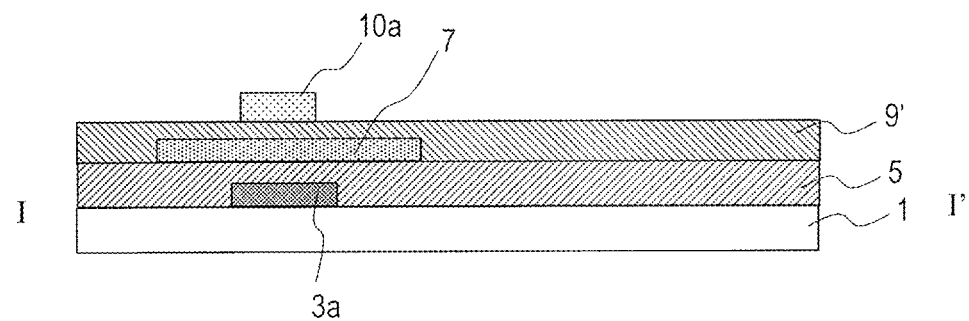
Figure 21D:
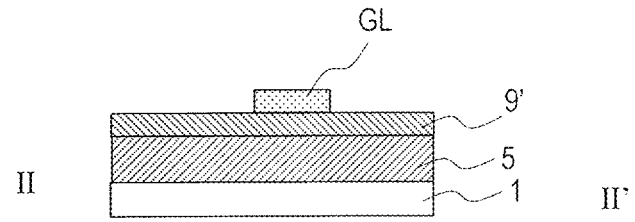

Then, as shown in FIGS. 21D(a) to 21D(c), the upper gate conductive film 10' is patterned by using the first resist mask (not shown), thereby obtaining the upper gate layer 10 including the upper gate electrode 10a and the gate bus line GL.

Figure 21E:
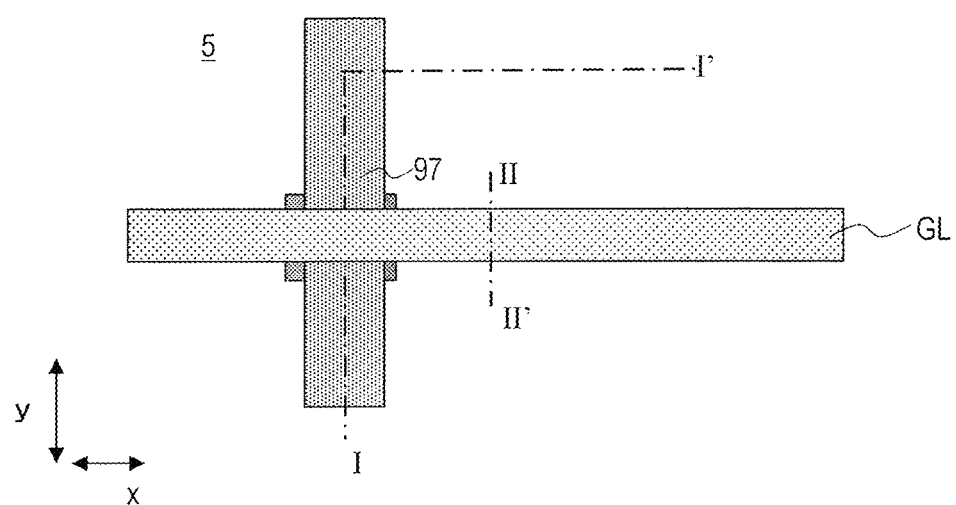
FIGS. 21E(a) to 21E(c) are a plan view and cross-sectional views illustrating a step of the method for manufacturing the active matrix substrate of the reference example.
Figure 21E:
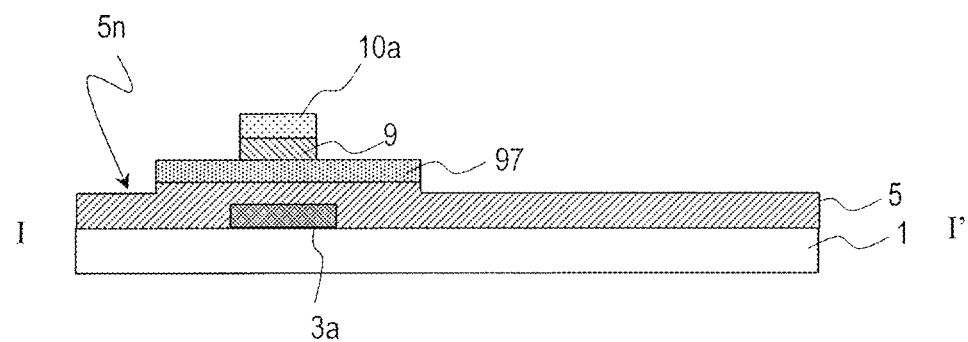
Figure 21E:
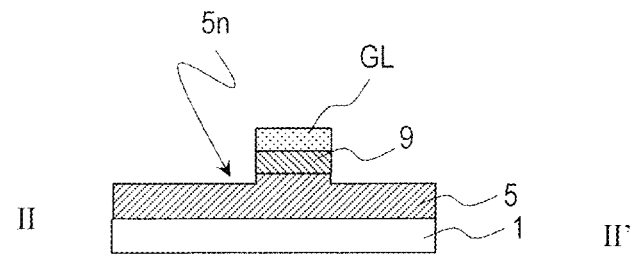

Then, as shown in FIGS. 21E(a) to 21E(c), the upper insulating film 9' is patterned by dry etching by using the first resist mask as it is. In this process, a surface portion of a region 5n of the lower insulating layer 5 that is not covered by the oxide semiconductor layer 97 may possibly be etched (over-etched).

Figure 21F:
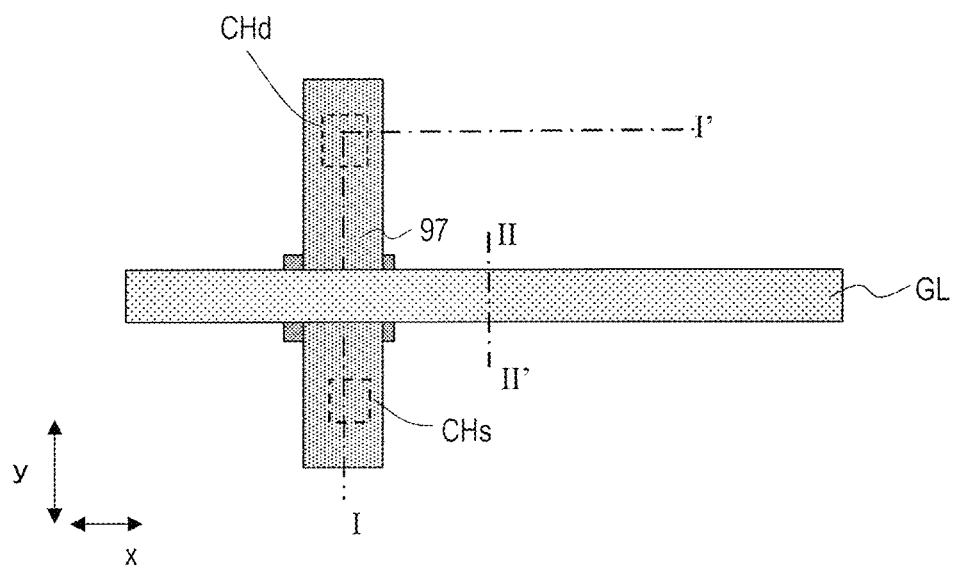
FIGS. 21F(a) to 21F(c) are a plan view and cross-sectional views illustrating a step of the method for manufacturing the active matrix substrate of the reference example.
Figure 21F:
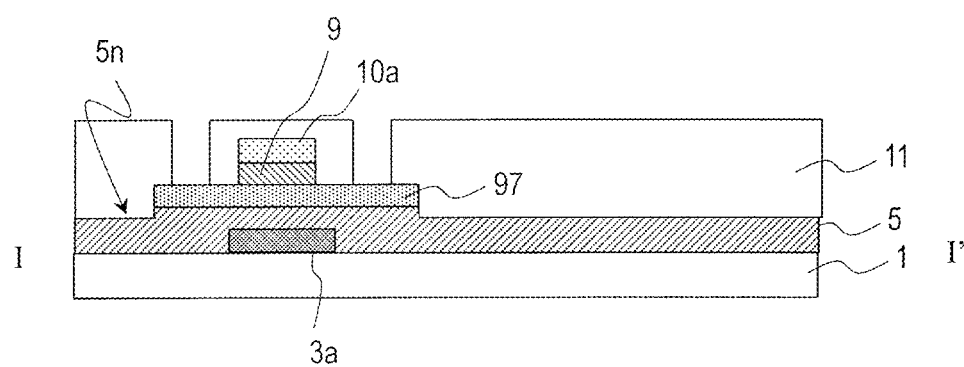
Figure 21F:
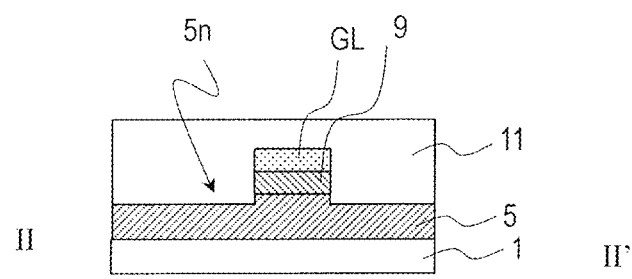

Then, as shown in FIGS. 21F(a) to 21F(c), the first inorganic insulating layer 11 is deposited so as to cover the oxide semiconductor layer 97, the upper insulating layer 9 and the upper gate layer 10, and the source opening CHs and the drain opening CHd are formed in the first inorganic insulating layer 11. In this process, the coverage of the first inorganic insulating layer 11 may possibly decrease over the over-etched region 5n of the lower insulating layer 5.

Figure 21G:
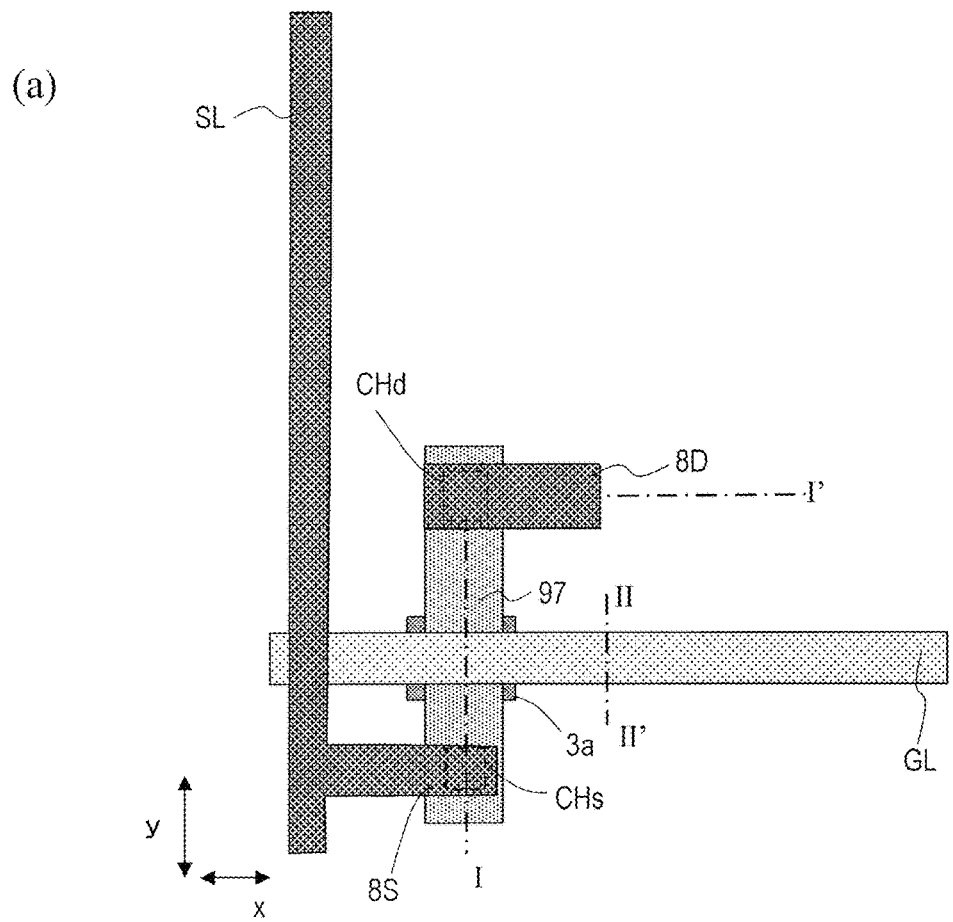
FIGS. 21G(a) to 21G(c) are a plan view and cross-sectional views illustrating a step of the method for manufacturing the active matrix substrate of the reference example.
Figure 21G:
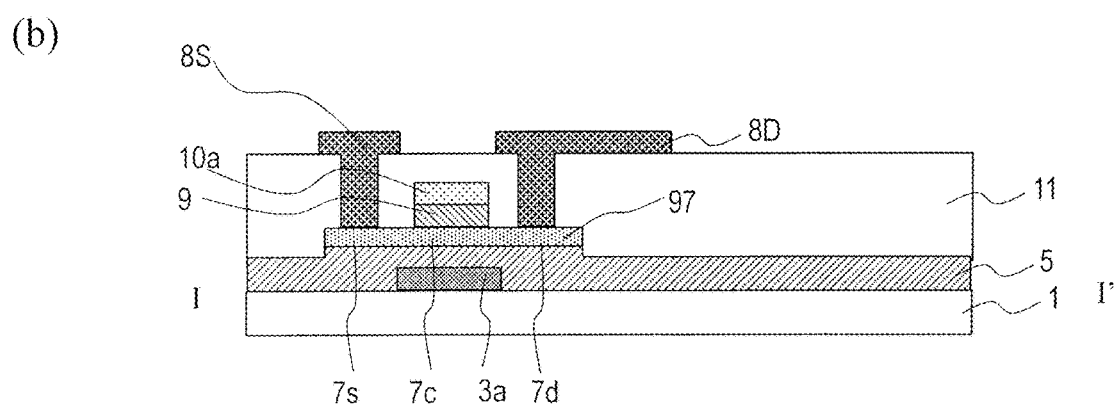
Figure 21G:
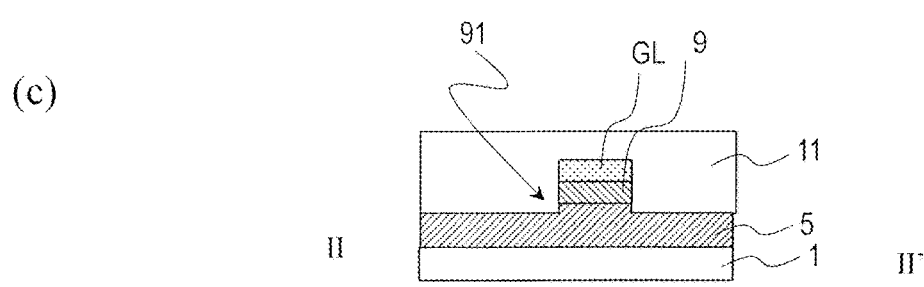

Then, as shown in FIGS. 21G(a) to 21G(c), a source conductive film is formed on the first inorganic insulating layer 11 and in the source opening CHs and the drain opening CHd, and patterned, thereby forming the source metal layer including the source electrode 8S and the drain electrode 8D. Then, although not shown in the figures, the interlayer insulating layer 13, the lower transparent electrode 15, the transparent connecting portion 15a, the dielectric layer 17 and the upper transparent electrode 19 are formed in a similar manner to the steps illustrated in FIG. 2H and FIG. 2I. Thus, the TFT of the reference example is manufactured.

In the TFT of the reference example, the oxide semiconductor layer 97 is formed in an island-shaped pattern in each pixel region PIX. The oxide semiconductor layer 97 is arranged only in the TFT formation region, for example. In the region other than the TFT formation region, the upper insulating layer 9 is present but the oxide semiconductor layer 97 is absent under the gate bus line GL.

With the method for manufacturing the TFT of the reference example, the coverage of the first inorganic insulating layer 11 may lower, thereby lowering the reliability of the TFT, due to the over-etching of the lower insulating layer 5.

In contrast, according to the method for manufacturing the TFT 101 of the present embodiment (FIG. 2B to FIG. 2I), the upper insulating layer 9 is patterned before the oxide semiconductor film 7' is patterned, i.e., while the lower insulating layer 5 is protected by the oxide semiconductor film 7'. Thus, in the step of patterning the upper insulating layer 9, the oxide semiconductor film 7' functions as an etch stop, and it is possible to suppress the over-etching of the lower insulating layer 5. Therefore, it is possible to suppress the decrease in the reliability due to the over-etching of the lower insulating layer 5.

In the present embodiment, a portion of the oxide semiconductor film 7' that is to be the extension region 7e of the oxide semiconductor layer 7 is formed while being protected by the upper insulating layer 9, and it is therefore possible to suppress the lowering of the resistance of the extension region 7e due to process damage, etc. Therefore, even if the active regions 7a of adjacent pixel regions are connected together by the extension region 7e, it does not influence the display operation.

Second Embodiment

An active matrix substrate of the second embodiment of the present invention will now be described with reference to the drawings.

The present embodiment is different from the embodiment described above with reference to FIG. 2A in that it is an active matrix substrate including oxide semiconductor TFTs of the double gate structure as pixel TFTs, wherein a gate contact portion for electrically connecting together the upper gate electrode and the lower gate electrode is provided in each pixel region PIX.

The present embodiment and the subsequent embodiments will be described while focusing on what is different from the active matrix substrate 1001 (FIG. 2A), and redundant descriptions will be omitted as necessary.

Figure 3A:
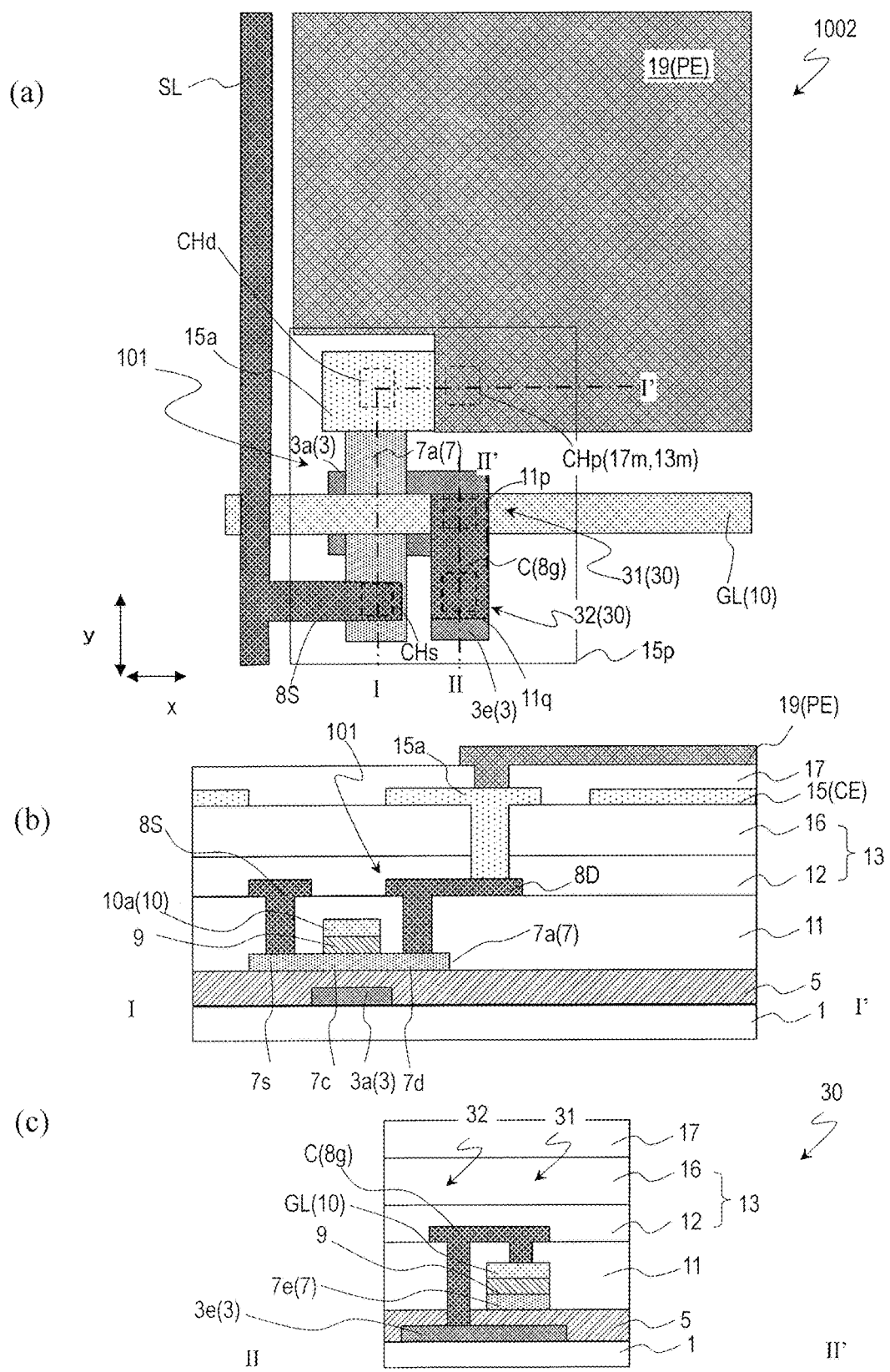
FIG. 3A(a) is a plan view illustrating a pixel region PIX of an active matrix substrate 1002 of a second embodiment, and FIG. 3A(b) and FIG. 3A(c) are schematic cross-sectional views taken along line I-I' and line II-II', respectively.

FIG. 3A(a) is a plan view illustrating a pixel region PIX of an active matrix substrate 1002 of the present embodiment. FIGS. 3A(b) and 3A(c) are schematic cross-sectional views taken along line I-I' and line II-II', respectively, of FIG. 3A(a).

Each pixel region PIX of the active matrix substrate 1002 includes the gate contact portion 30 that electrically connects together the lower gate layer 3 and the upper gate layer 10. The gate contact portion 30 may be arranged in the vicinity of the TFT 101 while being spaced apart from the active region 7a, as seen from the normal direction to the substrate 1, for example.

In this example, the lower gate layer 3 and the upper gate layer 10 are electrically connected together via a connecting portion (referred to as a "gate connecting portion C") formed in a layer that is different from the lower gate electrode 3a or from the upper gate electrode 10a. The gate contact portion 30 may include a first portion 31 that connects together the gate connecting portion C and the upper gate layer 10, and a second portion 32 that connects together the gate connecting portion C and the lower gate layer 3. The gate connecting portion C is formed by using a conducive film that is in a layer above the upper gate layer 10, for example. Herein, the gate connecting portion C is an island-shaped connecting portion 8g that is formed by using the same conductive film as the source bus line SL.

The lower gate layer 3 has an island-shaped pattern including the lower gate electrode 3a that is located in the TFT formation region and functions as a gate, and a lower gate extension 3e that extends to the second portion 32 from the lower gate electrode 3a (from the TFT formation region). The lower gate electrode 3a is arranged so as to overlap with at least a portion of the active region 7a, as seen from the normal direction to the substrate 1. The lower gate extension 3e is formed integral with the lower gate electrode 3a. As shown in the figures, the lower gate extension 3e may extend in the x direction from the TFT formation region to the first portion 31 so as to overlap with the gate bus line GL, and extend from the first portion 31 to the second portion 32 so as to overlap with the connecting portion 8g. Thus, it is possible to suppress the decrease in the pixel aperture ratio due to the lower gate extension 3e.

The connecting portion 8g extends so as to connect together the first portion 31 and the second portion 32. Although the connecting portion 8g extends in the y direction in this example, there is no particular limitation on the direction of extension. In the first portion 31, the connecting portion 8g is in contact with the gate bus line GL in an opening 11p formed in the first inorganic insulating layer 11. As described above, the upper insulating layer 9 and the extension region 7e of the oxide semiconductor layer 7 are arranged on the substrate 1 side of the gate bus line GL. In the second portion 32, the connecting portion 8g is in contact with the lower gate extension 3e in an opening 11q formed in the lower insulating layer 5 and the first inorganic insulating layer 11.

Also in the first portion 31 of the gate contact portion 30, the upper insulating layer 9 and the extension region 7e of the oxide semiconductor layer 7 are located between the upper gate layer 10 and the lower insulating layer 5. As will be described later, also in the present embodiment, the oxide semiconductor layer 7 may be patterned after patterning the upper gate layer 10 and the upper insulating layer 9 using the same mask. Thus, as seen from the normal direction to the substrate 1, the outer edge of the upper gate layer 10 including the gate bus line GL and the upper gate electrode 10a is generally aligned with the outer edge of the upper insulating layer 9 and the outer edge of the extension region 7e of the oxide semiconductor layer 7.

The first portion 31 may be arranged on the gate bus line GL, and the second portion 32 may be arranged at a position spaced apart from the gate bus line GL in the y direction. In this example, the first portion 31 and the second portion 32 are arranged with a sufficient interval therebetween so that the extension region 7e of the oxide semiconductor layer 7 located in the first portion 31 does not come into contact with the connecting portion 8g in the opening 11g. While the gate contact portion 30 extends generally in parallel to the active region 7a (herein, in the y direction) as seen from the normal direction to the substrate 1, the shape and the arrangement of the gate contact portion 30 are not limited to those of the illustrated example.

The gate connecting portion C may extend from the first portion 31 to the second portion 32 so as to overlap with the lower gate extension 3e. Although not shown in the figure, the first portion 31 may be arranged so as not to overlap with the lower gate extension 3e as seen from the normal direction to the substrate 1 (see FIG. 5, etc.).

<Method for Manufacturing Active Matrix Substrate 1002>

The description of the manufacturing method of the present embodiment and the subsequent embodiments will focus on what is different from the active matrix substrate 1001 (or the active matrix substrate 1002), and redundant descriptions will be omitted as necessary. The materials, the thicknesses and the methods of formation of the various layers will also not be described when they are similar to those of the active matrix substrate 1001.

FIG. 3B to FIG. 3J are schematic step-by-step diagrams illustrating a method for manufacturing the active matrix substrate 1002. In each figure, (a) is a plan view illustrating a pixel region PIX. In each figure, (b) and (c) are schematic cross-sectional views taken along line I-I' and line II-II', respectively, of FIG. 3A(a).

Figure 3B:
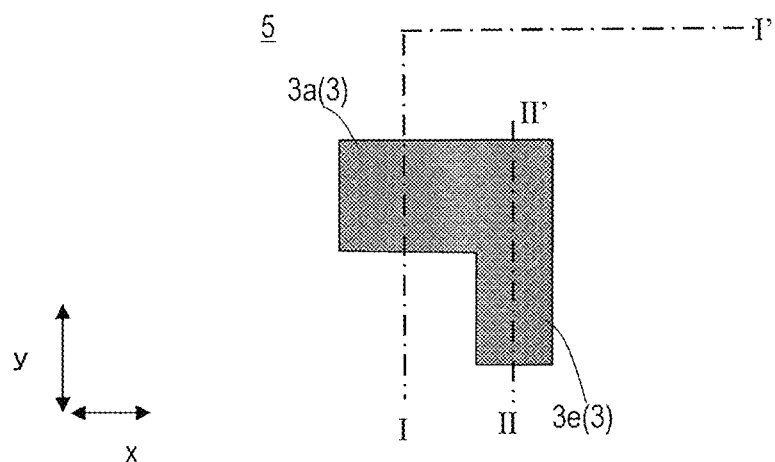
FIGS. 3B(a) to 3B(c) are a plan view and cross-sectional views illustrating a step of a method for manufacturing the active matrix substrate 1002.
Figure 3B:
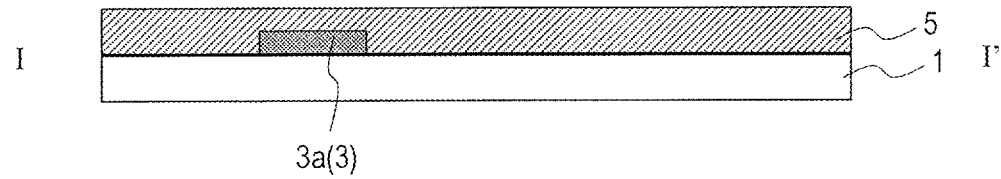
Figure 3B:
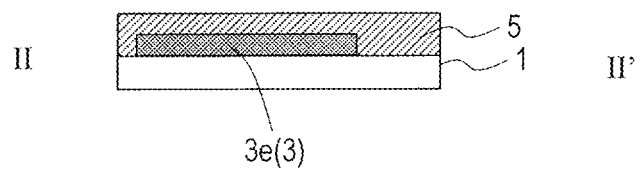

First, as shown in FIGS. 3B(a) to 3B(c), an island-shaped lower gate layer 3 and the lower insulating layer 5 are formed on the substrate 1 in each pixel region PIX. The lower gate layer 3 includes the lower gate electrode 3a and the lower gate extension 3e that extends from the TFT formation region to the region where the gate contact portion is formed.

Figure 3C:
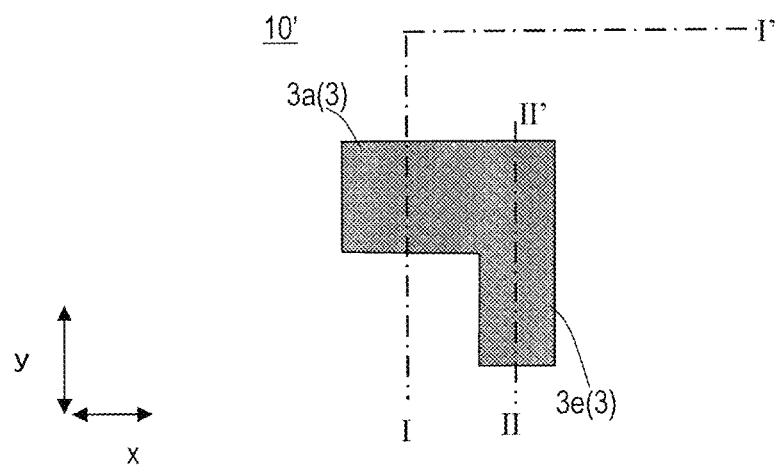
FIGS. 3C(a) to 3C(c) are a plan view and cross-sectional views illustrating a step of the method for manufacturing the active matrix substrate 1002.
Figure 3C:
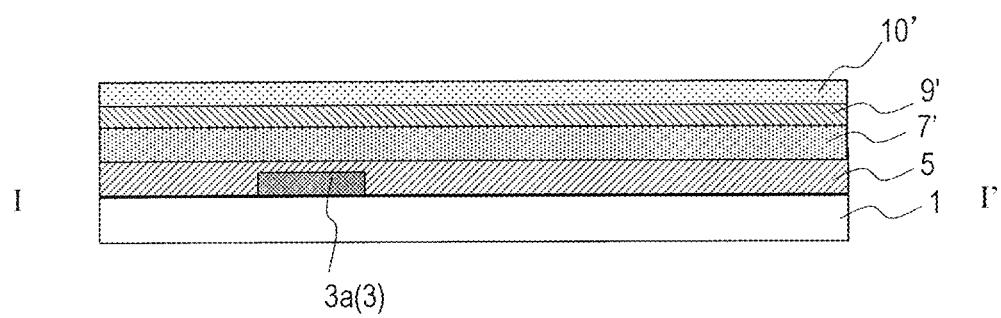
Figure 3C:
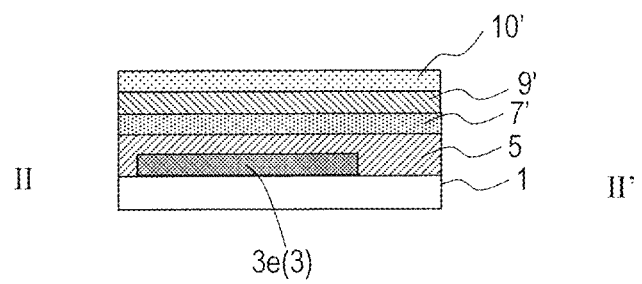

Next, as shown in FIGS. 3C(a) to 3C(c), the oxide semiconductor film 7', the upper insulating film 9' and the upper gate conductive film 10' are formed in this order on the lower insulating layer 5.

Figure 3D:
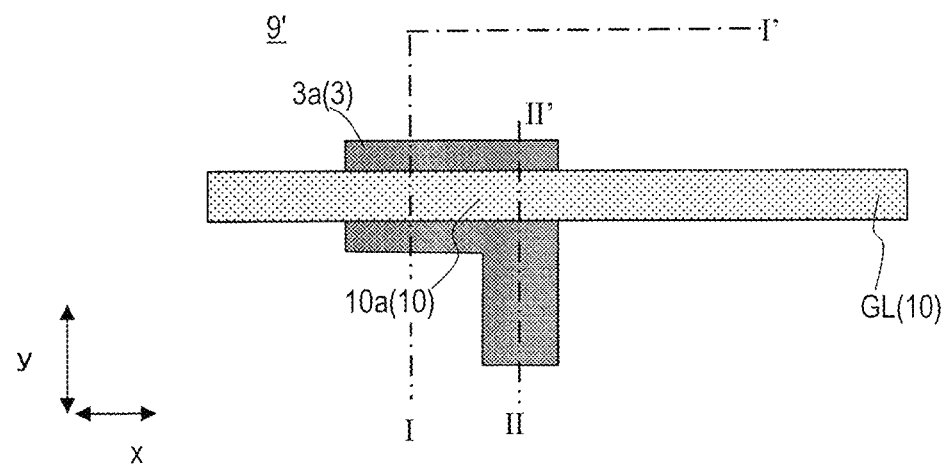
FIGS. 3D(a) to 3D(c) are a plan view and cross-sectional views illustrating a step of the method for manufacturing the active matrix substrate 1002.
Figure 3D:
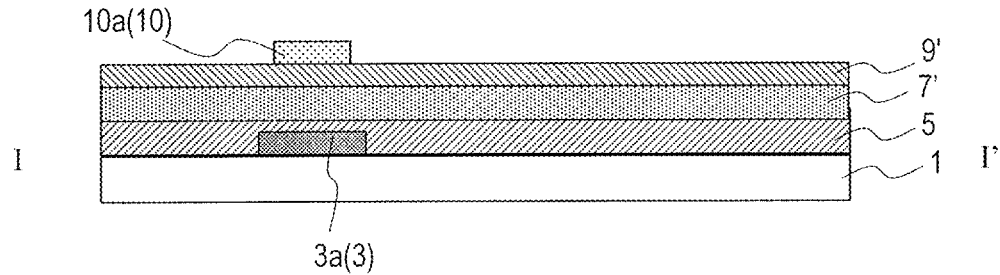
Figure 3D:
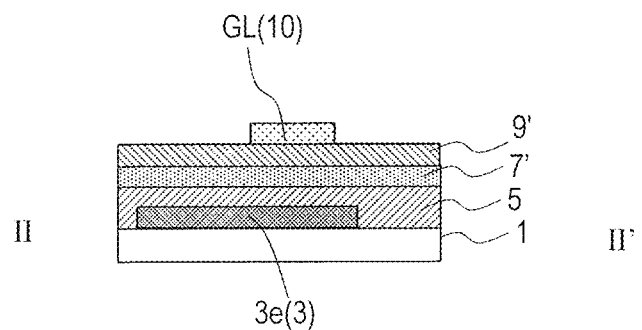

Then, as shown in FIGS. 3D(a) to 3D(c), the upper gate conductive film 10' is patterned by using the first resist mask (not shown), thereby forming the upper gate layer 10 including the upper gate electrode 10a and the gate bus line GL.

Figure 3E:
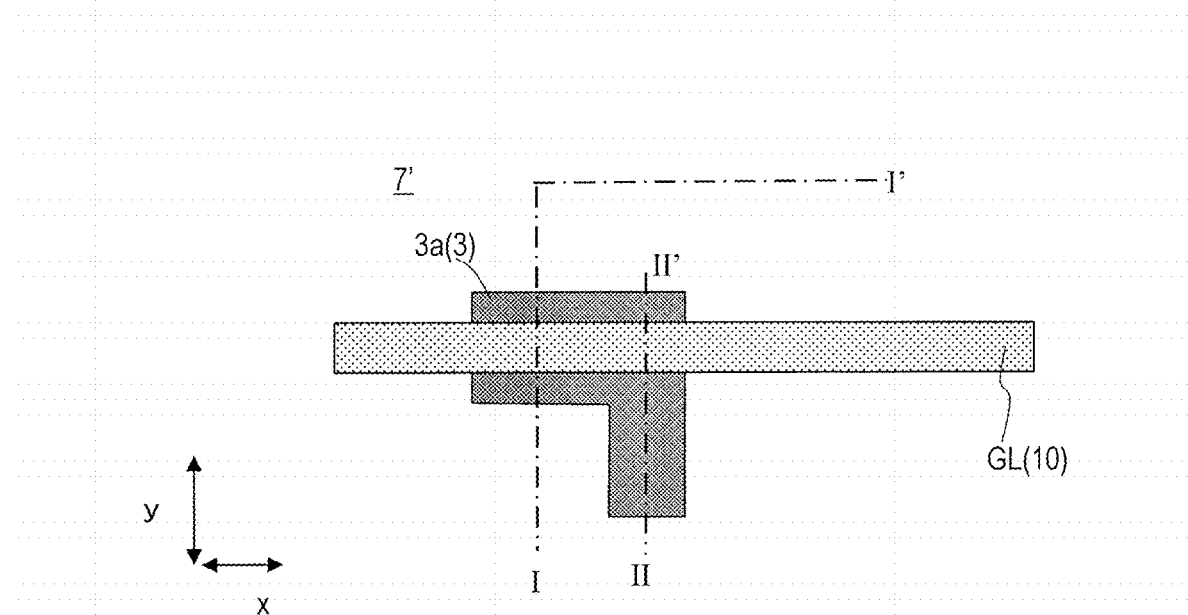
FIGS. 3E(a) to 3E(c) are a plan view and cross-sectional views illustrating a step of the method for manufacturing the active matrix substrate 1002.
Figure 3E:
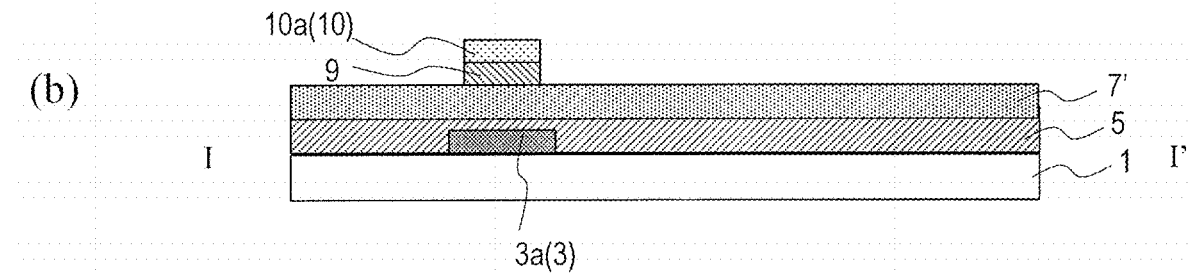
Figure 3E:
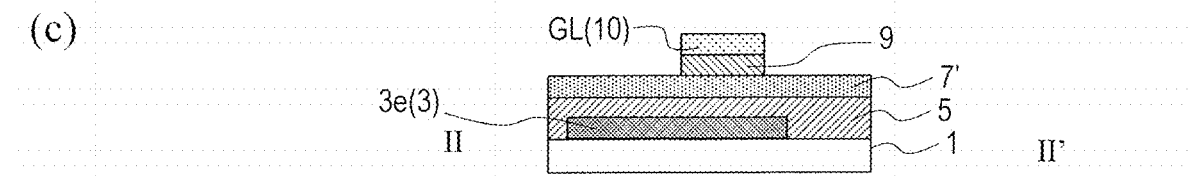

Then, as shown in FIGS. 3E(a) to 3E(c), the upper insulating film 9' is patterned by using the first resist mask. As in the embodiments described above, in this patterning step, since the lower insulating layer 5 is covered by the oxide semiconductor film 7', and the oxide semiconductor film 7' serves as an etch stop, it is possible to suppress the etching of the surface of the lower insulating layer 5. Then, the first resist mask is removed. The upper insulating film 9' may be patterned by using the upper gate layer 10 as a mask after removing the first resist mask.

Figure 3F:
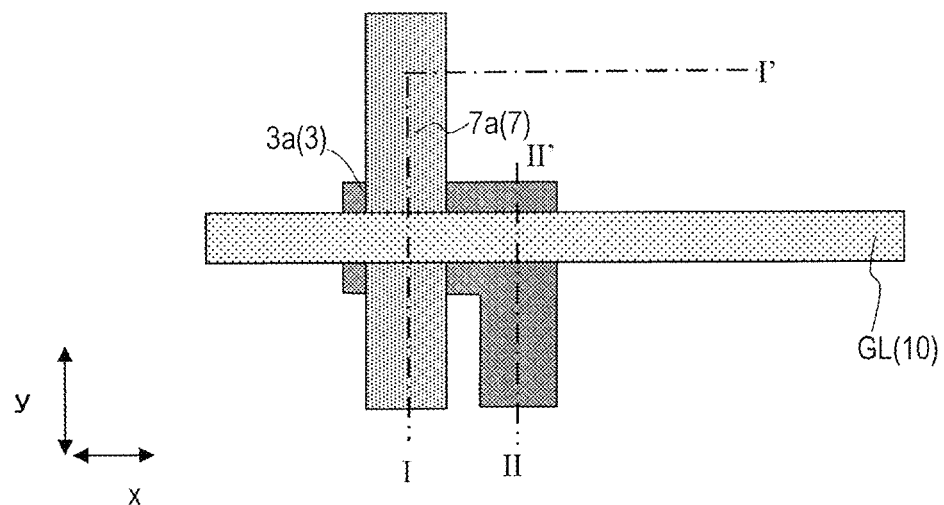
FIGS. 3F(a) to 3F(c) are a plan view and cross-sectional views illustrating a step of the method for manufacturing the active matrix substrate 1002.
Figure 3F:
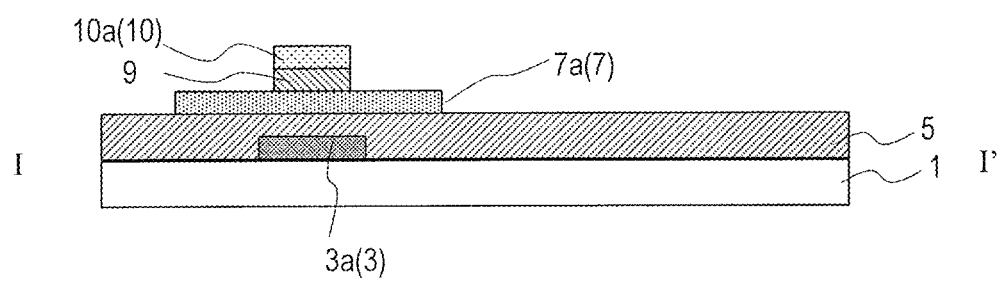
Figure 3F:
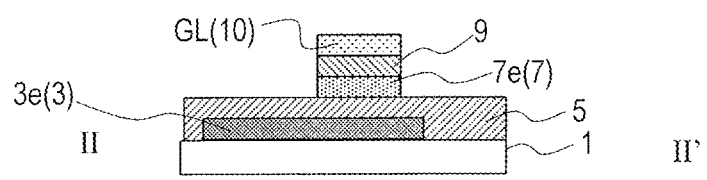

Then, as shown in FIGS. 3F(a) to 3F(c), the oxide semiconductor film 7' is patterned by using a second resist mask (not shown), which defines the active region, and the upper gate layer 10 as a mask, thereby obtaining the oxide semiconductor layer 7. The oxide semiconductor layer 7 includes the active region 7a, which is defined by the second resist mask, and the extension region 7e, which extends from the active region 7a so as to overlap with the upper gate layer 10. The extension region 7e includes a portion that extends in the x direction under the gate bus line GL.

Figure 3G:
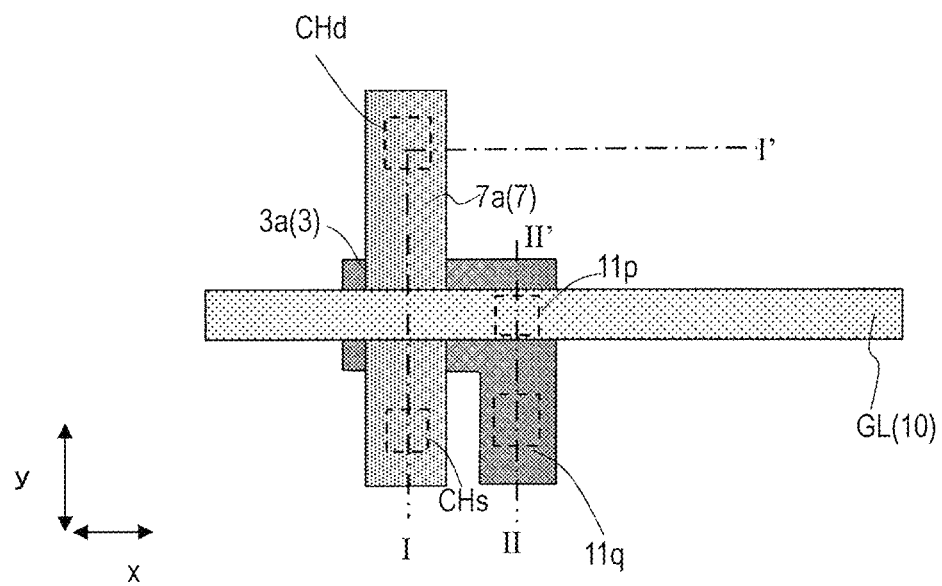
FIGS. 3G(a) to 3G(c) are a plan view and cross-sectional views illustrating a step of the method for manufacturing the active matrix substrate 1002.
Figure 3G:
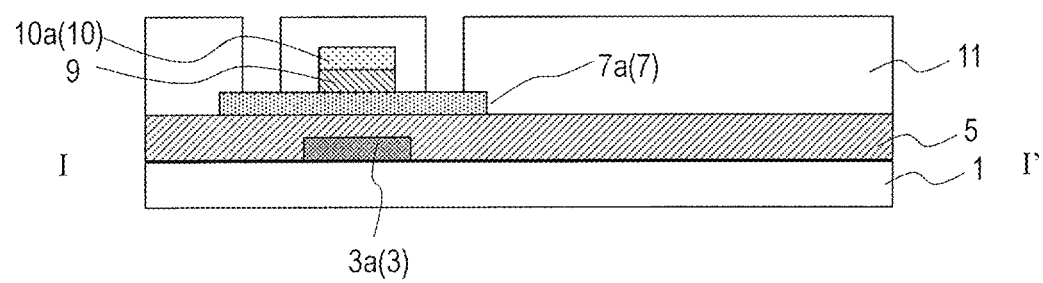
Figure 3G:
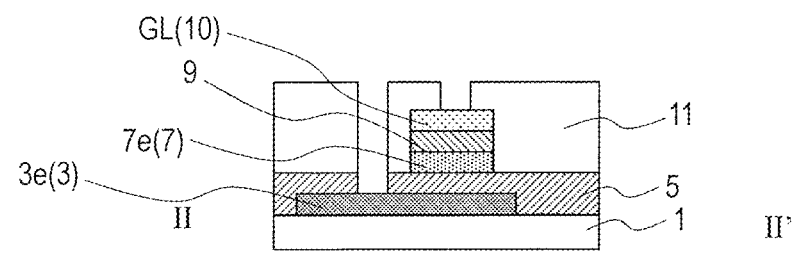

Then, as shown in FIGS. 3G(a) to 3G(c), the first inorganic insulating layer 11 is formed so as to cover the oxide semiconductor layer 7, the upper insulating layer 9 and the upper gate layer 10. Then, the openings CHs and CHd that reach the oxide semiconductor layer 7, the opening 11p that reaches the gate bus line GL, and the opening 11q that reaches the lower gate extension 3e are formed in the first inorganic insulating layer 11 by dry etching, for example.

Figure 3H:
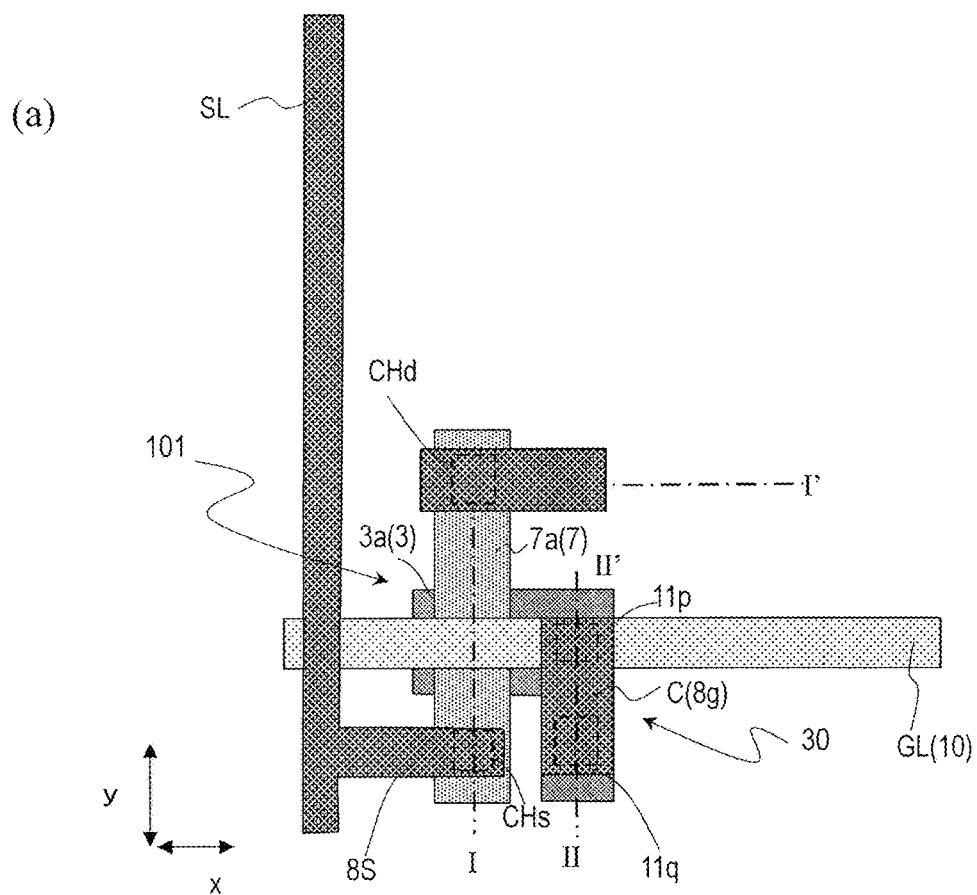
FIGS. 3H(a) to 3H(c) are a plan view and cross-sectional views illustrating a step of the method for manufacturing the active matrix substrate 1002.
Figure 3H:
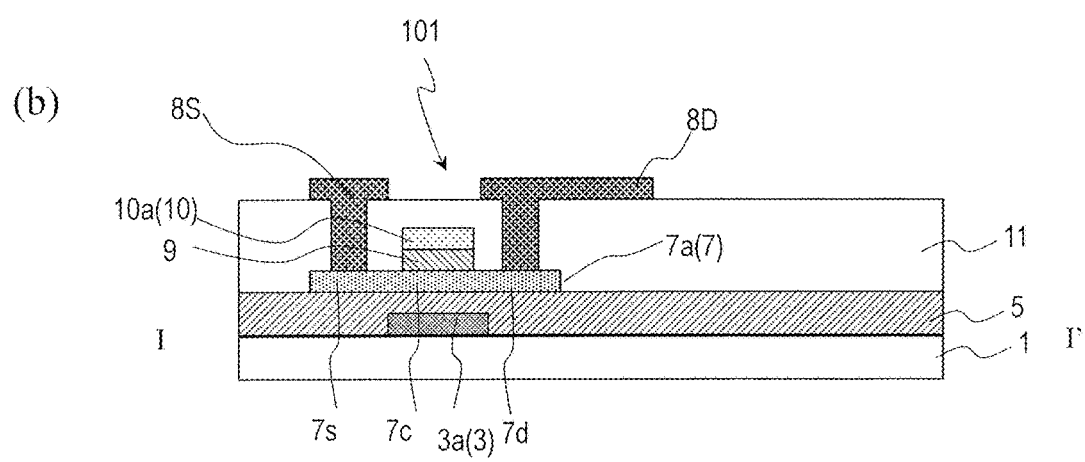
Figure 3H:
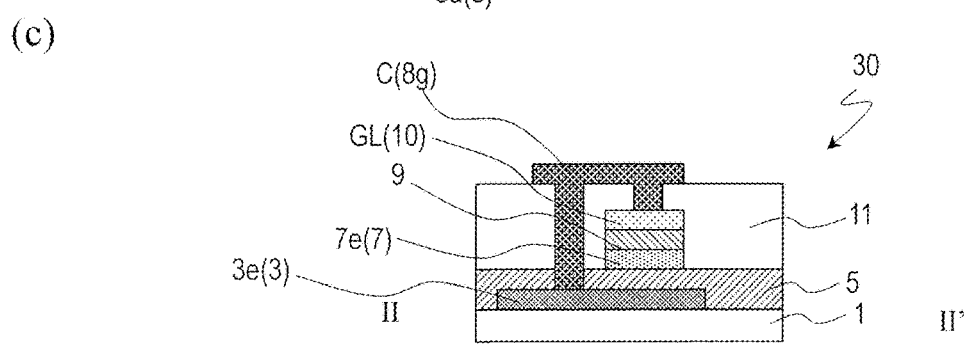

Next, as shown in FIGS. 3H(a) to 3H(c), a source metal layer including the source bus line SL, the source electrode 8S, the drain electrode 8D, and the gate connecting portion C (the connecting portion 8g) is formed. The connecting portion 8g is arranged so as to be in contact with the gate bus line GL in the opening 11p and in contact with the lower gate extension 3e in the opening 11g. Thus, the gate contact portion 30 and the TFT 101 are obtained.

Figure 3I:
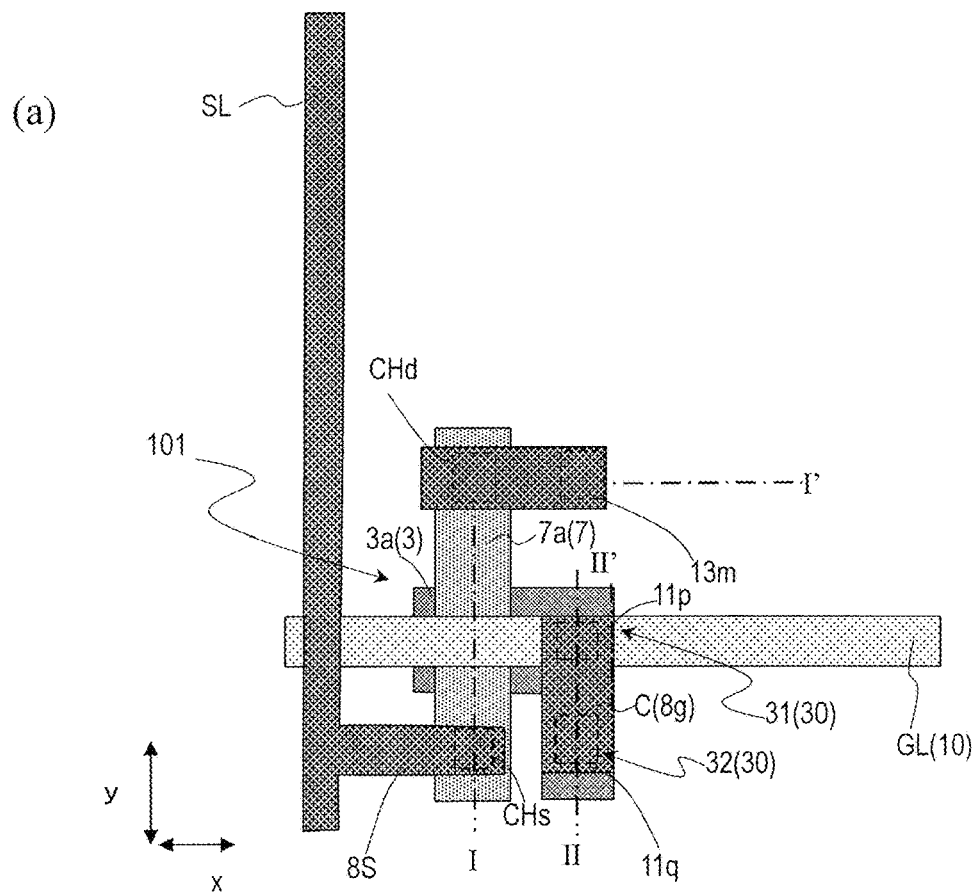
FIGS. 3I(*a*) to 3I(*c*) are a plan view and cross-sectional views illustrating a step of the method for manufacturing the active matrix substrate 1002.
Figure 3I:
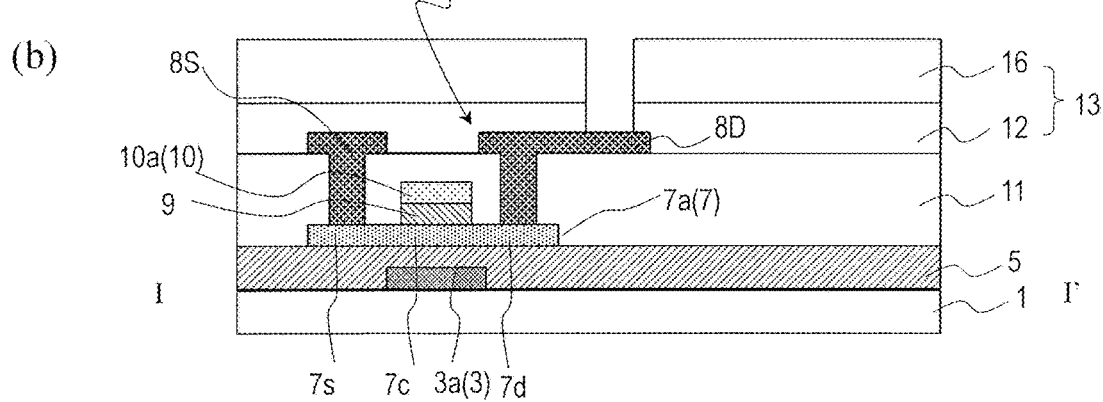
Figure 3I:
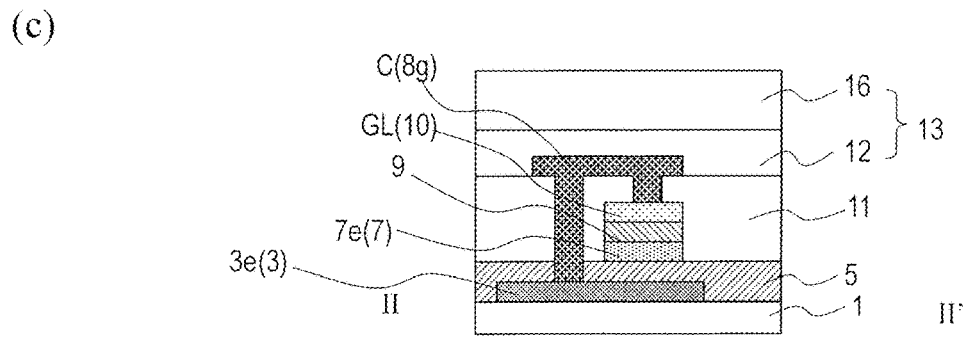
Figure 3J:
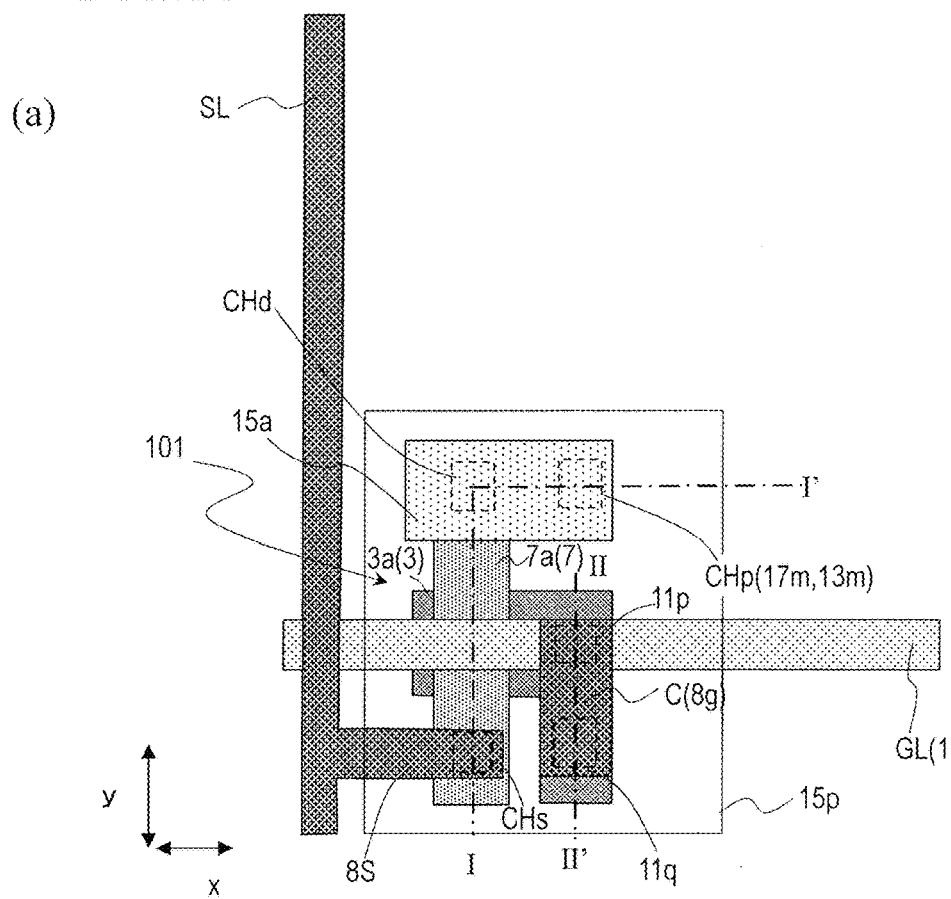
FIGS. 3J(a) to 3J(c) are a plan view and cross-sectional views illustrating a step of the method for manufacturing the active matrix substrate 1002.
Figure 3J:
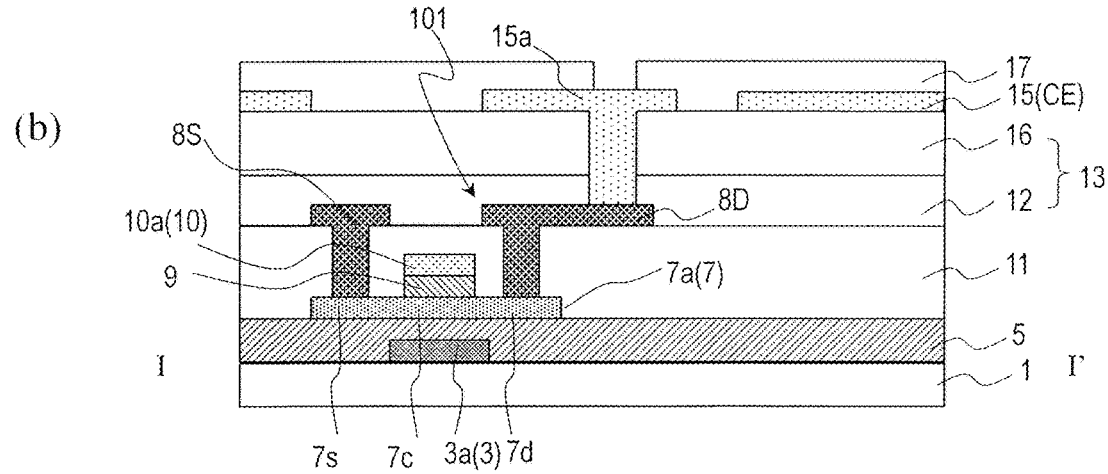
Figure 3J:
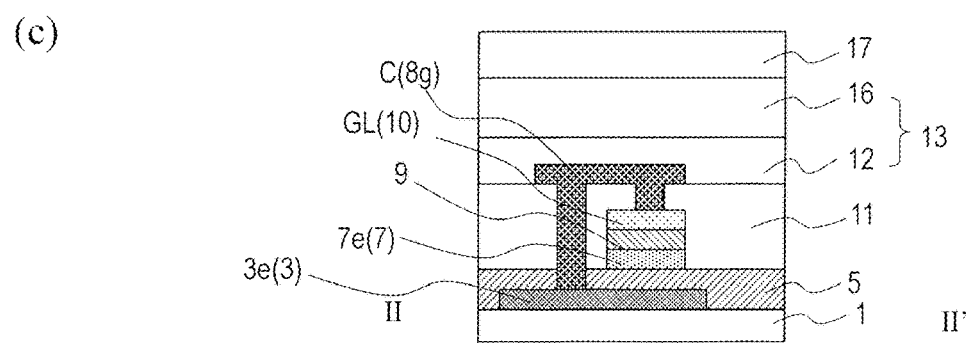

Then, as shown in FIGS. 3I(*a*) to 3I(*c*) and FIGS. 3J(a) to 3J(c), a lower transparent conductive layer including the interlayer insulating layer 13, the lower transparent electrode 15 and the transparent connecting portion 15a, and the dielectric layer 17 are formed. The method of formation is similar to the method described above with reference to FIG. 2H and FIG. 2I. Then, an upper transparent conductive layer including the upper transparent electrode 19 is formed. Thus, the active matrix substrate 1002 shown in FIG. 3A is manufactured.

In the present embodiment, the gate contact portion 30 that electrically connects together the lower gate layer 3 and the upper gate layer 10 is provided for each pixel region PIX. Thus, one of the lower gate layer 3 and the upper gate layer 10 can be formed in an island-shaped pattern in the pixel region PIX, and it is therefore possible to suppress the decrease in the pixel aperture ratio. As in the embodiment described above, by patterning the oxide semiconductor layer 7 after the formation of the gate metal layer, it is possible to suppress the decrease in the reliability due to the over-etching of the lower insulating layer 5. Moreover, by arranging the first portion 31 and the second portion 32 while being spaced apart from each other, it is possible to more reliably electrically separate the extension region 7e of the oxide semiconductor layer 7 and the connecting portion 8g from each other, and it is therefore possible to more stably operate the TFT 101.

<Variation 1>

Variation 1 is different from the active matrix substrate 1002 shown in FIG. 3A in that the gate connecting portion C that connects together the lower gate layer 3 and the upper gate layer 10 is formed in the gate contact portion 30 by using the same transparent conductive film as the lower transparent electrode 15 (the first transparent conductive film).

Figure 4A:
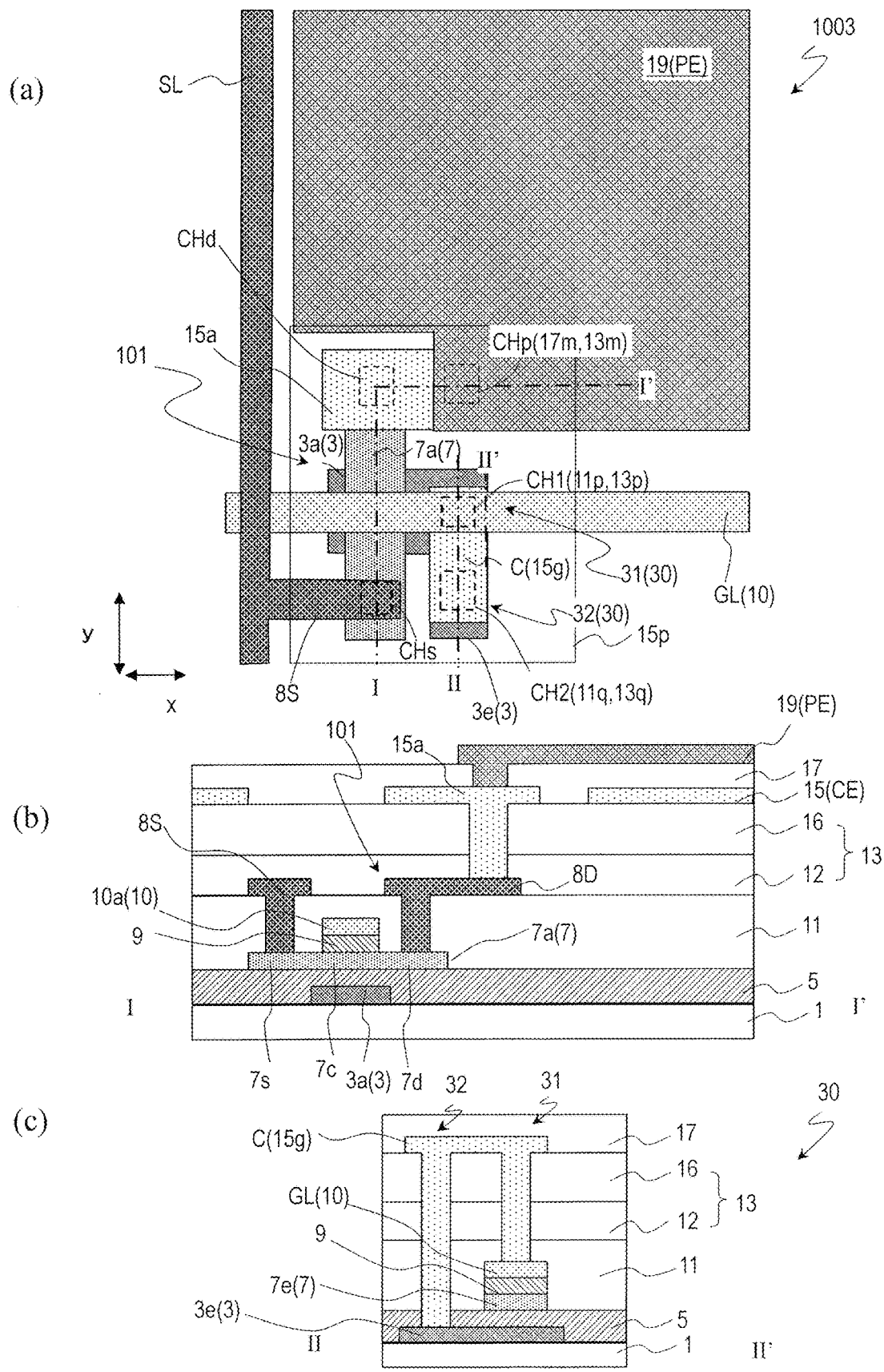
FIG. 4A(a) is a plan view illustrating a pixel region PIX of an active matrix substrate 1003 of the second embodiment, and FIG. 4A(b) and FIG. 4A(c) are schematic cross-sectional views taken along line I-I' and line II-II', respectively.

FIG. 4A(a) is a plan view illustrating a pixel region PIX of the active matrix substrate 1003 according to Variation 1 of the present embodiment. FIGS. 4A(b) and 4A(c) are schematic cross-sectional views taken along line I-I' and line II-II', respectively, of FIG. 4A(a).

In each pixel region PIX of Variation 1, the gate contact portion 30 includes, as the gate connecting portion C, a connecting portion 15g that is formed by using the same transparent conductive film as the lower transparent electrode 15. In the first portion 31, the connecting portion 15g is in contact with the upper gate layer 10 (herein, the gate bus line GL) in a contact hole CH1 formed in the first inorganic insulating layer 11 and the interlayer insulating layer 13. In the second portion 32, the connecting portion 15g is in contact with the lower gate layer 3 (the lower gate extension 3e) in a contact hole CH2 formed in the lower insulating layer 5, the first inorganic insulating layer 11 and the interlayer insulating layer 13. Otherwise, the configuration may be similar to that of the active matrix substrate 1002.

The active matrix substrate 1003 of Variation 1 can be manufactured as follows.

First, the lower gate electrode 3a, the lower insulating layer 5, the oxide semiconductor layer 7, the upper insulating layer 9, the upper gate electrode 10a, the gate bus line GL and the first inorganic insulating layer 11 are formed on the substrate 1 by a method similar to that for the active matrix substrate 1002. Next, the openings CHs, CHd, 11p and 11q are formed in the first inorganic insulating layer 11.

Figure 4B:
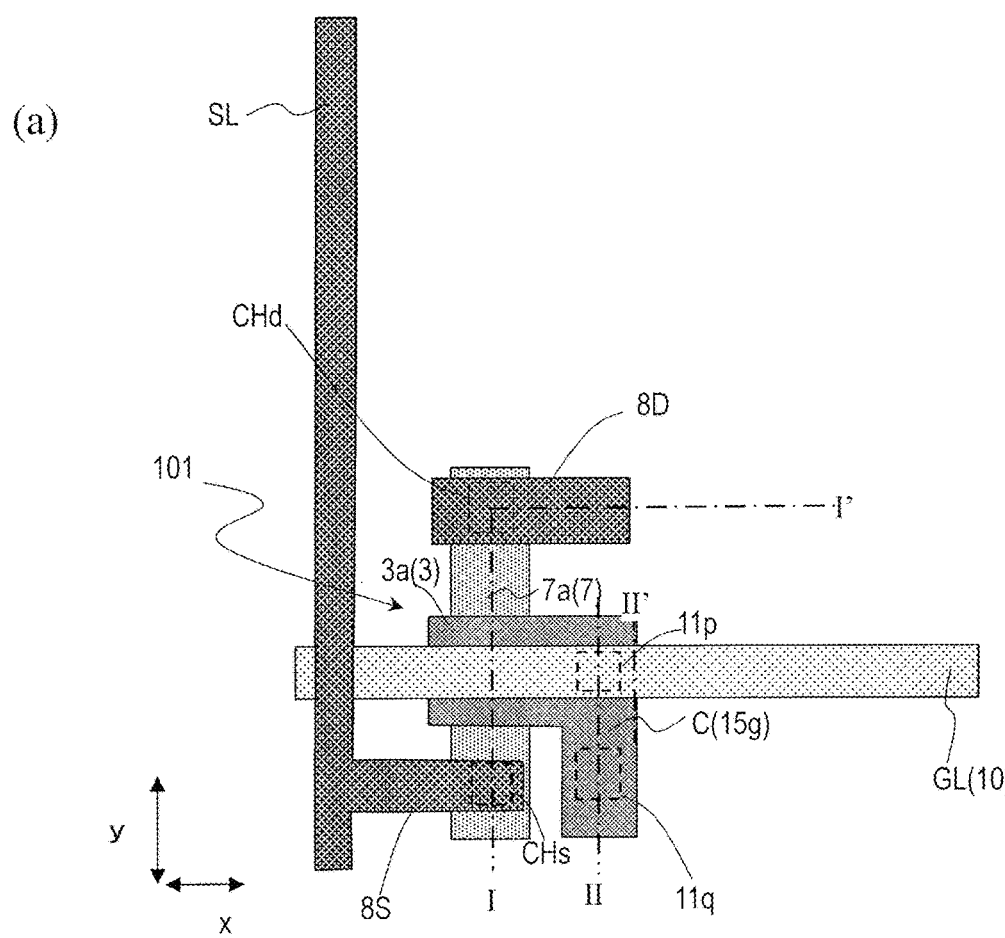
FIGS. 4B(a) to 4B(c) are a plan view and cross-sectional views illustrating a step of the method for manufacturing the active matrix substrate 1003.
Figure 4B:
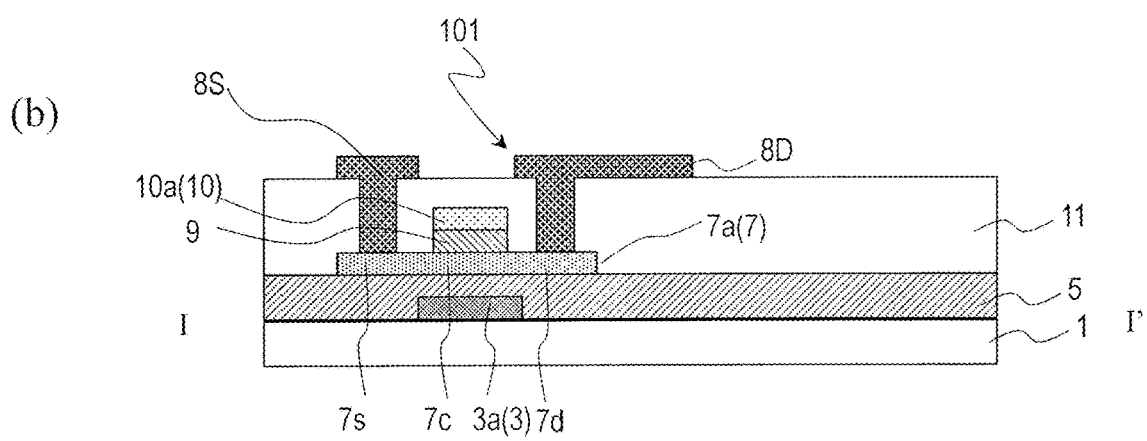
Figure 4B:
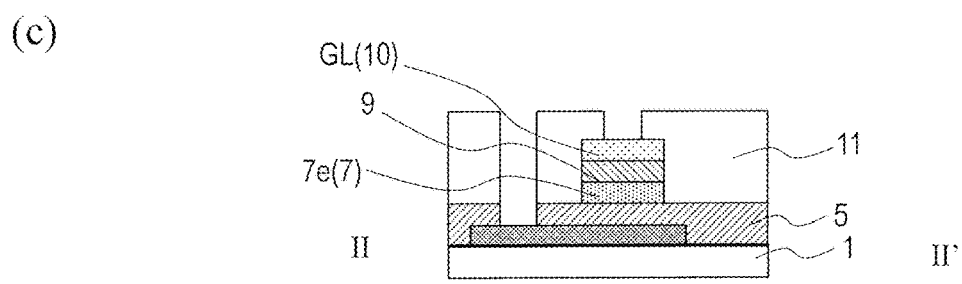

Then, as shown in FIGS. 4B(a) to 4B(c), a source conductive film is formed and patterned so as to form the source electrode 8S and the drain electrode 8D. The source conductive film is removed from the gate contact portion formation region.

Figure 4C:
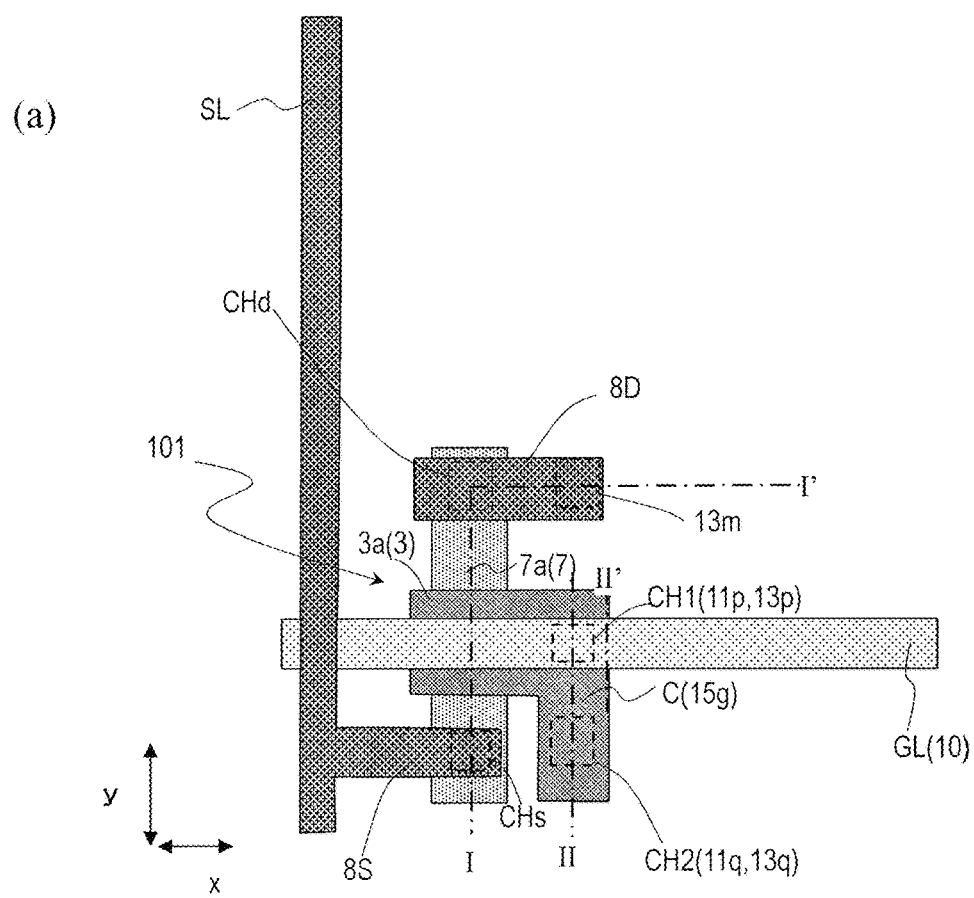
FIGS. 4C(a) to 4C(c) are a plan view and cross-sectional views illustrating a step of the method for manufacturing the active matrix substrate 1003.
Figure 4C:
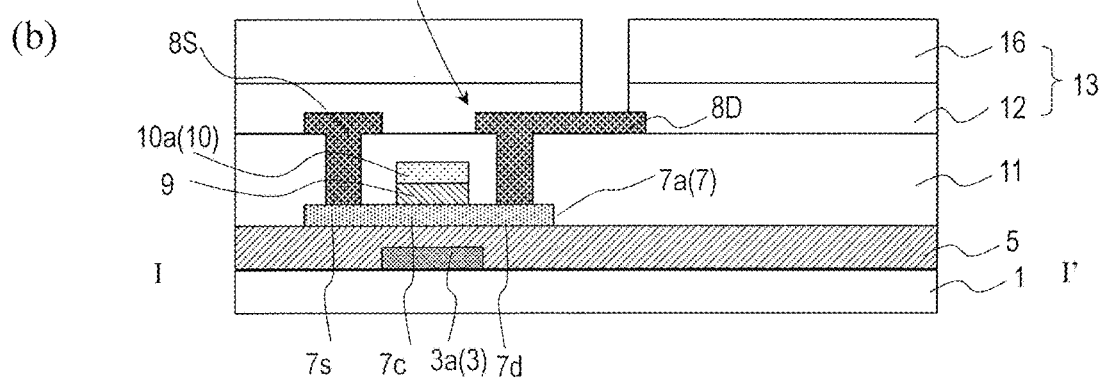
Figure 4C:
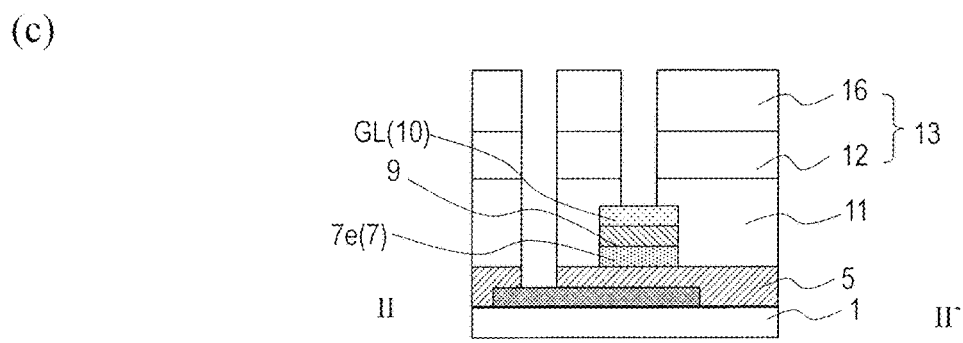

Next, as shown in FIGS. 4C(a) to 4C(c), the second inorganic insulating layer 12 and the organic insulating layer 16 are formed so as to cover the TFT 101. Then, the organic insulating layer 16 is patterned to form the opening. Then, the second inorganic insulating layer 12 is etched by using the organic insulating layer 16 as a mask (dry etching). Thus, the opening 13m that reaches the drain electrode 8D and openings 13p and 13q that are located in the gate contact portion formation region are formed in the second inorganic insulating layer 12 and the organic insulating layer 16. The opening 13p is arranged so as to at least partially overlap with the opening 11p of the first inorganic insulating layer 11 as seen from the normal direction to the substrate 1. Therefore, the opening 13p and the opening 11p together form the contact hole CH1, through which the gate bus line GL is exposed. Similarly, the opening 13q is arranged so as to at least partially overlap with the opening 11q of the first inorganic insulating layer 11 as seen from the normal direction to the substrate 1. Therefore, the opening 13q and the opening 11q together form the contact hole CH2, through which the lower gate extension 3e is exposed.

Figure 4D:
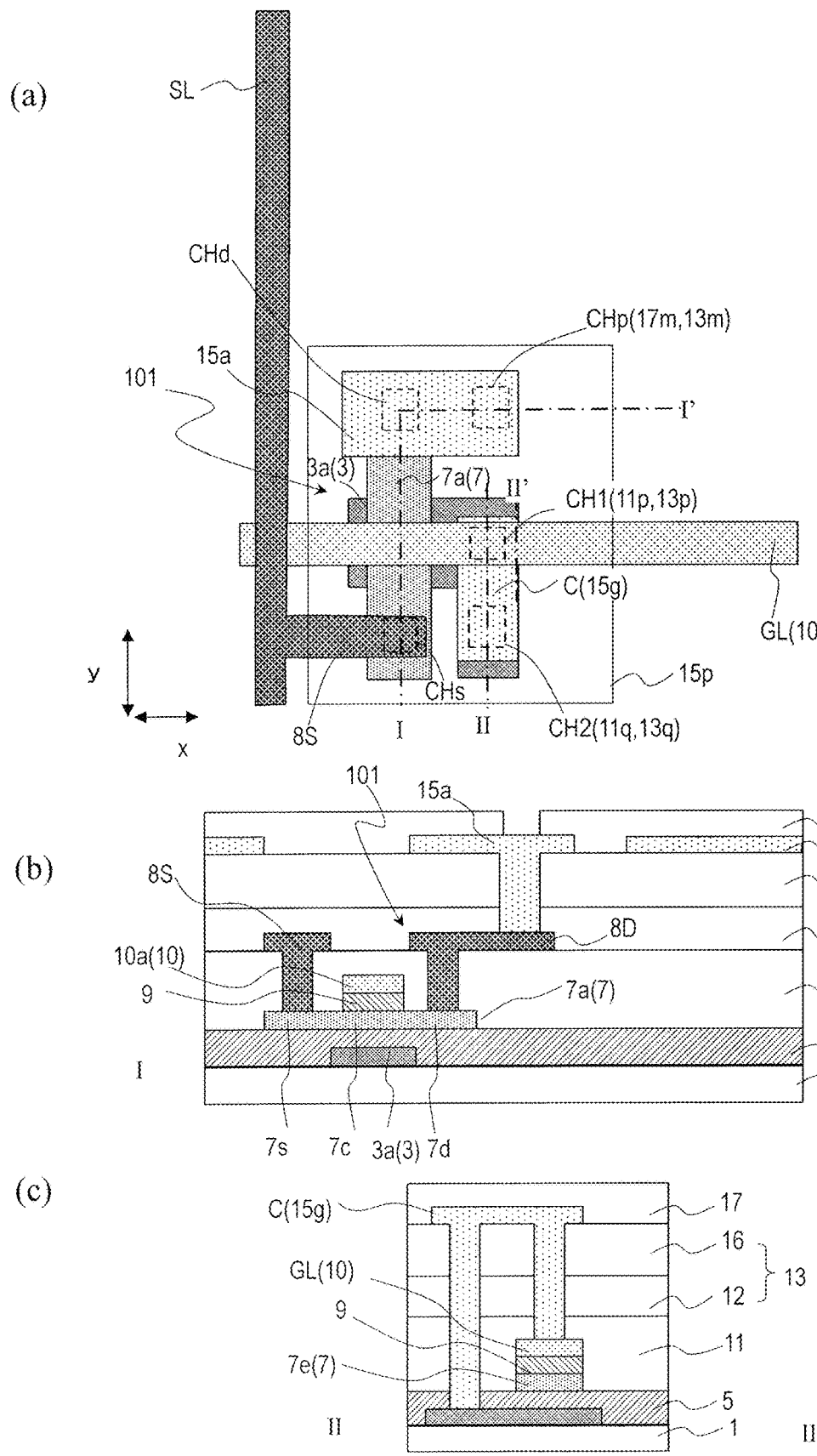
FIGS. 4D(a) to 4D(c) are a plan view and cross-sectional views illustrating a step of the method for manufacturing the active matrix substrate 1003.

Then, as shown in FIGS. 4D(a) to 4D(c), a lower transparent conductive layer including the lower transparent electrode 15, the transparent connecting portion 15a and the connecting portion 15g, which is the gate connecting portion C, is formed. The lower transparent conductive layer can be formed by forming a first transparent conductive film on the interlayer insulating layer 13 and in the opening 13m and in the contact holes CH1 and CH2, and then patterning the first transparent conductive film. The connecting portion 15g is arranged so as to be in contact with the upper gate layer 10 (herein, the gate bus line GL) in the contact hole CH1 and in contact with the lower gate extension 3e in the contact hole CH2. Next, the dielectric layer 17 is formed.

Then, an upper transparent conductive layer including the upper transparent electrode 19 is formed. Thus, the active matrix substrate 1003 shown in FIG. 4A is manufactured.

In Variation 1, since the connecting portion 15g, which is the gate connecting portion C, is transparent, the pixel aperture ratio is not lowered by the connecting portion 15g. Thus, the connecting portion 15g can be arranged in any manner in the pixel region PIX, irrespective of the arrangement of the lower gate layer 3 and the upper gate layer 10. For example, as shown in FIGS. 5(a) to 5(c), the end portion of the connecting portion 15g that is on the first portion 31 side is arranged on the upper gate layer 10 (herein, the gate bus line GL), and the end portion thereof that is on the second portion 32 side is arranged on the lower gate extension 3e, wherein the portion that is located between these end portions may extend so as not to overlap with the gate bus line GL or with the lower gate extension 3e.

The first portion 31 may be arranged over the upper gate layer 10 so as not to overlap with the lower gate layer 3. Thus, according to this variation, the first portion 31 and the second portion 32 of the gate contact portion 30 can be arranged at any positions while suppressing the decrease in the pixel aperture ratio due to the gate connecting portion C. Therefore, for example, the interval between the first portion 31 and the second portion 32 can be further increased, and it is therefore possible to more reliably electrically separate the connecting portion 15g in the contact hole CH2 from the extension region 7e located in the first portion 31 in the gate contact portion 30.

Figure 5:
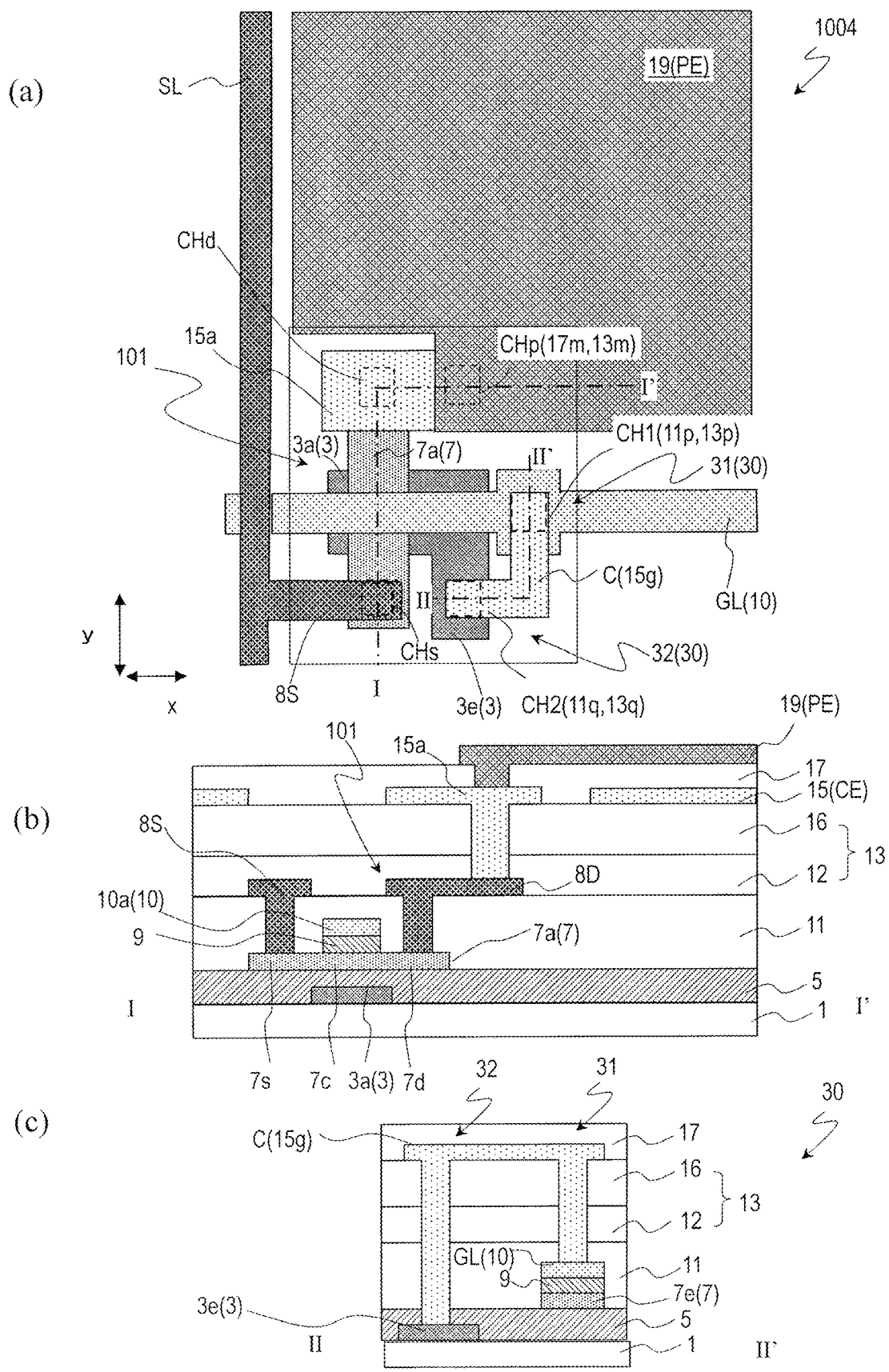
FIG. 5(*a*) is a plan view illustrating a pixel region PIX of an active matrix substrate 1004 of the second embodiment, and FIG. 5(*b*) and FIG. 5(*c*) are schematic cross-sectional views taken along line I-I' and line II-II', respectively.

The active matrix substrate 1004 shown in FIG. 5 can be manufactured by a method similar to that for the active matrix substrate 1003.

<Variation 2>

Variation 2 is different from the active matrix substrate 1003 of Variation 1 in that in the gate contact portion 30, the gate connecting portion C is formed by using both of the same conductive film as the source bus line SL (the source conductive film) and the same transparent conductive film as the lower transparent electrode 15 (the first transparent conductive film).

Figure 6A:
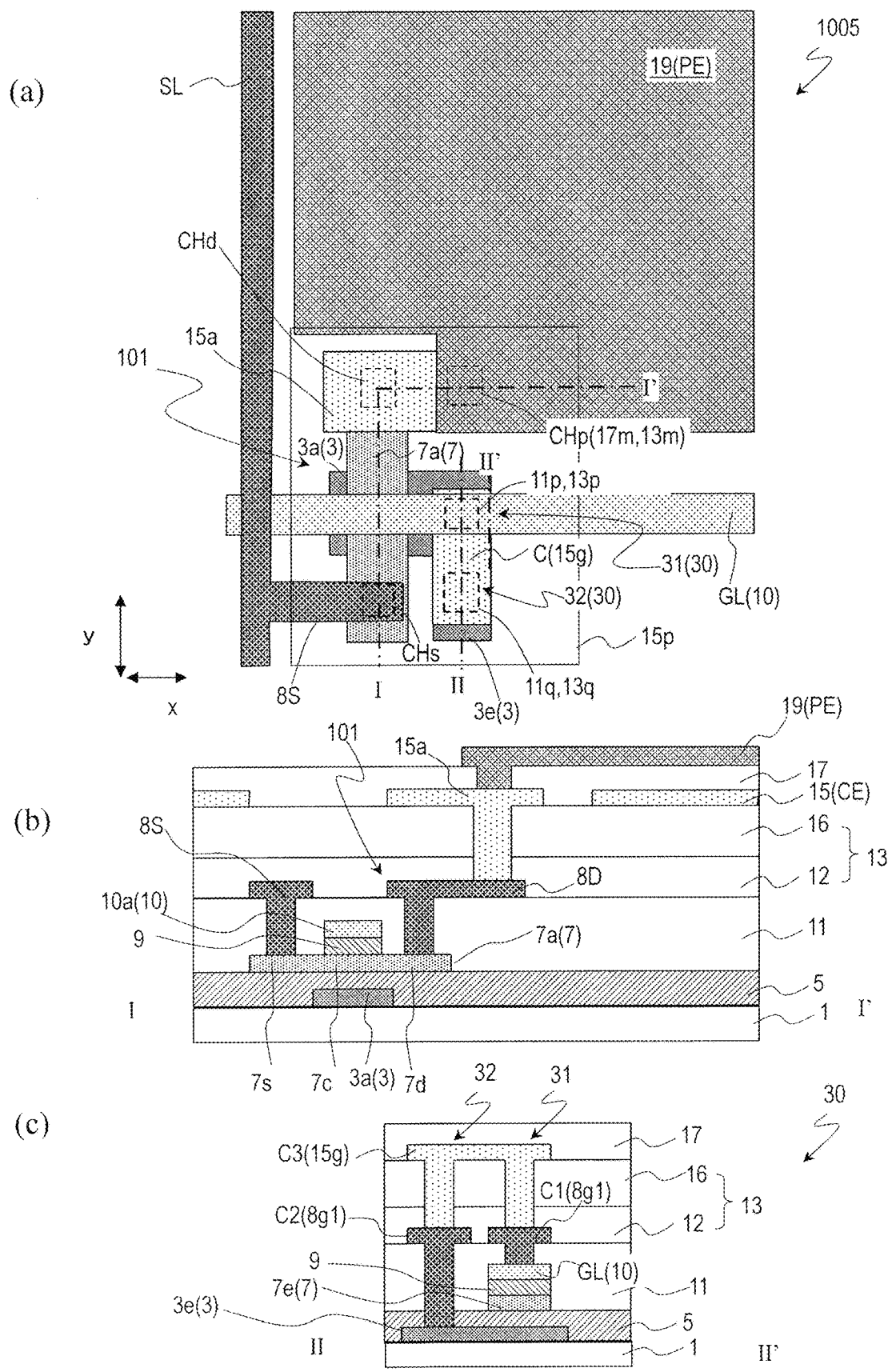
FIG. 6A(a) is a plan view illustrating a pixel region PIX of an active matrix substrate 1005 of the second embodiment, and FIG. 6A(b) and FIG. 6A(c) are schematic cross-sectional views taken along line I-I' and line II-II', respectively.

FIG. 6A(a) is a plan view illustrating a pixel region PIX of the active matrix substrate 1005 according to Variation 2 of the present embodiment. FIGS. 6A(b) and 6A(c) are schematic cross-sectional views taken along line I-I' and line respectively, of FIG. 6A(a).

In each pixel region PIX of Variation 2, the gate connecting portion C of the gate contact portion 30 includes a connecting portion 8g1 (a first connecting portion C1) and a connecting portion 8g2 (a second connecting portion C2) formed by using the source conductive film, and the connecting portion 15g (a third connecting portion C3) formed by using the same transparent conductive film as the lower transparent electrode 15. The first connecting portion C1 and the second connecting portion C2 are arranged spaced apart from each other.

The first connecting portion C1 is in contact with the upper gate layer 10 (herein, the gate bus line GL) in the opening 11p formed in the first inorganic insulating layer 11. The second connecting portion C2 is in contact with the lower gate extension 3e of the lower gate layer 3 in the opening 11q formed in the first inorganic insulating layer 11 and the lower insulating layer 5. The third connecting portion C3 is in contact with the first connecting portion C1 in the opening 13p formed in the interlayer insulating layer 13 in the first portion 31, and is in contact with the second connecting portion C2 in the opening 13q formed in the interlayer insulating layer 13 in the second portion 32. Otherwise, the configuration may be similar to that of the active matrix substrate 1003.

The gate connecting portion C is formed in the relatively deep contact holes CH1 and CH2, which are formed in the thickness direction in the lower insulating layer 5, the first inorganic insulating layer 11 and the interlayer insulating layer 13 in Variation 1, whereas the connecting portions C1, C2 and C3 in Variation 2 are formed in openings that are shallower than those of Variation 1. This gives advantages, such as an electrical connection can be ensured more reliably and the sizes of the openings can be made even smaller.

The active matrix substrate 1005 of Variation 2 can be manufactured as follows.

First, the lower gate electrode 3a, the lower insulating layer 5, the oxide semiconductor layer 7, the upper insulating layer 9, the upper gate electrode 10a, the gate bus line GL and the first inorganic insulating layer 11 are formed on the substrate 1 by a method similar to that for the active matrix substrate 1002. Next, the openings CHs, CHd, 11p and 11q are formed in the first inorganic insulating layer 11.

Figure 6B:
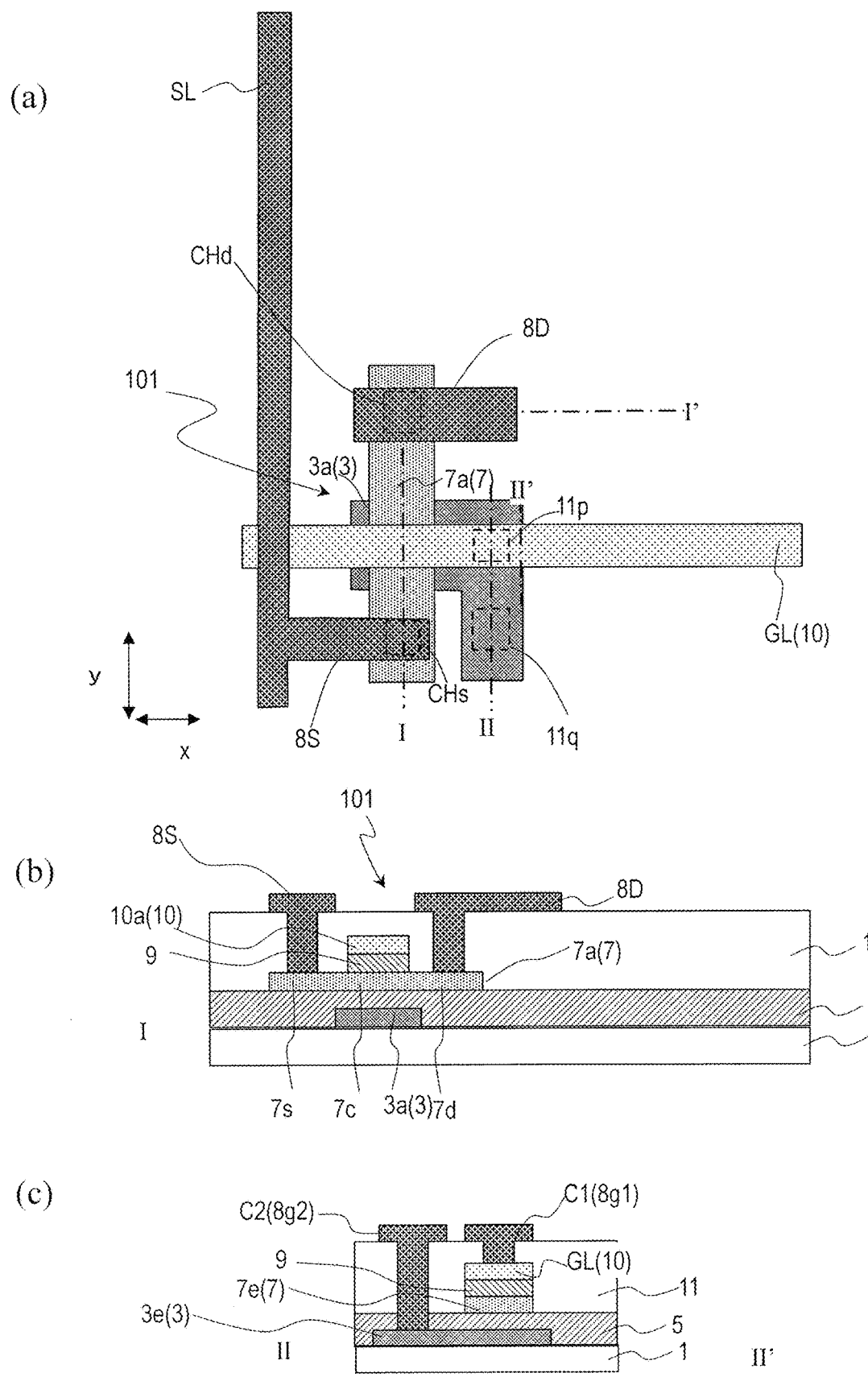
FIGS. 6B(a) to 6B(c) are a plan view and cross-sectional views illustrating a step of a method for manufacturing the active matrix substrate 1005.

Then, as shown in FIGS. 6B(a) to 6B(c), a source conductive film is formed and patterned so as to form the source electrode 8S, the drain electrode 8D, the first connecting portion C1 and the second connecting portion C2. The first connecting portion C1 is arranged so as to be in contact with the gate bus line GL in the opening 11p. The first connecting portion C2 is arranged so as to be in contact with the lower gate extension 3e in the opening 11q. These connecting portions C1 and C2 are arranged spaced apart from each other.

Figure 6C:
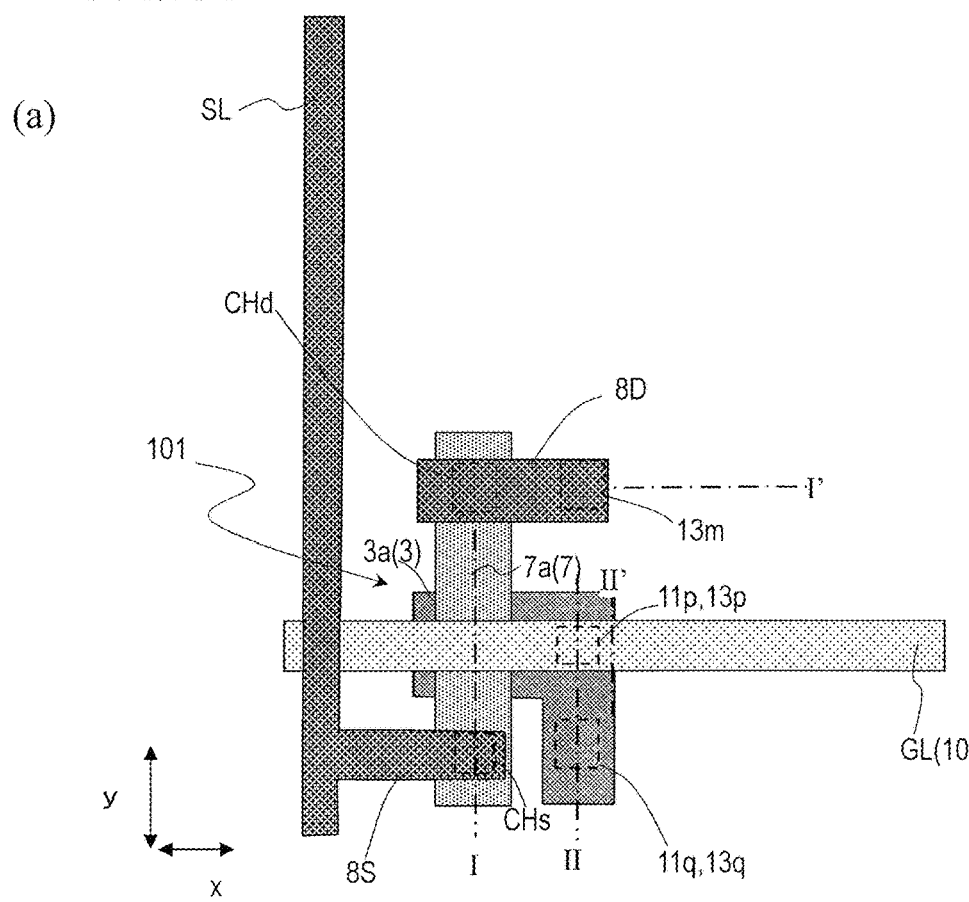
FIGS. 6C(a) to 6C(c) are a plan view and cross-sectional views illustrating a step of the method for manufacturing the active matrix substrate 1005.
Figure 6C:
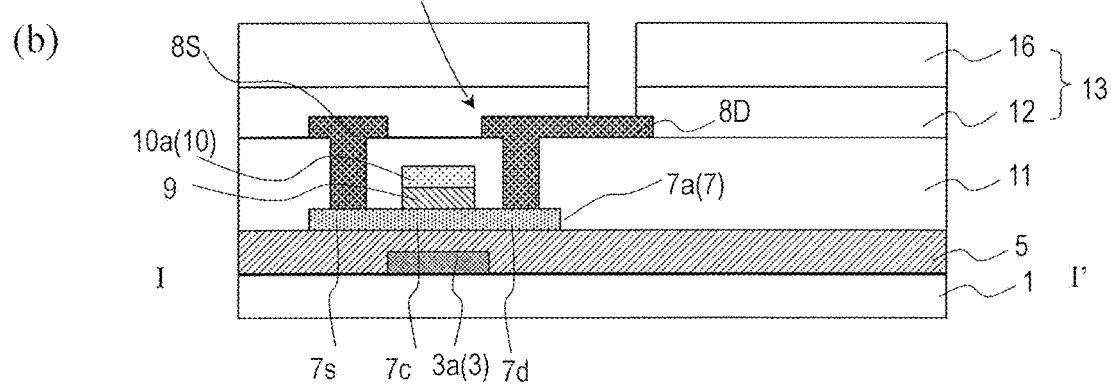
Figure 6C:
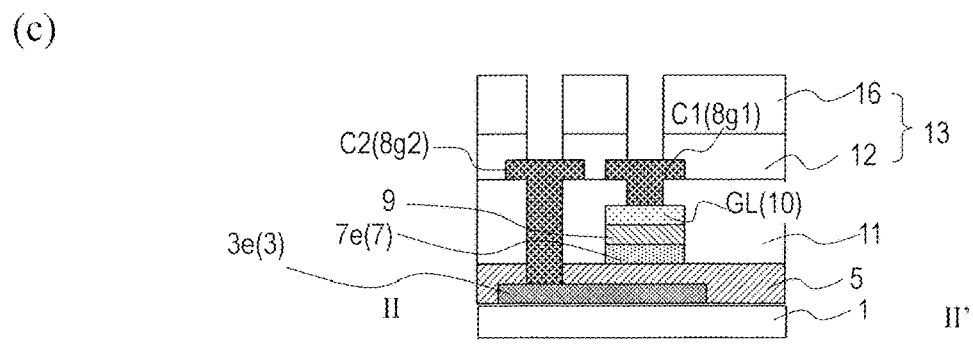

Next, as shown in FIGS. 6C(a) to 6C(c), the second inorganic insulating layer 12 and the organic insulating layer 16 are formed so as to cover the TFT 101. Then, the opening 13m that reaches the drain electrode 8D and openings 13p and 13q that are located in the gate contact portion formation region are formed in the second inorganic insulating layer 12 and the organic insulating layer 16. The opening 13p may be arranged so as to expose a portion of the first connecting portion C1. The opening 13p is arranged so as to at least partially overlap with the opening 11p of the first inorganic insulating layer 11, or so as not to overlap therewith, as seen from the normal direction to the substrate 1. Similarly, the opening 13q may be arranged so as to expose a portion of the second connecting portion C2. The opening 13q may be arranged so as to at least partially overlap with the opening 11q of the first inorganic insulating layer 11, or so as not to overlap therewith, as seen from the normal direction to the substrate 1.

Figure 6D:
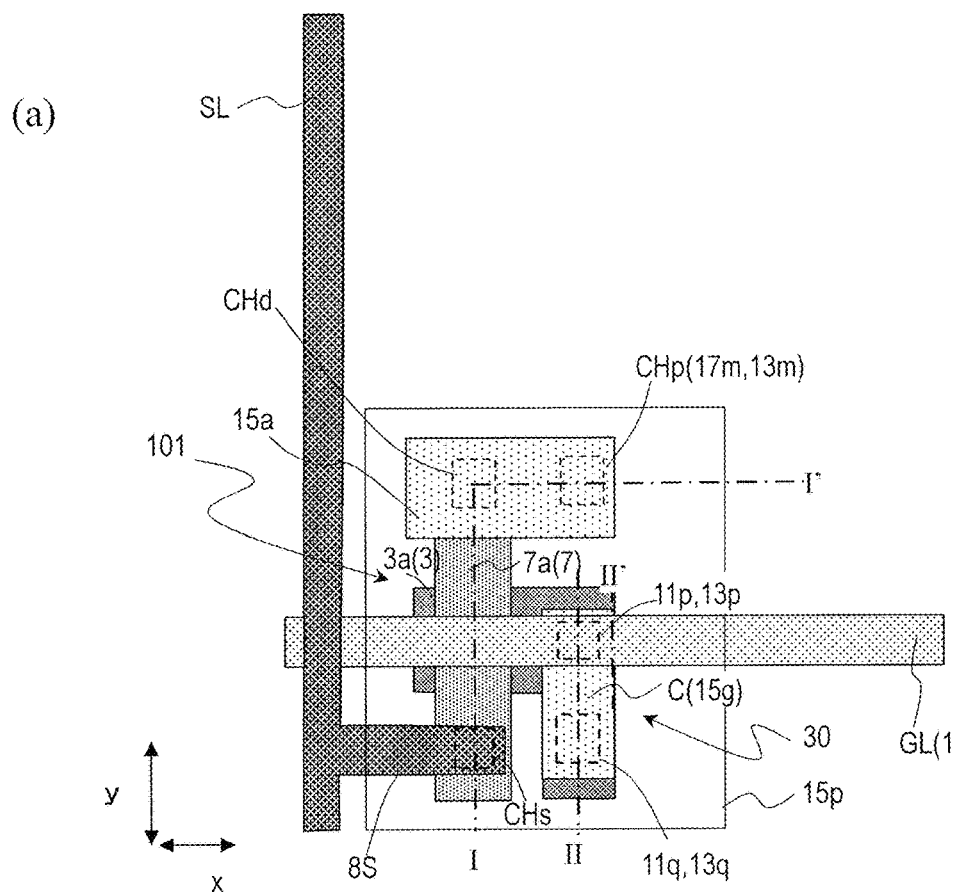
FIGS. 6D(a) to 6D(c) are a plan view and cross-sectional views illustrating a step of the method for manufacturing the active matrix substrate 1005.
Figure 6D:
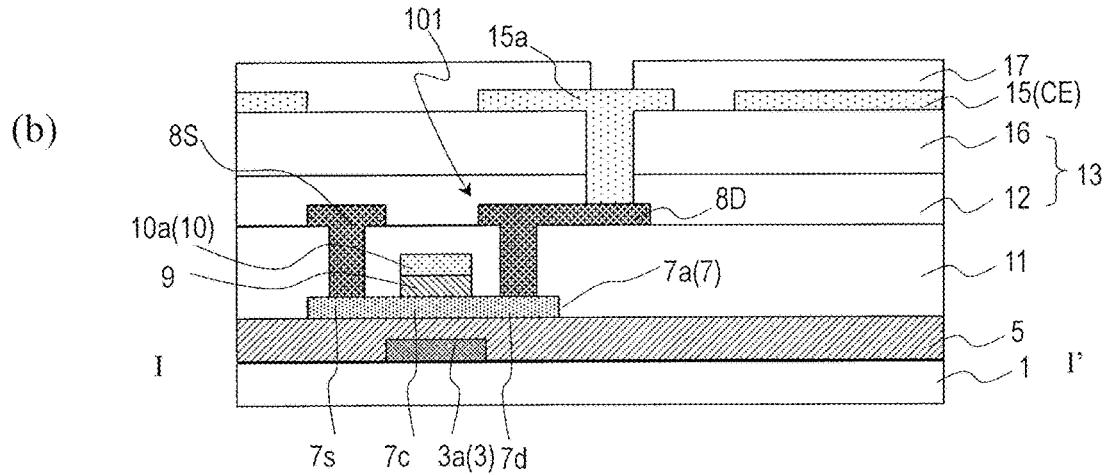
Figure 6D:
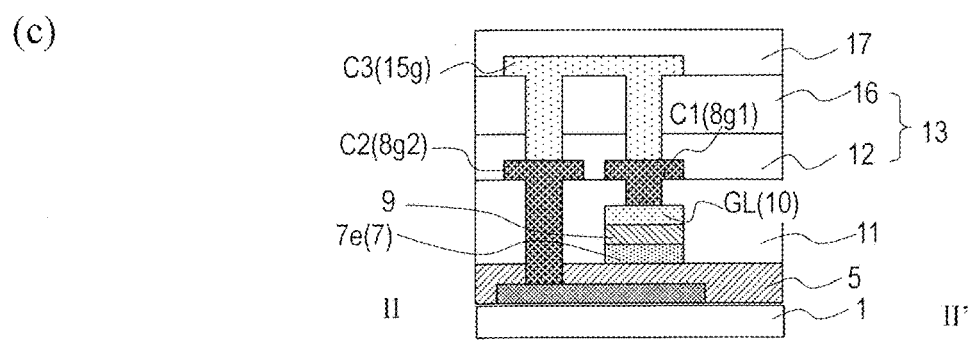

Then, as shown in FIGS. 6D(a) to 6D(c), a lower transparent conductive layer including the lower transparent electrode 15, the transparent connecting portion 15a and the third connecting portion C3 (the connecting portion 15g) is formed. The lower transparent conductive layer can be formed by forming a first transparent conductive film on the interlayer insulating layer 13 and in the opening 13m and in the contact holes CH1 and CH2, and then patterning the first transparent conductive film. The connecting portion 15g is arranged so as to be in contact with the first connecting portion C1 in the opening 13p and in contact with the second connecting portion C2 in the opening 13q. Next, the dielectric layer 17 is formed.

Then, an upper transparent conductive layer including the upper transparent electrode 19 is formed. Thus, the active matrix substrate 1005 shown in FIG. 6A is manufactured.

Also in this variation, as in Variation 1, since the third connecting portion C3 is transparent, the third connecting portion C3 can be arranged in any manner in the pixel region PIX, irrespective of the arrangement of the gate bus line GL or the lower gate electrode 3a. For example, as shown in FIGS. 7(a) to 7(c), the connecting portion 15g may include a portion that does not overlap with the gate bus line GL or with the lower gate extension 3e. The structure shown in FIG. 7 is similar to that of the active matrix substrate 1004 shown in FIG. 5 except that the second transparent conductive film is used as the third connecting portion C3.

Figure 7:
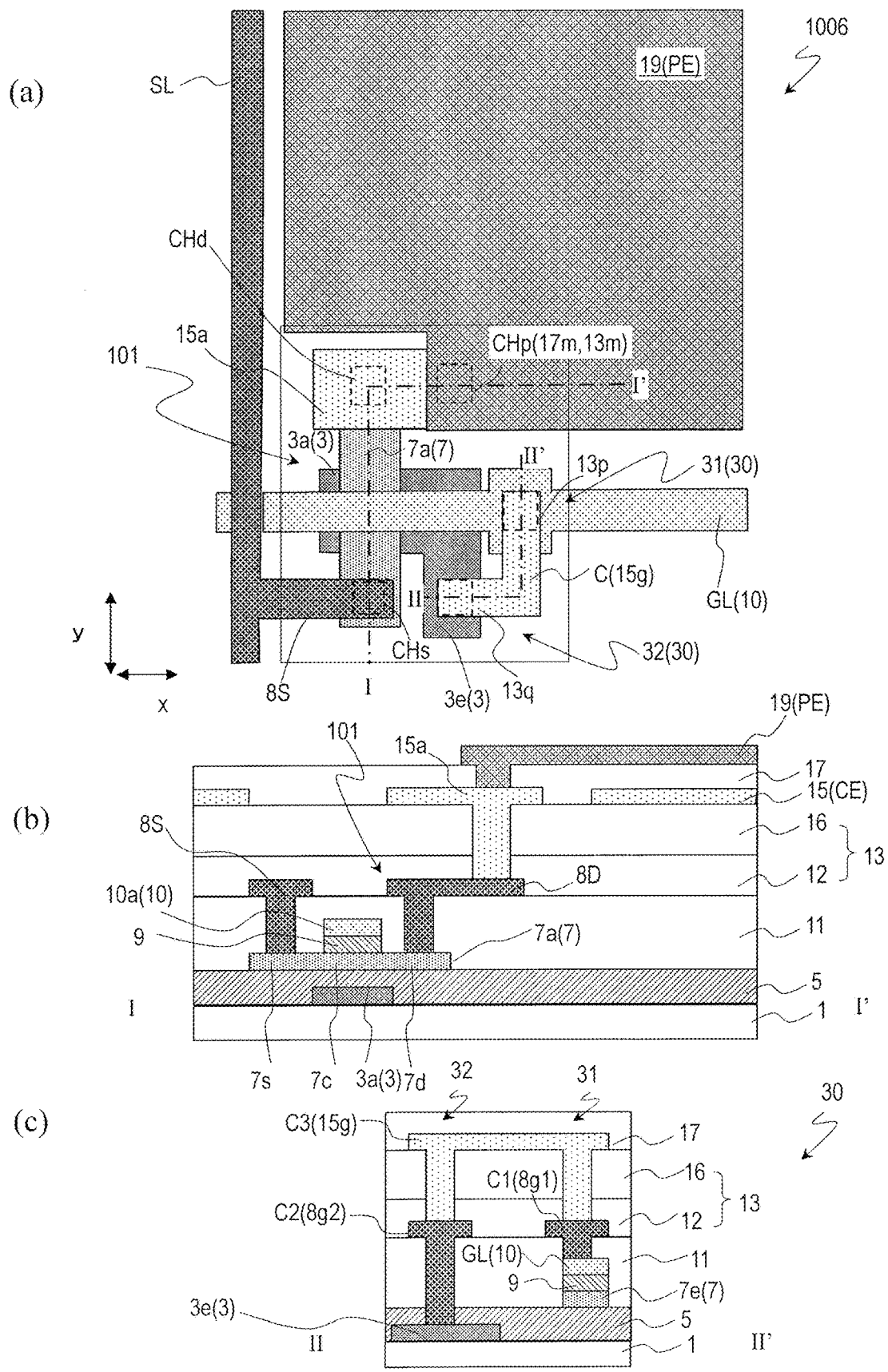
FIG. 7(*a*) is a plan view illustrating a pixel region PIX of an active matrix substrate 1006 of the second embodiment, and FIG. 7(*b*) and FIG. 7(*c*) are schematic cross-sectional views taken along line I-I' and line II-II', respectively.

The active matrix substrate 1006 shown in FIG. 7 can be manufactured by a method similar to that for the active matrix substrate 1005.

<Variation 3>

Variation 3 is different from the active matrix substrate 1002 shown in FIG. 3A in that in the gate contact portion 30, the gate connecting portion C is formed by using the same transparent conductive film as the upper transparent electrode 19 (the second transparent conductive film).

Figure 8A:
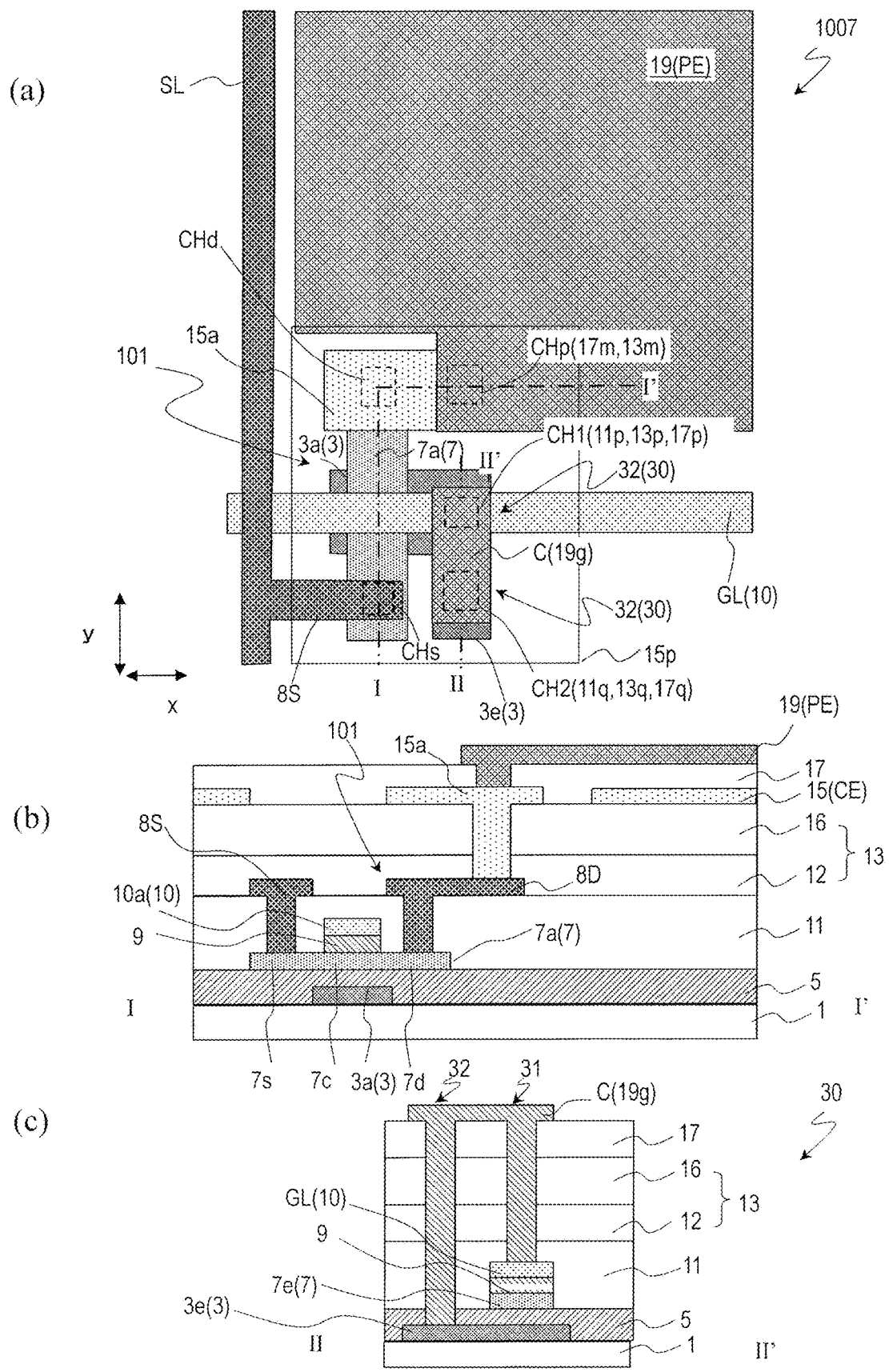
FIG. 8A(a) is a plan view illustrating a pixel region PIX of an active matrix substrate 1007 of the second embodiment, and FIG. 8A(b) and FIG. 8A(c) are schematic cross-sectional views taken along line I-I' and line II-II', respectively.

FIG. 8A(a) is a plan view illustrating a pixel region PIX of the active matrix substrate 1007 according to Variation 3 of the present embodiment. FIGS. 8A(b) and 8A(c) are schematic cross-sectional views taken along line I-I' and line II-II', respectively, of FIG. 8A(a).

In each pixel region PIX of Variation 3, the gate contact portion 30 includes, as the gate connecting portion C, a connecting portion 19g that is formed by using the same transparent conductive film as the upper transparent electrode 19. In the first portion 31, the connecting portion 19g is in contact with the upper gate layer 10 (herein, the gate bus line GL) in the contact hole CH1 formed in the first inorganic insulating layer 11, the interlayer insulating layer 13 and the dielectric layer 17. In the second portion 32, the connecting portion 19g is in contact with the lower gate extension 3e of the lower gate layer 3 in the contact hole CH2 formed in the lower insulating layer 5, the first inorganic insulating layer 11, the interlayer insulating layer 13 and the dielectric layer 17. Otherwise, the configuration may be similar to that of the active matrix substrate 1002.

The active matrix substrate 1007 of Variation 3 can be manufactured as follows.

Figure 8B:
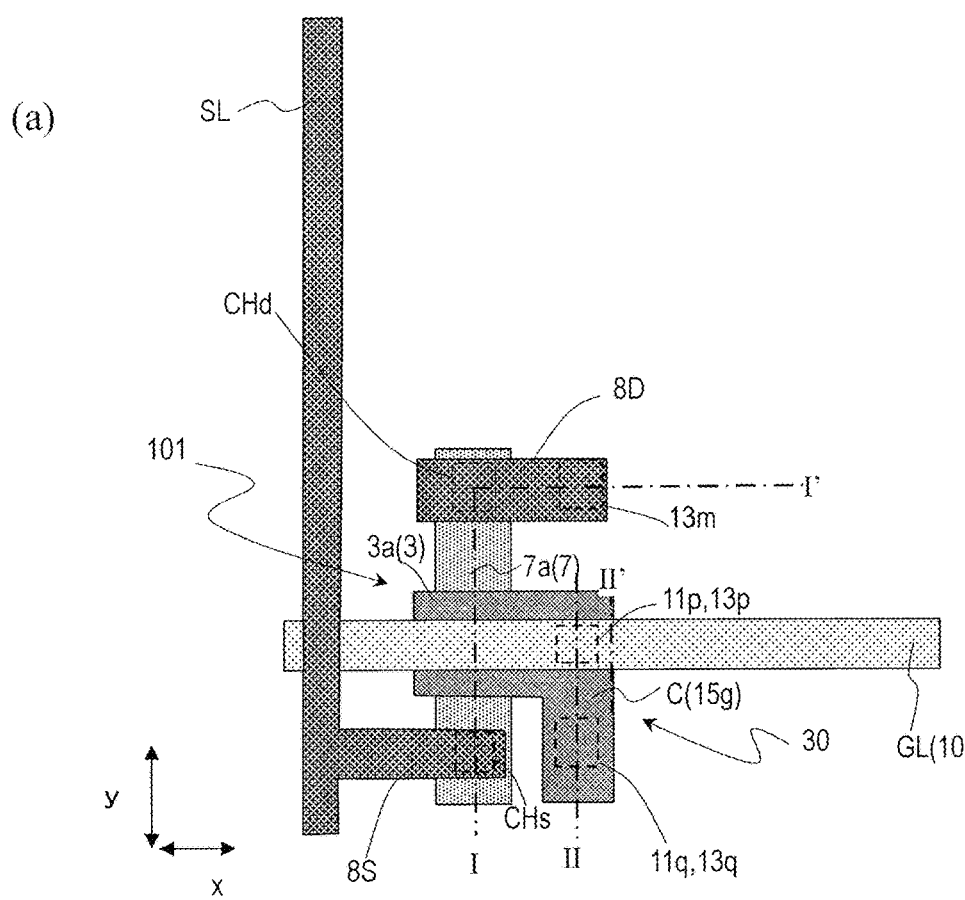
FIGS. 8B(a) to 8B(c) are a plan view and cross-sectional views illustrating a step of a method for manufacturing the active matrix substrate 1007.
Figure 8B:
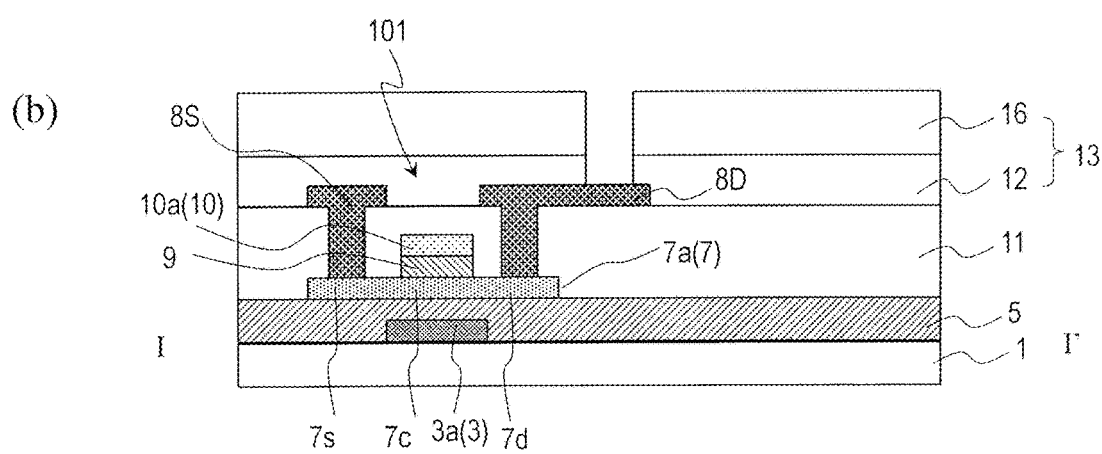
Figure 8B:
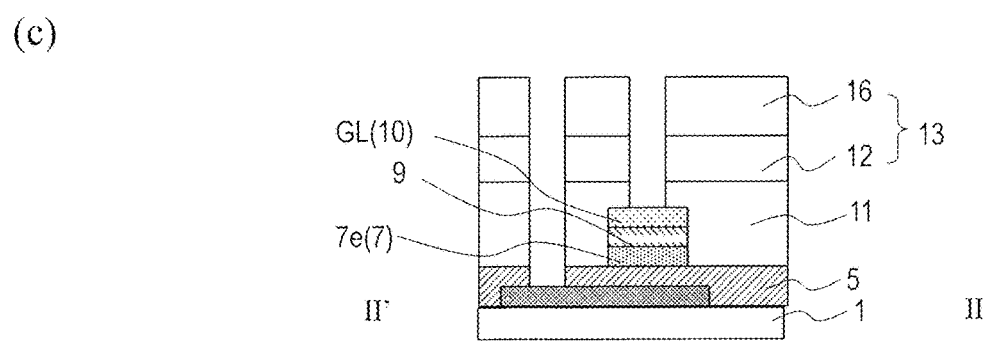

First, as shown in FIGS. 8B(a) to 8B(c), the lower gate electrode 3a, the lower insulating layer 5, the oxide semiconductor layer 7, the upper insulating layer 9, the upper gate electrode 10a, the gate bus line GL, the first inorganic insulating layer 11, the source electrode 8S and the drain electrode 8D are formed on the substrate 1 by a method similar to that for the active matrix substrate 1003 of Variation 1. Next, the interlayer insulating layer 13 is formed, and the opening 13m that reaches the drain electrode 8D and the openings 13p and 13q that reach gate contact portion formation region are formed therein.

Figure 8C:
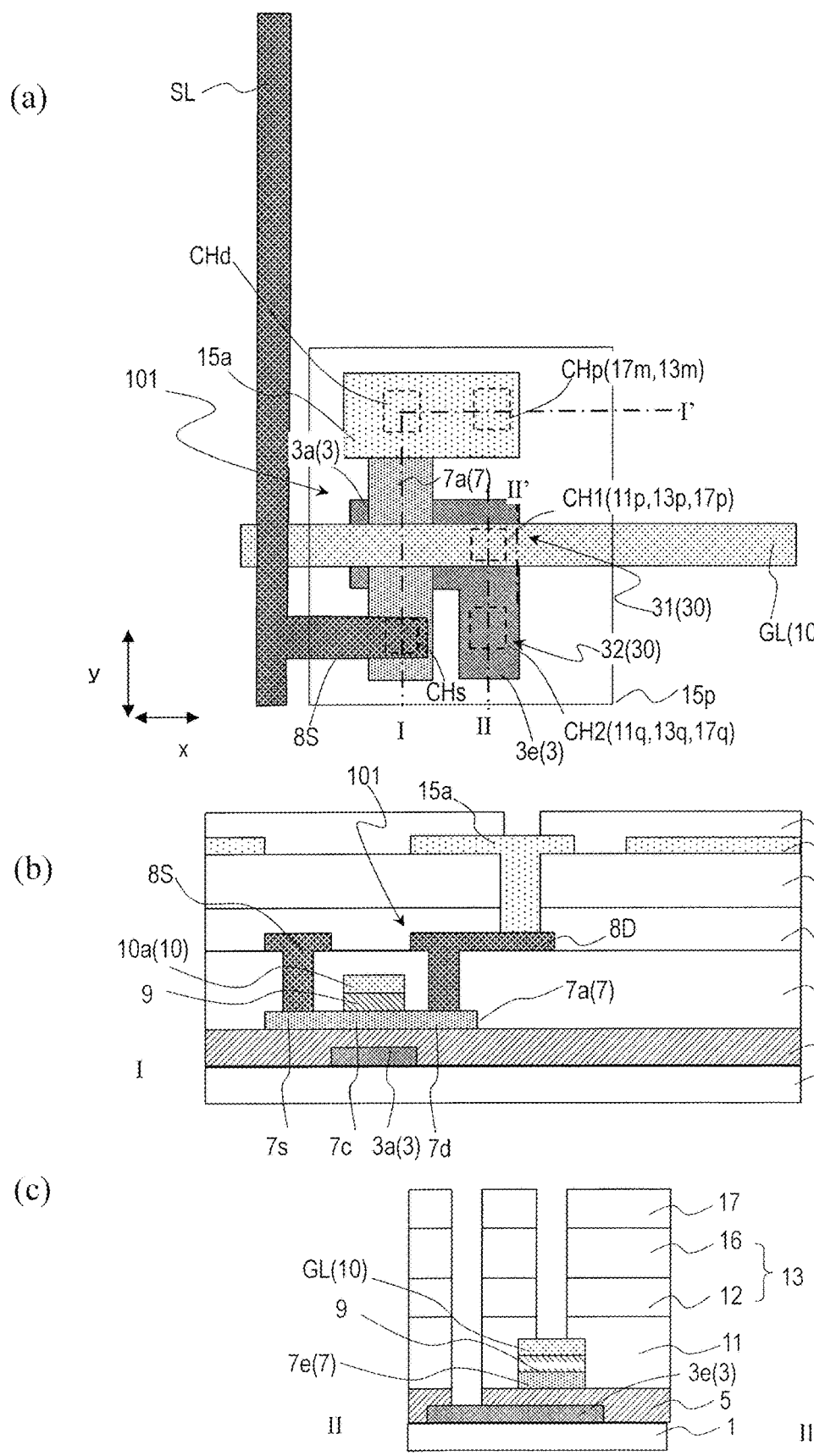
FIGS. 8C(a) to 8C(c) are a plan view and cross-sectional views illustrating a step of the method for manufacturing the active matrix substrate 1007.

Then, as shown in FIGS. 8C(a) to 8C(c), a first transparent conductive film is formed in the opening 13m and in the contact holes CH1 and CH2 and patterned so as to form a lower transparent conductive layer including the lower transparent electrode 15 and the transparent connecting portion 15a. The first transparent conductive film is removed from the gate contact portion formation region. Then, the dielectric layer 17 is formed. The openings 17m, 17p and 17q are formed in the dielectric layer 17. The opening 17p is arranged so as to at least partially overlap with the opening 13p. Therefore, the opening 11p, the opening 13p and the opening 17p together form the contact hole CH1, through which the gate bus line GL is exposed. Similarly, the opening 17q is arranged so as to at least partially overlap with the opening 13q. Therefore, the opening 11q, the opening 13q and the opening 17q together form the contact hole CH2, through which the lower gate extension 3e is exposed.

Then, an upper transparent conductive layer including the upper transparent electrode 19 and the connecting portion 19g (the gate connecting portion C) is formed. The connecting portion 19g is arranged so as to be in contact with the gate bus line GL in the contact hole CH1 and in contact with the lower gate extension 3e in the contact hole CH2. Thus, the active matrix substrate 1007 shown in FIG. 8A is manufactured.

In Variation 3, since the connecting portion 19g, which is the gate connecting portion C, is transparent, the pixel aperture ratio is not lowered by the connecting portion 19g. Thus, the connecting portion 19g can be arranged in any manner in the pixel region PIX, irrespective of the arrangement of the gate bus line GL or the lower gate electrode 3a. For example, as shown in FIGS. 9(a) to 9(c), the end portion of the connecting portion 19g that is on the first portion 31 side may be located on the gate bus line GL, and the end portion thereof that is on the second portion 32 side may be located on the lower gate extension 3e, wherein the portion that is located between these end portions may extend so as not to overlap with the gate bus line GL or with the lower gate extension 3e.

The first portion 31 may be arranged over the gate bus line GL so as not to overlap with the active region 7a or with the lower gate extension 3e. Then, it is possible to further increase the interval between a portion of the connecting portion 15g that is located in the contact hole CH2 and the extension region 7e, and it is therefore possible to more effectively prevent electrical connection therebetween.

Figure 9:
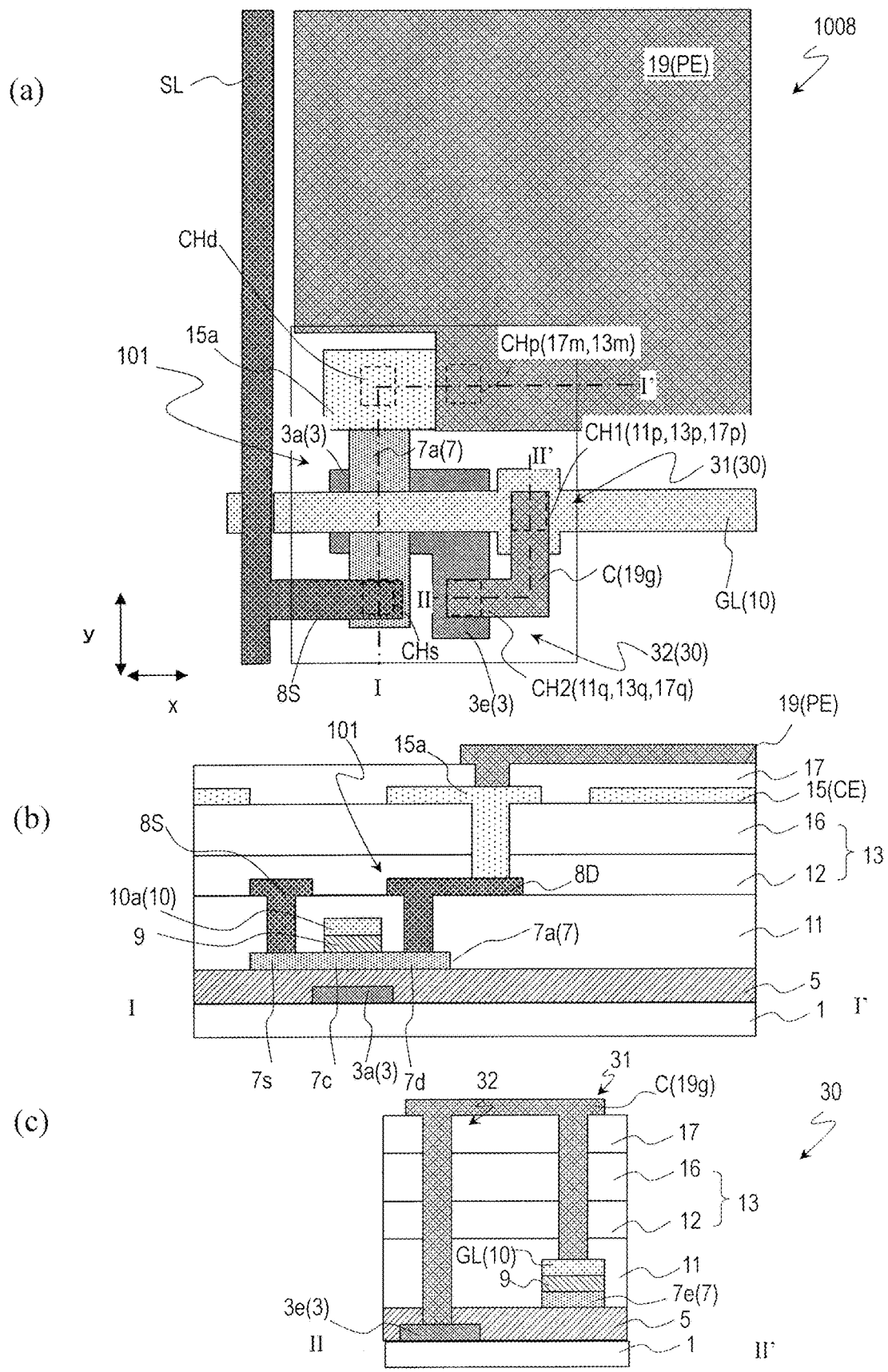
FIG. 9(*a*) is a plan view illustrating a pixel region PIX of an active matrix substrate 1008 of the second embodiment, and FIG. 9(*b*) and FIG. 9(*c*) are schematic cross-sectional views taken along line I-I' and line II-II', respectively.

The active matrix substrate 1008 shown in FIG. 9 can be manufactured by a method similar to that for the active matrix substrate 1007.

<Variation 4>

Variation 4 is different from Variation 2 in that the third connecting portion C3 is formed by using the same transparent conductive film as the upper transparent electrode 19.

Figure 10A:
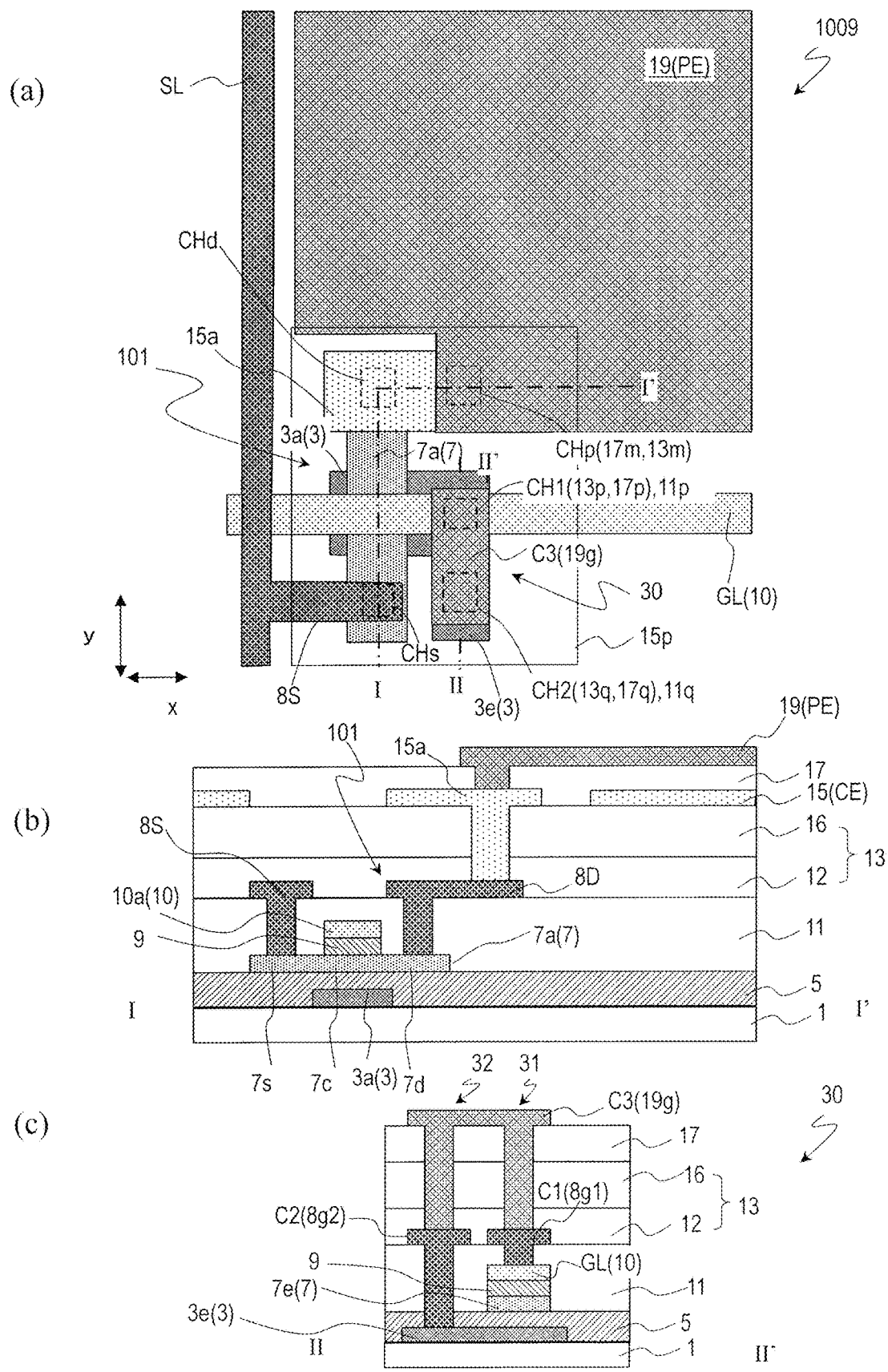
FIG. 10A(a) is a plan view illustrating a pixel region PIX of an active matrix substrate 1009 of the second embodiment, and FIG. 10A(b) and FIG. 10A(c) are schematic cross-sectional views taken along line I-I' and line II-II', respectively.

FIG. 10A(a) is a plan view illustrating a pixel region PIX of the active matrix substrate 1009 according to Variation 4 of the present embodiment. FIGS. 10A(b) and 10A(c) are schematic cross-sectional views taken along line I-I' and line II-II', respectively, of FIG. 10A(a).

In Variation 4, the gate connecting portion C in the gate contact portion 30 includes, as in Variation 2, the first and second connecting portions C1 and C2 (the connecting portions 8g1 and 8g2) formed by using the same conductive film as the source bus line SL (the source conductive film), and the third connecting portion C3 in contact with these connecting portions C1 and C2. Note however that the connecting portion 19g, which is the third connecting portion C3, is in contact with the first connecting portion C1 in the contact hole CH1 formed in the interlayer insulating layer 13 and the dielectric layer 17 in the first portion 31, and is in contact with the second connecting portion C2 in the contact hole CH2 formed in the interlayer insulating layer 13 and the dielectric layer 17 in the second portion 32. Otherwise, the configuration may be similar to that of the active matrix substrate 1006.

In Variation 4, as in Variation 2, the connecting portions C1, C2 and C3 are each formed in a relatively shallow opening. This gives advantages, such as an electrical connection can be ensured more reliably and the sizes of the openings can be made even smaller.

The active matrix substrate 1009 of Variation 4 can be manufactured as follows.

Figure 10B:
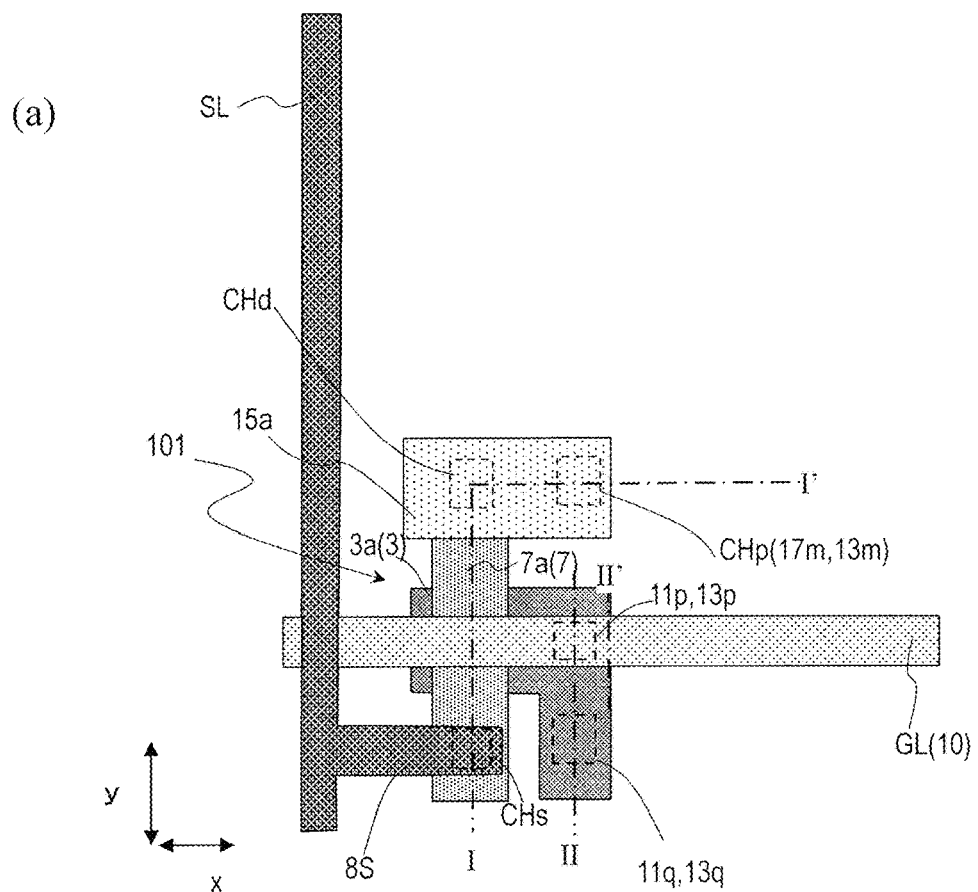
FIGS. 10B(a) to 10B(c) are a plan view and cross-sectional views illustrating a step of a method for manufacturing the active matrix substrate 1009.
Figure 10B:
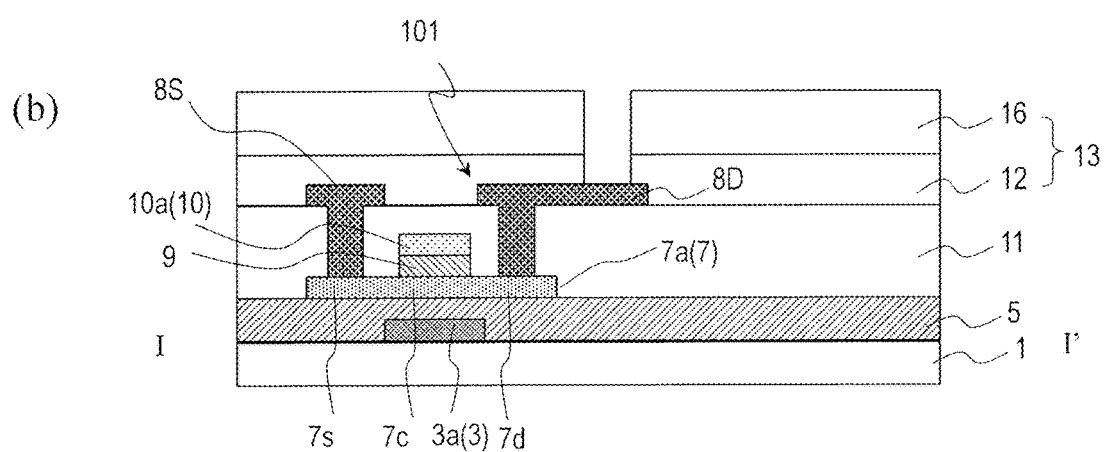
Figure 10B:
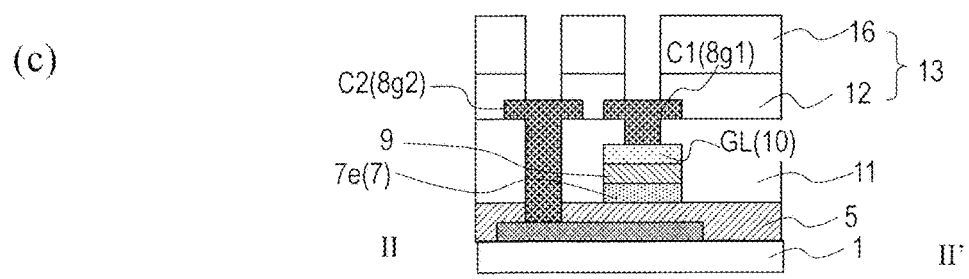

First, as shown in FIGS. 10B(a) to 10B(c), the lower gate electrode 3a, the lower insulating layer 5, the oxide semiconductor layer 7, the upper insulating layer 9, the upper gate electrode 10a, the gate bus line GL, the first inorganic insulating layer 11, the connecting portions 8g1 and 8g2, the source electrode 8S and the drain electrode 8D are formed on the substrate 1 by a method similar to the active matrix substrate 1006 of Variation 2. Next, the interlayer insulating layer 13 is formed, and the opening 13m that reaches the drain electrode 8D and the openings 13p and 13q that reach gate contact portion formation region are formed therein. The openings 13p and 13q may be arranged so as to respectively expose a portion of the gate bus line GL and a portion of the lower gate extension 3e, as seen from the normal direction to the substrate 1.

Figure 10C:
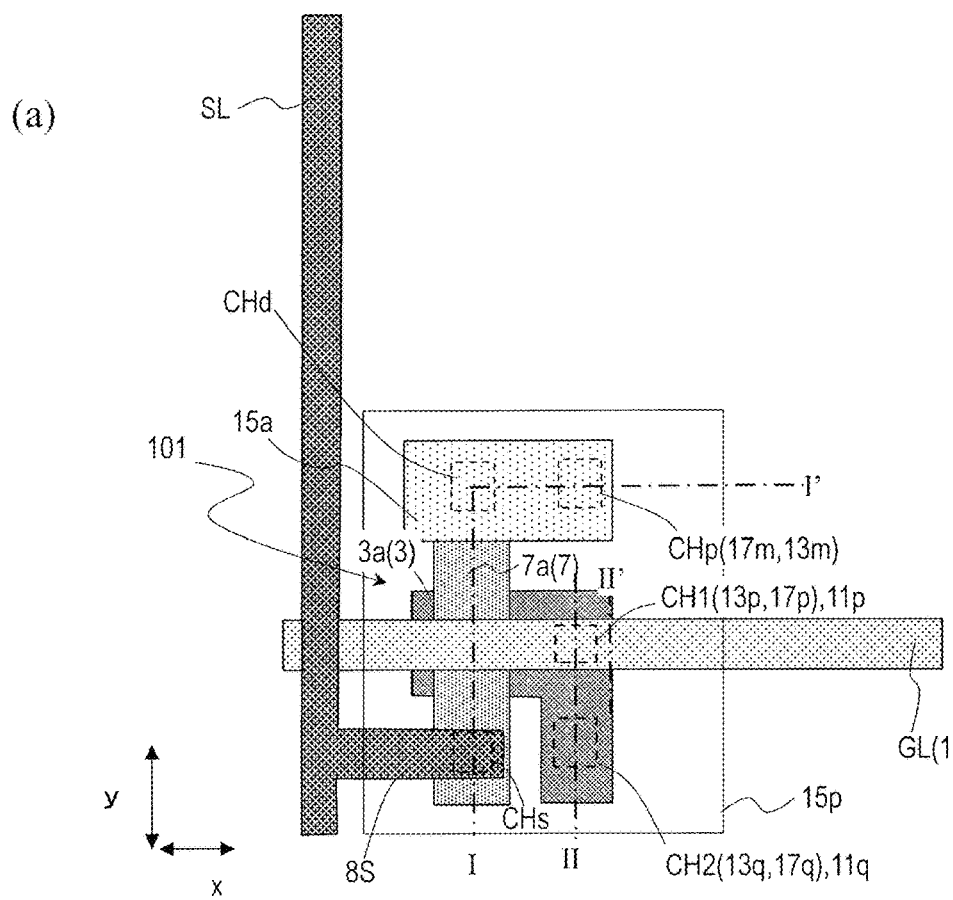
FIGS. 10C(a) to 10C(c) are a plan view and cross-sectional views illustrating a step of the method for manufacturing the active matrix substrate 1009.
Figure 10C:
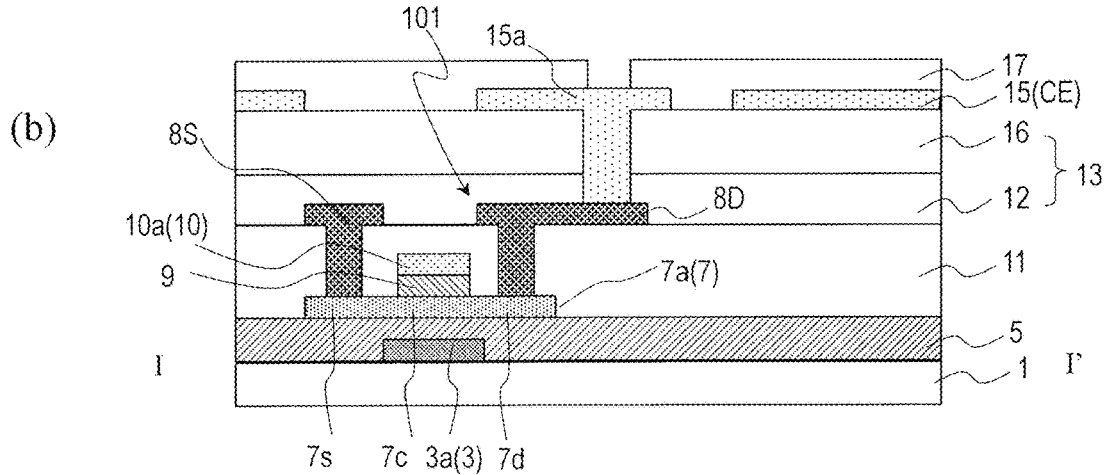
Figure 10C:
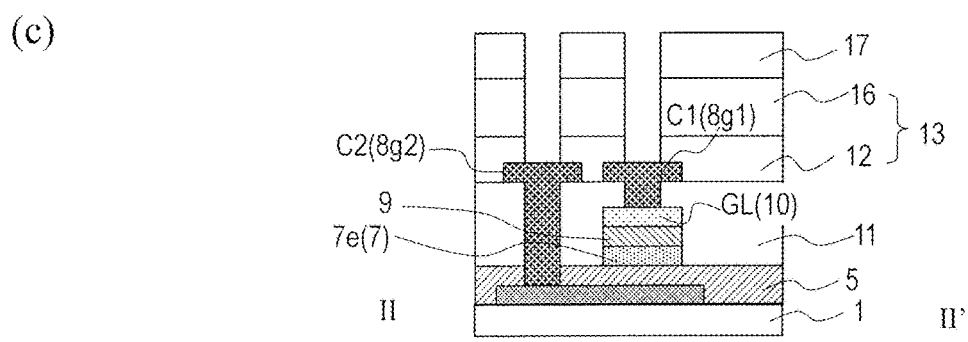

Then, as shown in FIGS. 10C(a) to 10C(c), the first transparent conductive film is formed and the first transparent conductive film is patterned so as to form the lower transparent conductive layer including the lower transparent electrode 15 and the transparent connecting portion 15a. The first transparent conductive film is removed from the gate connecting portion formation region.

Next, the dielectric layer 17 is formed. The openings 17m, 17p and 17q are formed in the dielectric layer 17. The opening 17p is arranged so as to at least partially overlap with the opening 13p. Therefore, the opening 13p and the opening 17p together form the contact hole CH1, through which the gate bus line GL is exposed. Similarly, the opening 17q is arranged so as to at least partially overlap with the opening 13q. Therefore, the opening 13q and the opening 17q together form the contact hole CH2, through which the lower gate extension 3e is exposed.

Then, an upper transparent conductive layer including the upper transparent electrode 19 and the connecting portion 19g (the third connecting portion C3) is formed. The connecting portion 19g is arranged so as to be in contact with the first connecting portion C1 in the contact hole CH1 and in contact with the second connecting portion C2 in the contact hole CH2. Thus, the active matrix substrate 1009 shown in FIG. 10A is manufactured.

Figure 11A:
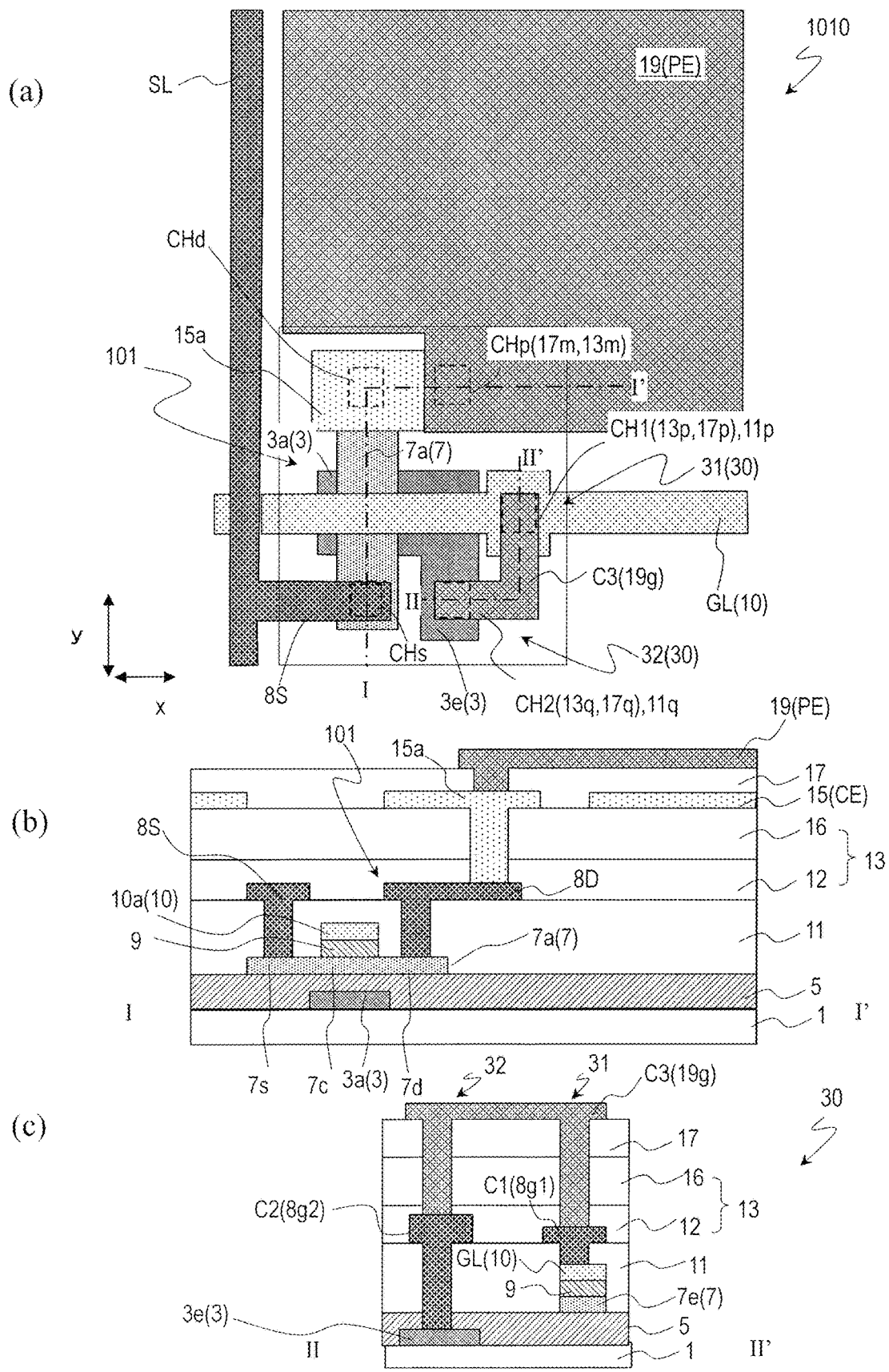
FIG. 11A(a) is a plan view illustrating a pixel region PIX of an active matrix substrate 1010 of the second embodiment, and FIG. 11A(b) and FIG. 11A(c) are schematic cross-sectional views taken along line I-I' and line II-II', respectively.

Also in this variation, as in Variation 2, since the third connecting portion C3 is transparent, the third connecting portion C3 can be arranged in any manner in the pixel region PIX, irrespective of the arrangement of the gate bus line GL or the lower gate electrode 3a. For example, as shown in FIGS. 11A(a) to 11A(c), the connecting portion 15g may include a portion that does not overlap with the gate bus line GL or with the lower gate extension 3e. The structure shown in FIG. 11A is similar to that of the active matrix substrate 1008 shown in FIG. 9 except that the second transparent conductive film is used as the third connecting portion C3.

The active matrix substrate 1010 shown in FIG. 11A can be manufactured by a method similar to that for the active matrix substrate 1009.

Although the gate connecting portion C is formed by using the source conductive film and the second transparent conductive film in the example shown in FIG. 10A and FIG. 11A, the structure of the gate connecting portion C is not limited to these examples. The gate connecting portion C can be formed by using two or more of the source conductive film, the first transparent conductive film and the second transparent conductive film.

Figure 11B:
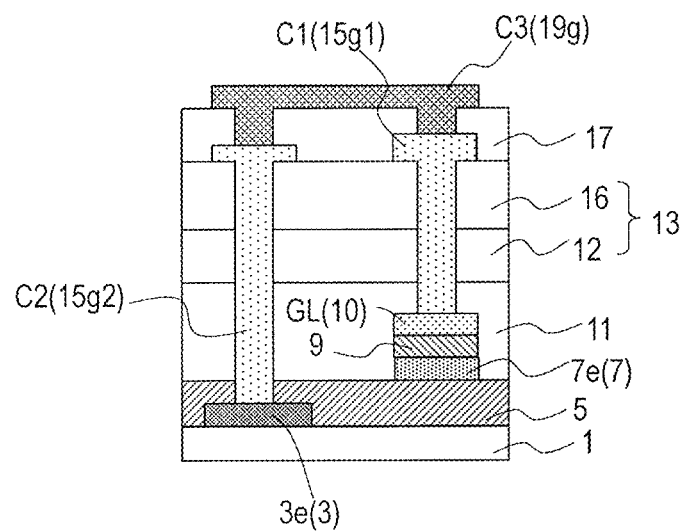
FIG. 11B is a cross-sectional view illustrating another gate contact portion of the second embodiment.
Figure 11C:
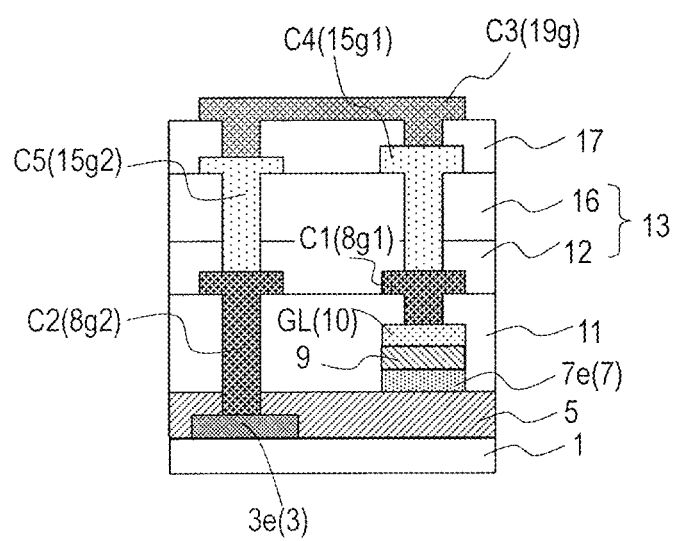
FIG. 11C is a cross-sectional view illustrating another gate contact portion of the second embodiment.

FIG. 11B and FIG. 11C are cross-sectional views each showing another example of the gate contact portion.

In the example shown in FIG. 11B, the gate connecting portion C is formed by using the first transparent conductive film and the second transparent conductive film. The gate connecting portion C includes the first and second connecting portions C1 and C2 (connecting portions 15g1 and 15g2) formed by using the first transparent conductive film, and the third connecting portion C3 (the connecting portion 19g) formed by using the second transparent conductive film.

In the example shown in FIG. 11C, the gate connecting portion C is formed by using the source conductive film, the first transparent conductive film and the second transparent conductive film. The gate connecting portion C includes the first and second connecting portions C1 and C2 (the connecting portions 8g1 and 8g2) formed by using the source conductive film, the fourth and fifth C4 and C5 (the connecting portions 15g1 and 15g2) formed by using the first transparent conductive film, and the third connecting portion C3 (the connecting portion 19g) formed by using the second transparent conductive film. The fourth connecting portion C4 and the fifth connecting portion C5 are arranged spaced apart from each other. The fourth connecting portion C4 and the fifth connecting portion C5 are in contact with the first connecting portion C1 and the second connecting portion C2, respectively, in openings formed in the interlayer insulating layer 13. The third connecting portion C3 is in contact with the fourth connecting portion C4 in the opening formed in the dielectric layer 17 in the first portion 31, and in contact with the fifth connecting portion C5 in the opening formed in the dielectric layer 17 in the second portion 32.

<Variation 5>

Although the embodiments and variations described above are directed to examples where the upper gate electrode 10a is formed integral with the gate bus line GL, the lower gate electrode 3a may be formed integral with the gate bus line GL and the upper gate electrode 10a may be formed in an island-like shape for each pixel.

Figure 12A:
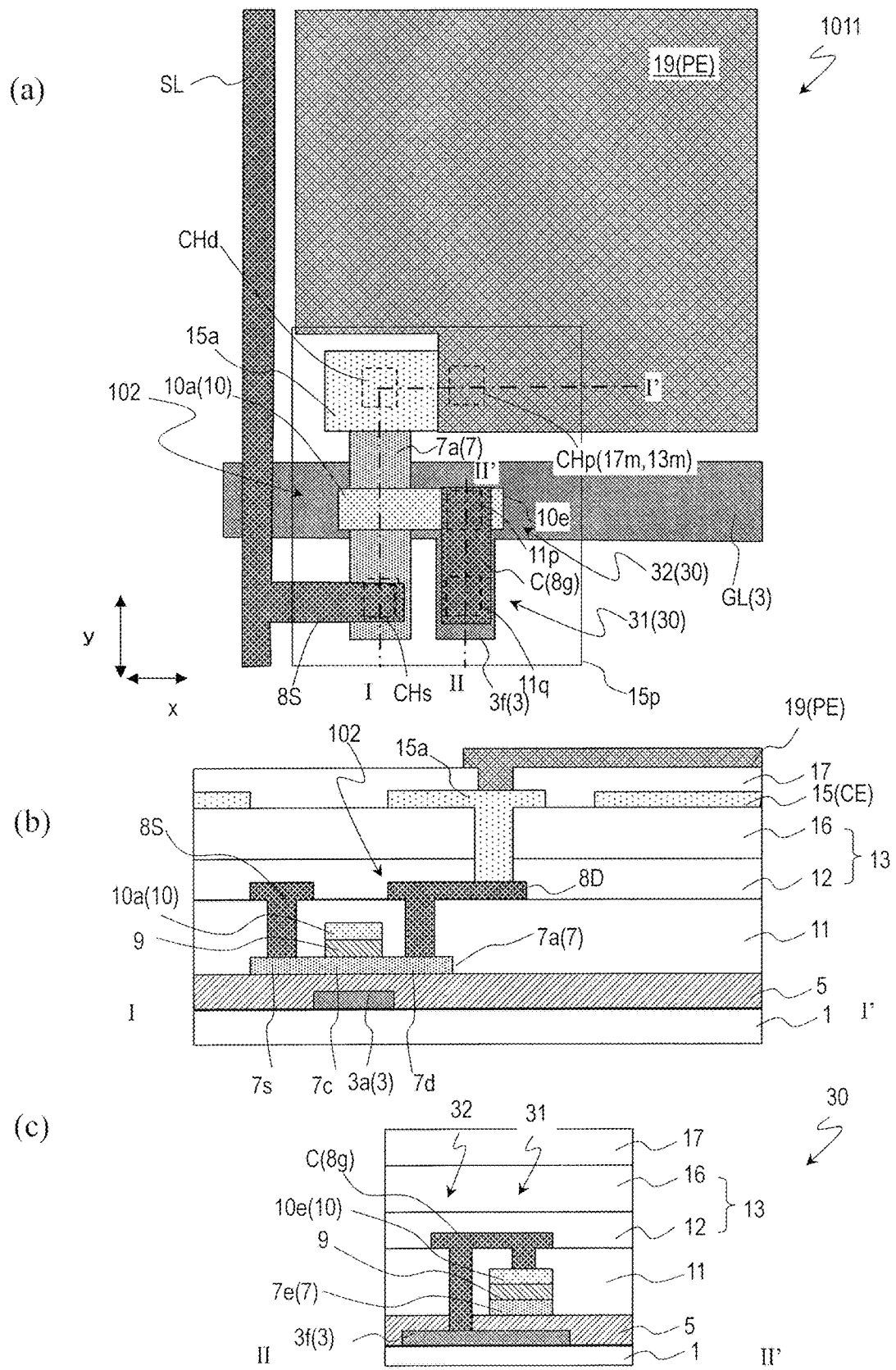
FIG. 12A(a) is a plan view illustrating a pixel region PIX of an active matrix substrate 1011 of the second embodiment, and FIG. 12A(b) and FIG. 12A(c) are schematic cross-sectional views taken along line I-I' and line II-II', respectively.

FIG. 12A(a) is a plan view illustrating a pixel region PIX of the active matrix substrate 1011 according to Variation 5 of the present embodiment. FIGS. 12A(b) and 12A(c) are schematic cross-sectional views taken along line I-I' and line II-II', respectively, of FIG. 12A(a).

Each pixel region PIX of the active matrix substrate 1011 includes a TFT 102 having the double gate structure, and the gate contact portion 30.

The lower gate layer 3 of the TFT 102 includes the lower gate electrode 3a of the TFT 102, and the gate bus line GL formed integral with the lower gate electrode 3a. The lower gate electrode 3a may be a portion of the gate bus line GL.

The upper gate layer 10 is formed in an island-like shape in the pixel region PIX. The upper gate layer 10 includes the upper gate electrode 10a, and an upper gate extension 10e that extends from the upper gate electrode 10a (from the TFT formation region) to the first portion 31 of the gate contact portion 30.

The oxide semiconductor layer 7 includes the active region 7a and the extension region 7e. The extension region 7e extends from the active region 7a in a direction different from the channel length direction of the TFT 102, as seen from the normal direction to the substrate 1. The extension region 7e includes a portion that is arranged on the substrate 1 side of the upper gate extension 10e with the upper insulating layer 9 interposed therebetween, and that extends so as to overlap with the upper gate extension 10e as seen from the normal direction to the substrate 1.

In the gate contact portion 30, the lower gate layer 3 (herein, the gate bus line GL) and the upper gate extension 10e of the upper gate layer 10 are electrically connected to each other via the gate connecting portion C, which is formed from a conductive film that is in a layer above the upper gate layer 10. In this example, the gate connecting portion C is the connecting portion 8g formed from the source conductive film. Also in this variation, in the gate contact portion 30, the extension region 7e of the oxide semiconductor layer 7 is located on the substrate 1 side of the upper gate extension 10e with the upper insulating layer 9 interposed therebetween.

The gate contact portion 30 may be arranged in the vicinity of the TFT 102 while being spaced apart from the active region 7a, as seen from the normal direction to the substrate 1. For example, the gate contact portion 30 includes the first portion 31 that connects together the gate connecting portion C and the upper gate layer 10, and the second portion 32 that connects together the gate connecting portion C and the lower gate layer 3.

The lower gate layer 3 may include a protruding portion 3f that protrudes from the gate bus line GL to the second portion 32 of the gate contact portion 30, as seen from the normal direction to the substrate 1. The protruding portion 3f may extend in the y direction. The protruding portion 3f may extend from the first portion 31 to the second portion 32, as seen from the normal direction to the substrate 1. In such a case, the upper gate extension 10e may extend from the TFT formation region to the first portion 31 so as to overlap with the lower gate layer 3. The gate connecting portion C may extend from the first portion 31 to the second portion 32 so as to overlap with the lower gate layer 3. Thus, it is possible to suppress the decrease in the pixel aperture ratio.

The gate connecting portion C (the connecting portion 8g) extends so as to connect together the first portion 31 and the second portion 32. The connecting portion 8g is in contact with the upper gate extension 10e in the opening 11p formed in the first inorganic insulating layer 11 in the first portion 31, and in contact with the lower gate layer 3 (herein, the protruding portion 3f) in the opening 11q formed in the lower insulating layer 5 and the first inorganic insulating layer 11 in the second portion 32.

Also in this variation, the upper insulating layer 9 and the extension region 7e are located between the upper gate layer 10 and the lower insulating layer 5. As will be described later, also in this variation, the oxide semiconductor layer 7 may be patterned after patterning the upper gate electrode 10a and the upper insulating layer 9 using the same mask.

<Method for Manufacturing Active Matrix Substrate 1011>

FIG. 12B to FIG. 12H are schematic step-by-step diagrams illustrating a method for manufacturing the active matrix substrate 1011. In each figure, (a) is a plan view illustrating a pixel region PIX. In each figure, (b) and (c) are schematic cross-sectional views taken along line I-I' and line II-II', respectively, of FIG. 12A(a).

Figure 12B:
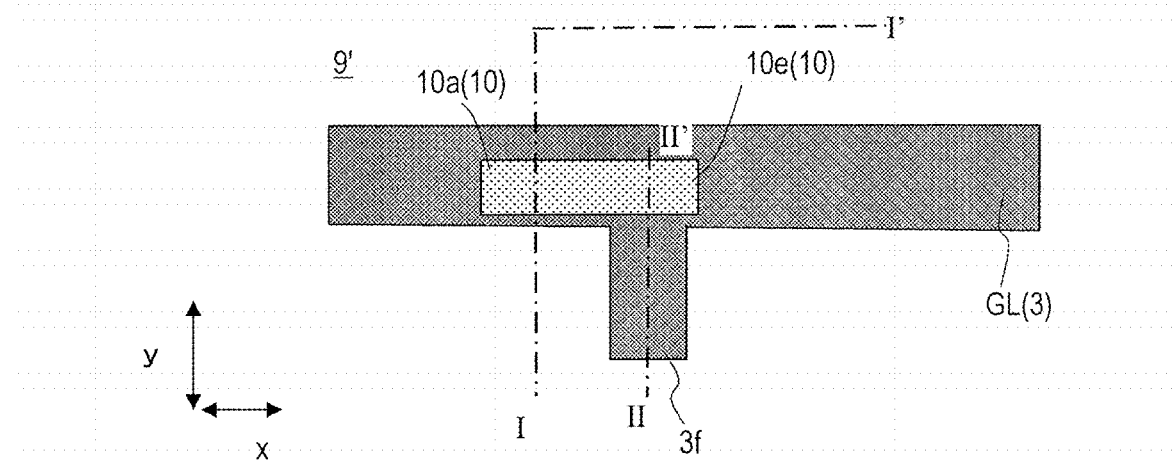
FIGS. 12B(a) to 12B(c) are a plan view and cross-sectional views illustrating a step of a method for manufacturing the active matrix substrate 1011.
Figure 12B:
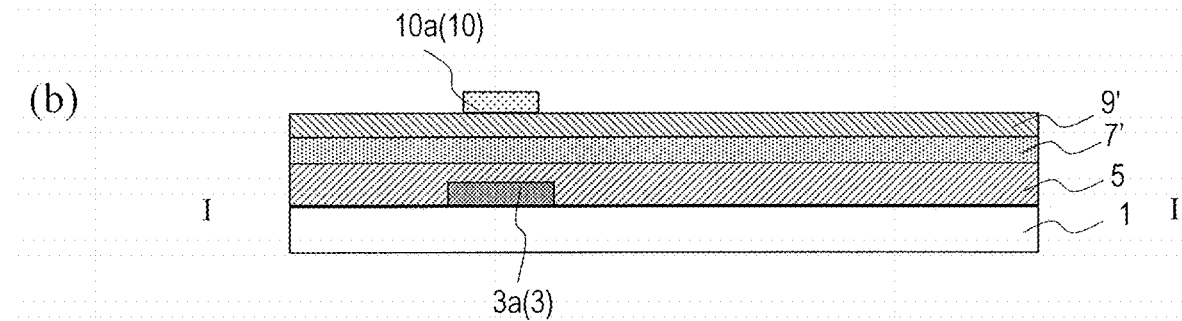
Figure 12B:
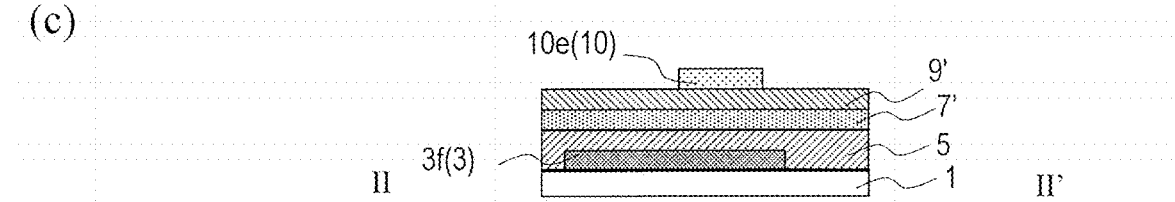

First, as shown in FIGS. 12B(a) to 12B(c), in each pixel region PIX, a lower gate conductive film is formed on the substrate 1 and patterned so as to form the lower gate layer 3 including the gate bus line GL and the lower gate electrode 3a. Herein, the lower gate electrode 3a is a part of the gate bus line GL. The lower gate layer 3 includes the protruding portion 3f that protrudes in the y direction from the edge of the gate bus line GL, as seen from the normal direction to the substrate 1.

Next, the lower insulating layer 5, the oxide semiconductor film 7', the upper insulating layer 9 and an upper gate conductive film (not shown) are formed in this order on the substrate 1 with the lower gate layer 3 formed thereon. Then, the upper gate conductive film is patterned by using the first resist mask (not shown), thereby obtaining the upper gate layer 10. In this example, the upper gate layer 10 has an island-shaped pattern including the upper gate electrode 10a located in the TFT formation region, and the upper gate extension 10e extending from the TFT formation region to the gate connecting portion formation region. As shown in the figure, the upper gate layer 10 may be arranged over a portion of the gate bus line GL, as seen from the normal direction to the substrate 1.

Figure 12C:
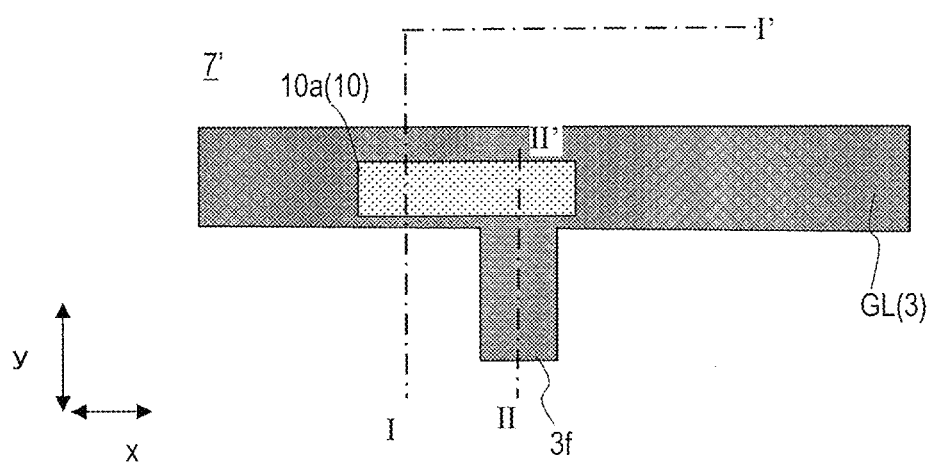
FIGS. 12C(a) to 12C(c) are a plan view and cross-sectional views illustrating a step of the method for manufacturing the active matrix substrate 1011.
Figure 12C:
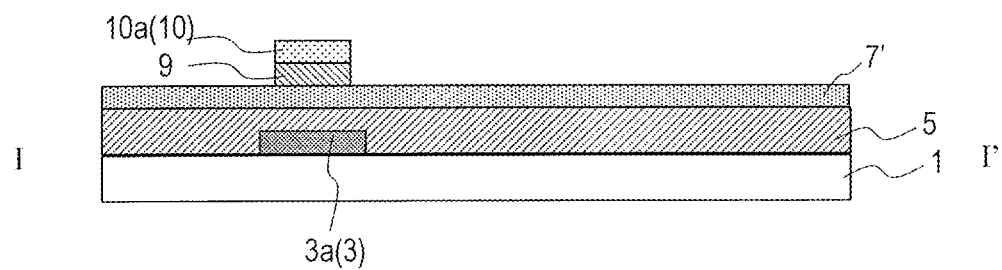
Figure 12C:
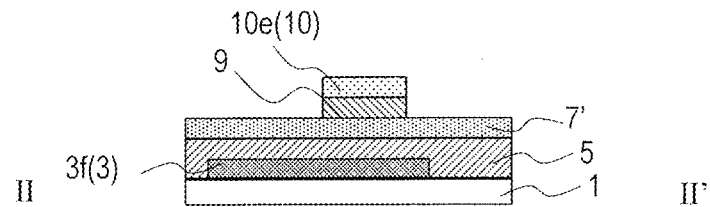

Next, as shown in FIGS. 12C(a) to 12C(c), the upper insulating layer 9 is patterned by using the first resist mask. As in the embodiments described above, in this patterning step, since the lower insulating layer 5 is covered by the oxide semiconductor film 7', and the oxide semiconductor film 7' serves as an etch stop, it is possible to suppress the etching of the surface of the lower insulating layer 5. Then, the first resist mask is removed.

Figure 12D:
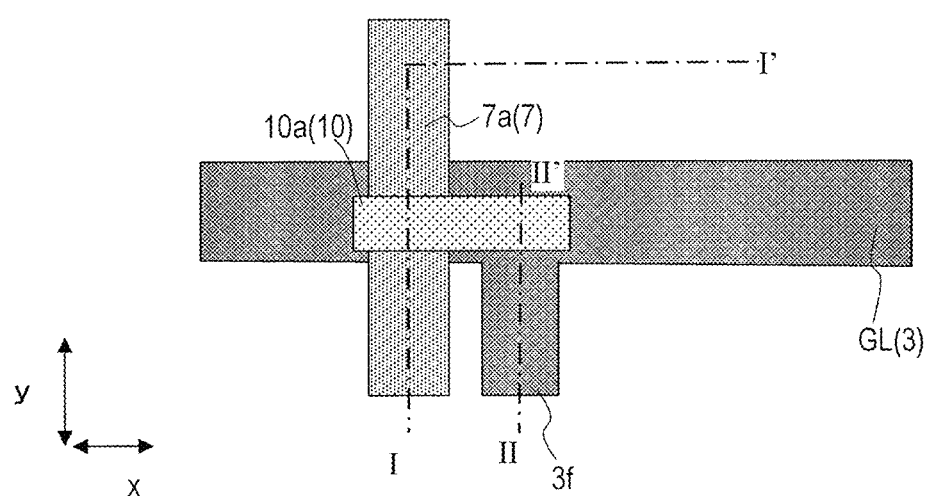
FIGS. 12D(a) to 12D(c) are a plan view and cross-sectional views illustrating a step of the method for manufacturing the active matrix substrate 1011.
Figure 12D:
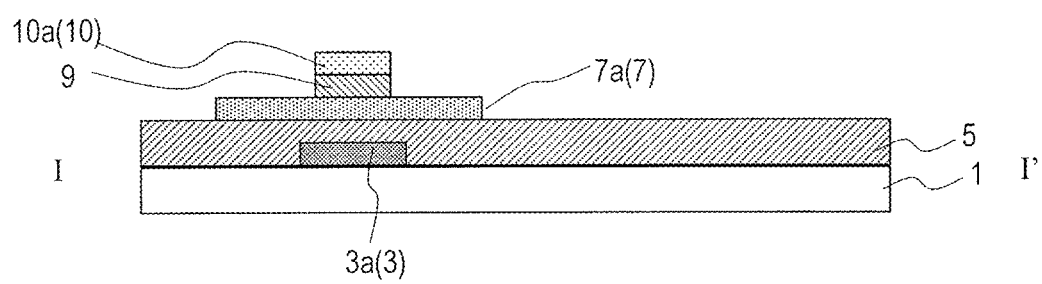
Figure 12D:
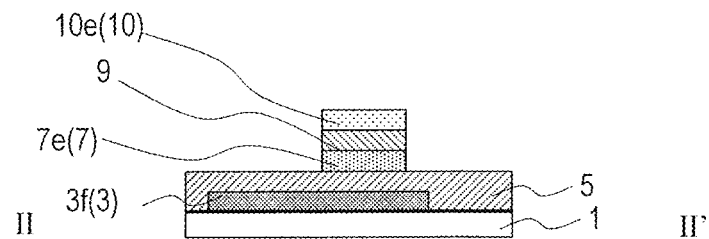

Then, as shown in FIGS. 12D(a) to 12D(c), the oxide semiconductor film 7' is patterned by using a second resist mask (not shown), which defines the active region, thereby obtaining the oxide semiconductor layer 7. The oxide semiconductor layer 7 includes the active region 7a, and the extension region 7e that extends so as to overlap with the upper gate extension 10e ((herein, extends in the x direction).

Figure 12E:
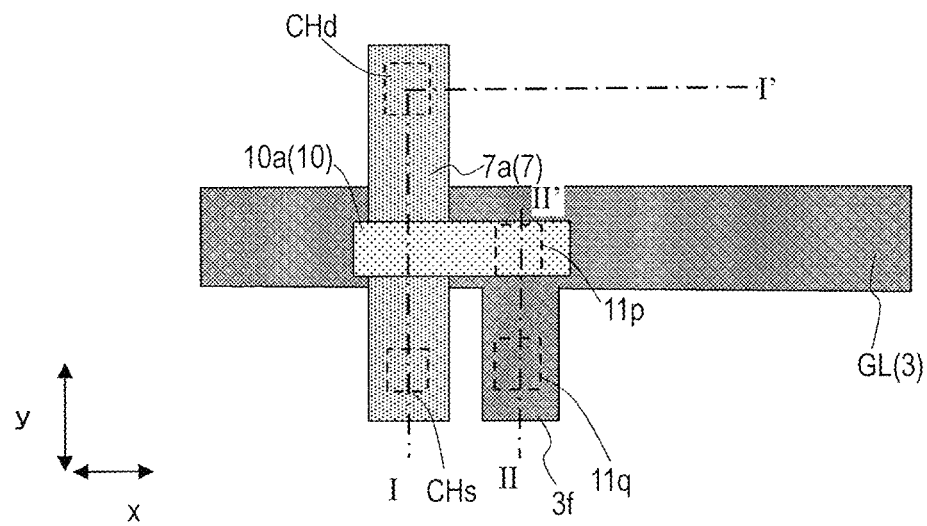
FIGS. 12E(a) to 12E(c) are a plan view and cross-sectional views illustrating a step of the method for manufacturing the active matrix substrate 1011.
Figure 12E:
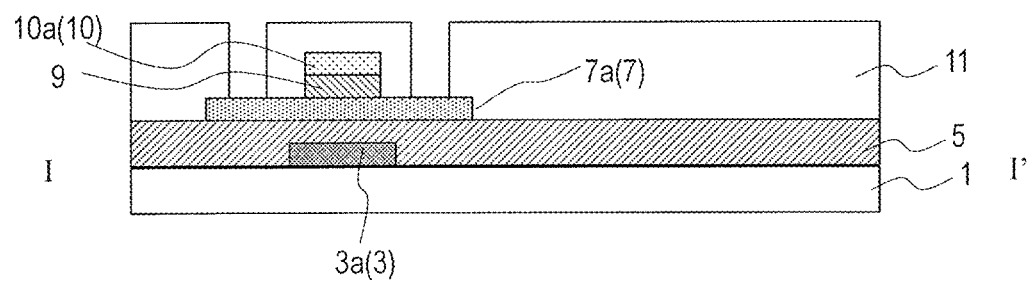
Figure 12E:
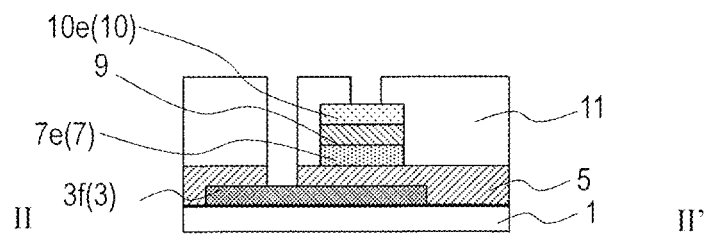

Then, as shown in FIGS. 12E(a) to 12E(c), the first inorganic insulating layer 11 is formed so as to cover the oxide semiconductor layer 7, the upper insulating layer 9 and the upper gate layer 10. Then, the openings CHs and CHd that reach the oxide semiconductor layer 7, the opening 11p that reaches the upper gate extension 10e, and the opening 11q that reaches the lower gate layer 3 (herein, the protruding portion 3f) are formed in the first inorganic insulating layer 11.

Figure 12F:
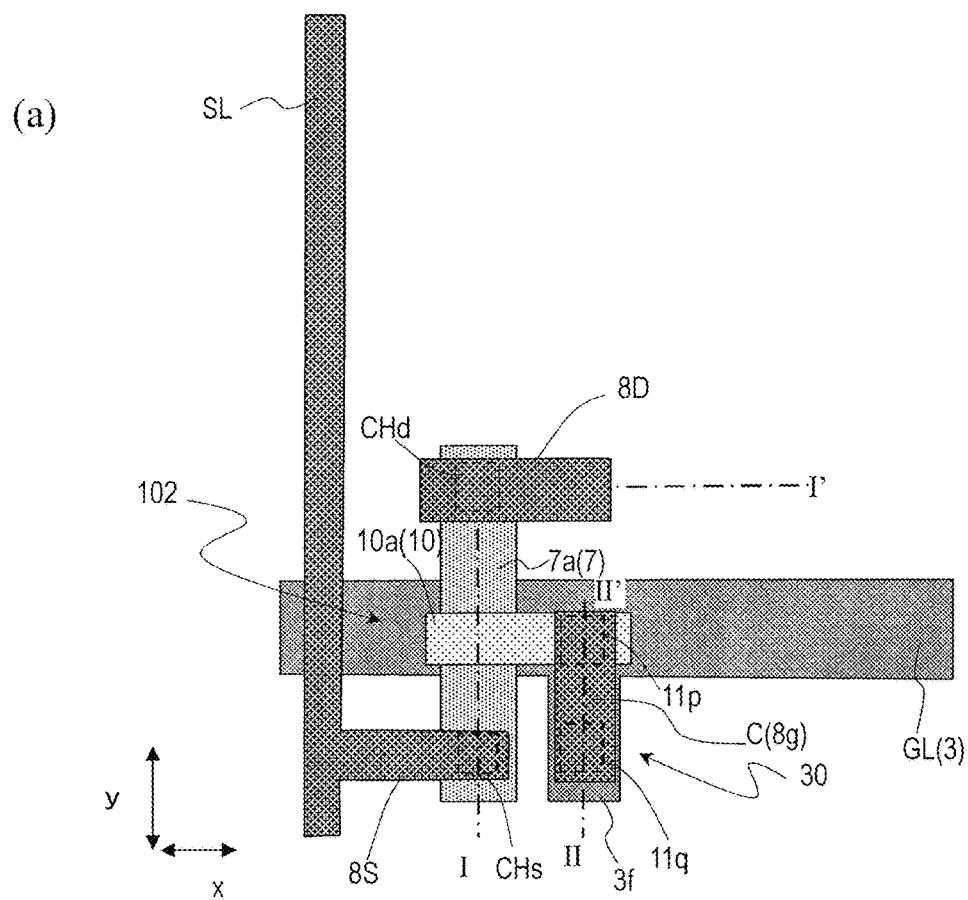
FIGS. 12F(a) to 12F(c) are a plan view and cross-sectional views illustrating a step of the method for manufacturing the active matrix substrate 1011.
Figure 12F:
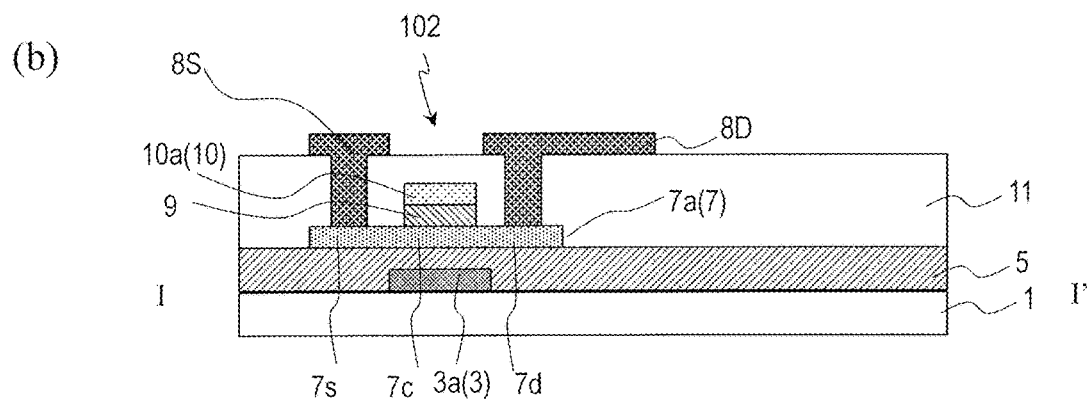
Figure 12F:
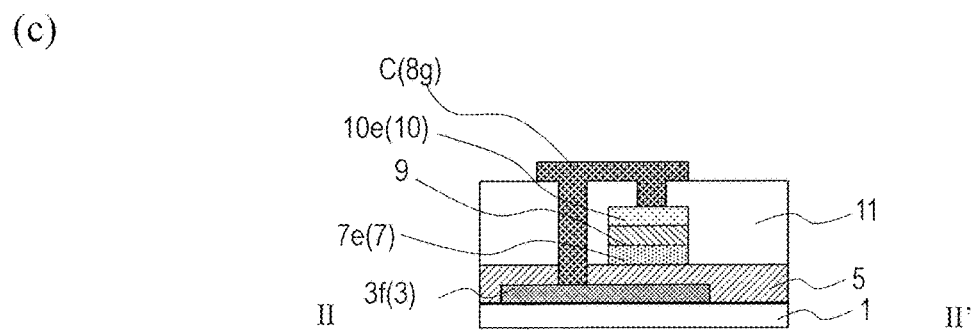

Next, as shown in FIGS. 12F(a) to 12F(c), a source conductive film is formed on the first inorganic insulating layer 11 and in the openings CHs, CHd, 11p and 11q and patterned so as to form a source metal layer including the source bus line SL, the source electrode 8S, the drain electrode 8D and the gate connecting portion C (the connecting portion 8g). The connecting portion 8g is arranged so as to be in contact with the upper gate extension 10e in the opening 11p and in contact with the gate bus line GL (herein, the protruding portion 3f) in the opening 11q.

Figure 12G:
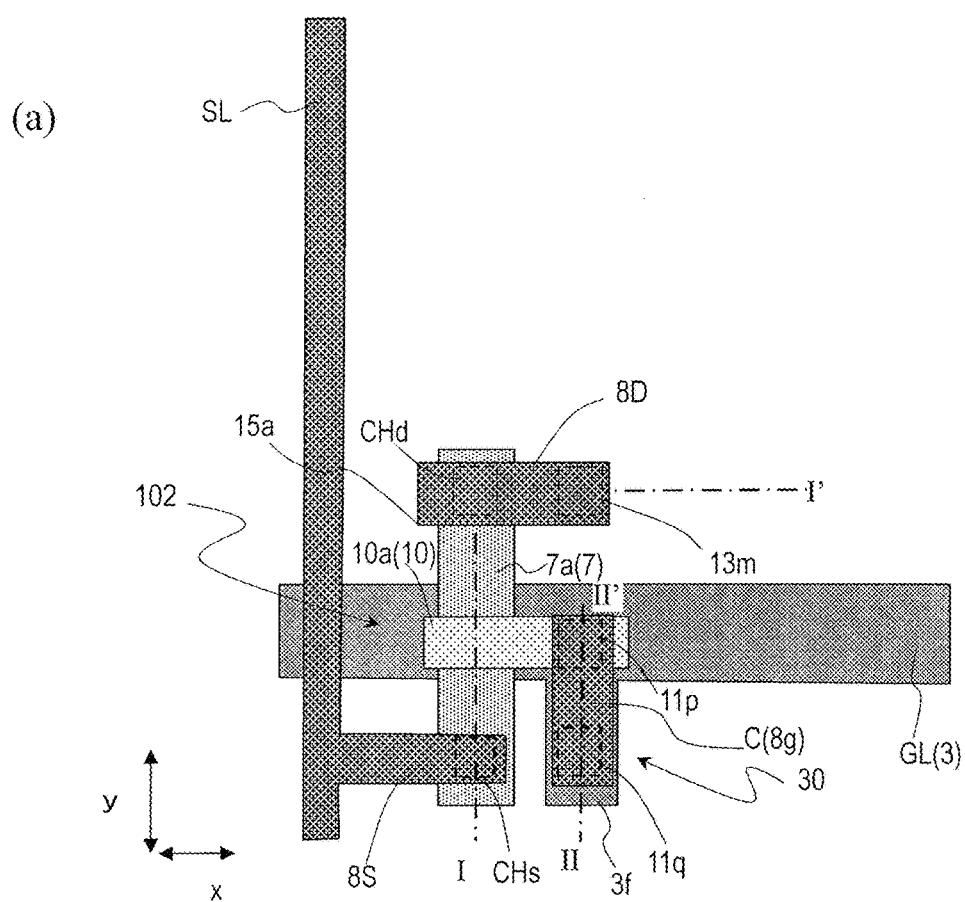
FIGS. 12G(a) to 12G(c) are a plan view and cross-sectional views illustrating a step of the method for manufacturing the active matrix substrate 1011.
Figure 12G:
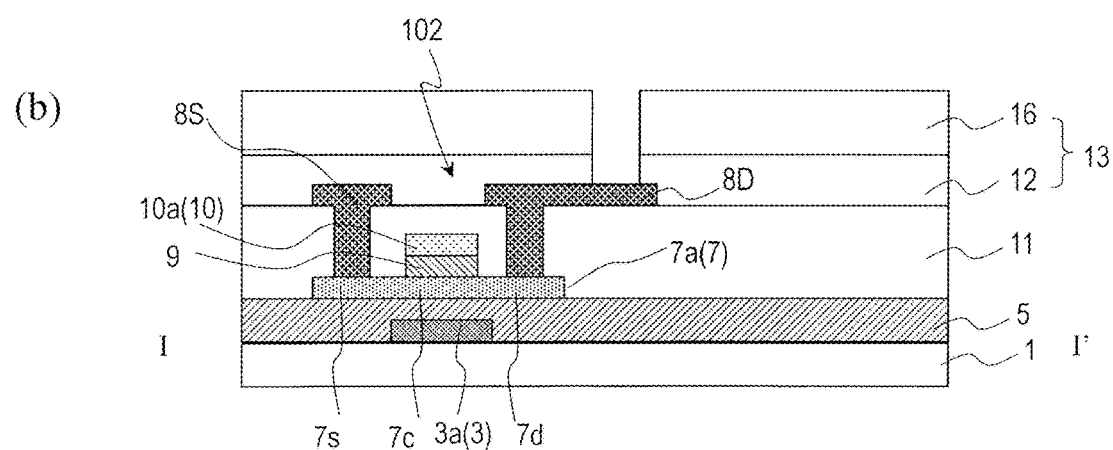
Figure 12G:
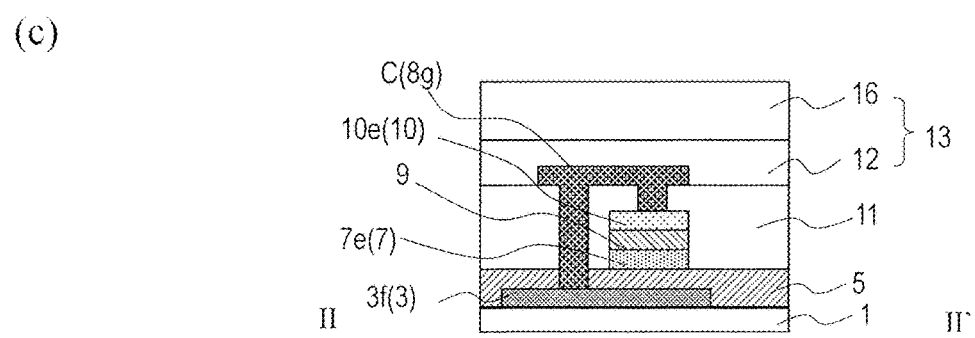
Figure 12H:
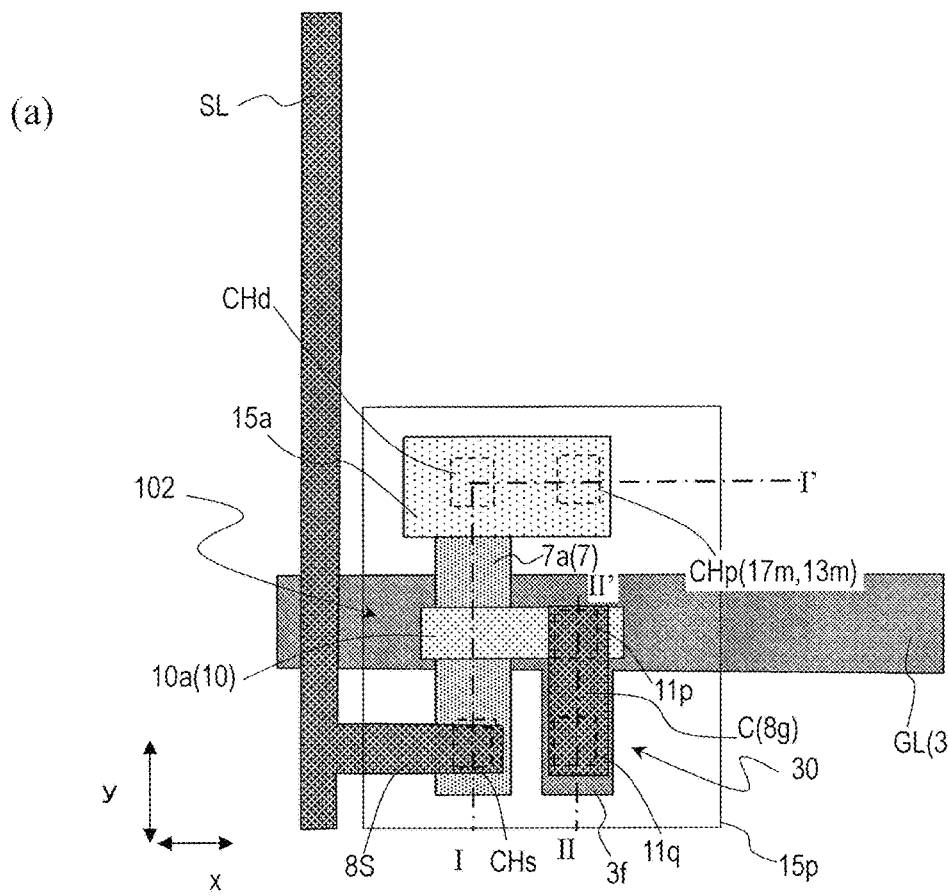
FIGS. 12H(a) to 12H(c) are a plan view and cross-sectional views illustrating a step of the method for manufacturing the active matrix substrate 1011.
Figure 12H:
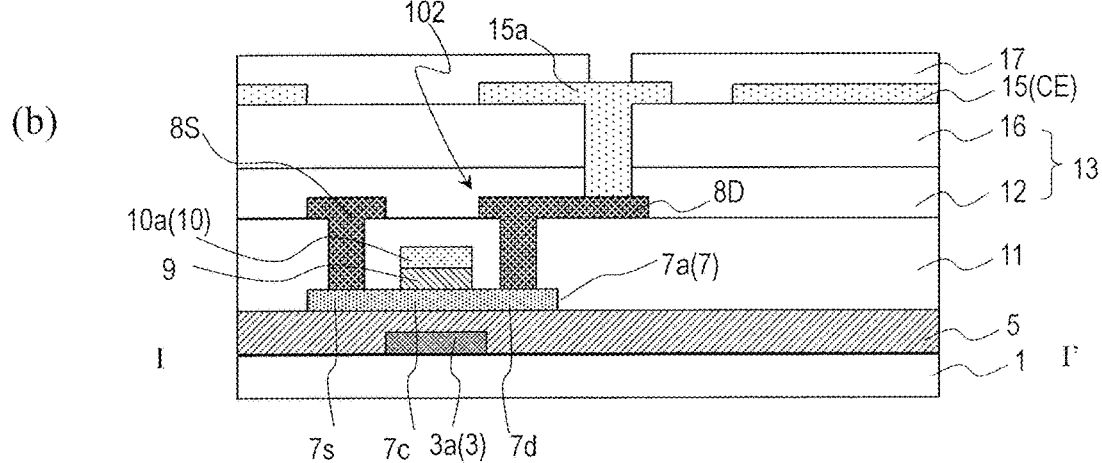
Figure 12H:
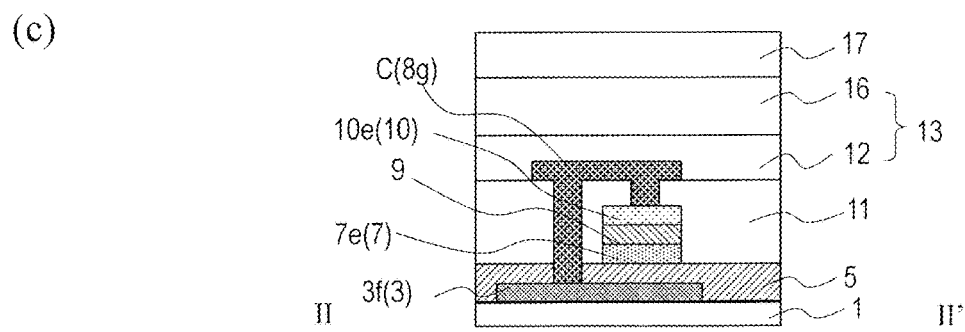

Then, as shown in FIGS. 12G(a) to 12G(c) and FIGS. 12H(a) to 12H(c), a lower transparent conductive layer including the interlayer insulating layer 13, the lower transparent electrode 15 and the transparent connecting portion 15a, and the dielectric layer 17 are formed. The method of formation is similar to the method described above with reference to FIG. 2H and FIG. 2I. Then, an upper transparent conductive layer including the upper transparent electrode 19 is formed. Thus, the active matrix substrate 1011 shown in FIG. 12A is manufactured.

The conductive film from which the gate connecting portion C is formed is not limited to a source conductive film. Although not shown in the figure, the gate connecting portion C may be formed by using the first transparent conductive film or the second transparent conductive film (see Variation 1 and Variation 3). Alternatively, it may be formed by using two or more of the source conductive film, the first transparent conductive film and the second transparent conductive film (see Variations 2 and 4).

The arrangement and the shape of the gate connecting portion C are not limited to those of the example shown in FIG. 12A. Also in this variation, as shown in FIGS. 13(a) to 13(c), the end portion of the gate connecting portion C that is on the first portion 31 side may be located on the upper gate extension 10e, and the end portion thereof that is on the second portion 32 side may be located on the lower gate layer 3, wherein the portion that is located between these end portions may extend so as not to overlap with the lower gate layer 3 or with the upper gate extension 10e. When the gate connecting portion C (or the third connecting portion C3) is formed by using the transparent conductive film, the gate connecting portion C can be arranged as described above without lowering the pixel aperture ratio. The first portion 31 may be arranged over the upper gate extension 10e so as not to overlap with the lower gate layer 3.

Figure 13:
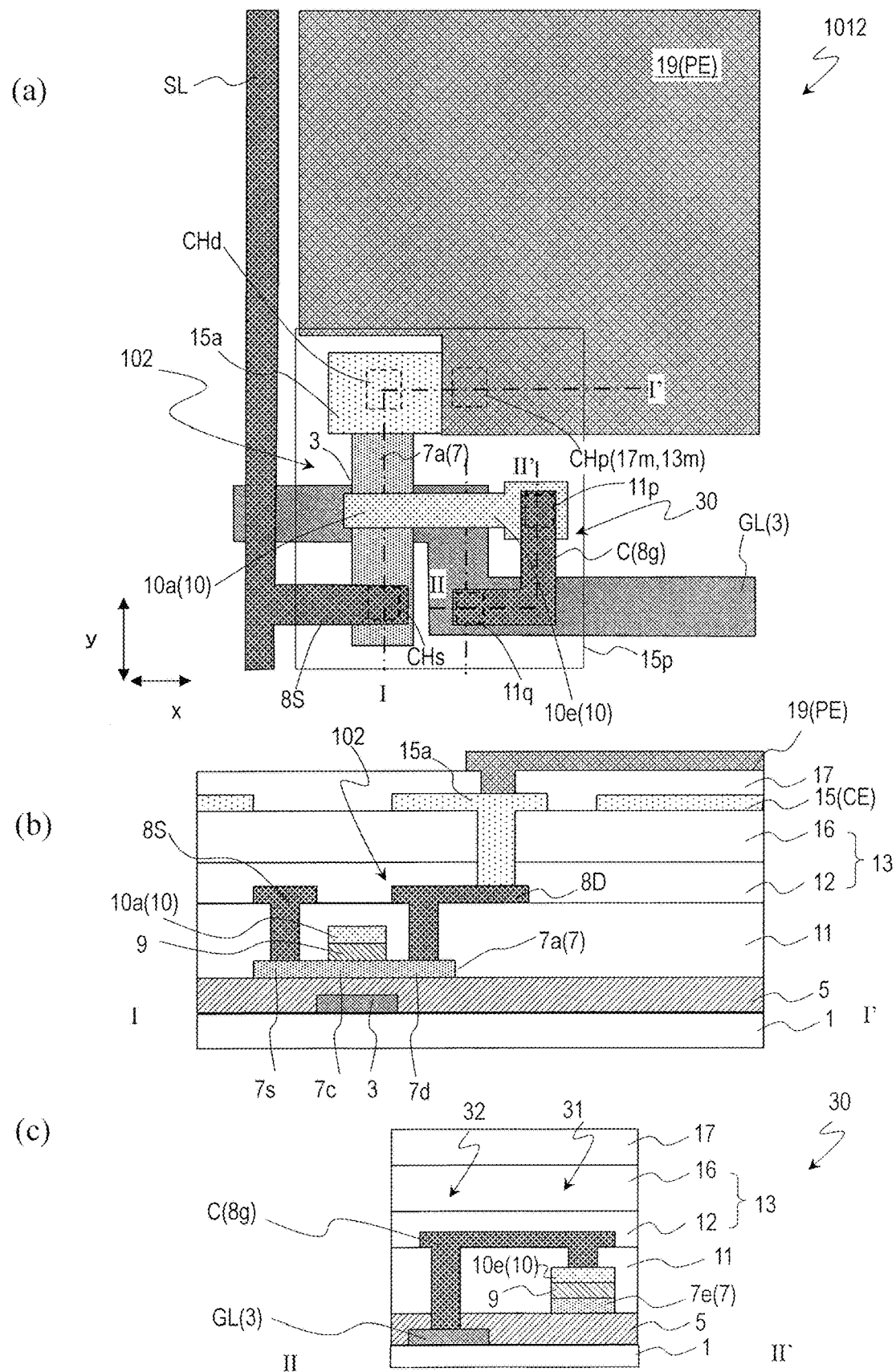
FIG. 13(a) is a plan view illustrating a pixel region PIX of an active matrix substrate 1012 of the second embodiment.
FIG. 13(b) and FIG. 13(c) are schematic cross-sectional views taken along line I-I' and line II-II', respectively.

Moreover, as shown in FIG. 13, the gate bus line GL may extend with a step so as to connect together the channel region of the TFT 102 and the second portion 32, as seen from the normal direction to the substrate 1.

The active matrix substrate 1012 shown in FIG. 13 can be manufactured by a method similar to that for the active matrix substrate 1011.

<Variation 6>

Variation 6 is different from the embodiments and variations described above in that in the gate contact portion 30, the gate connecting portion C is electrically connected to the lower gate electrode 3a and the upper gate electrode 10a in one opening.

Figure 14:
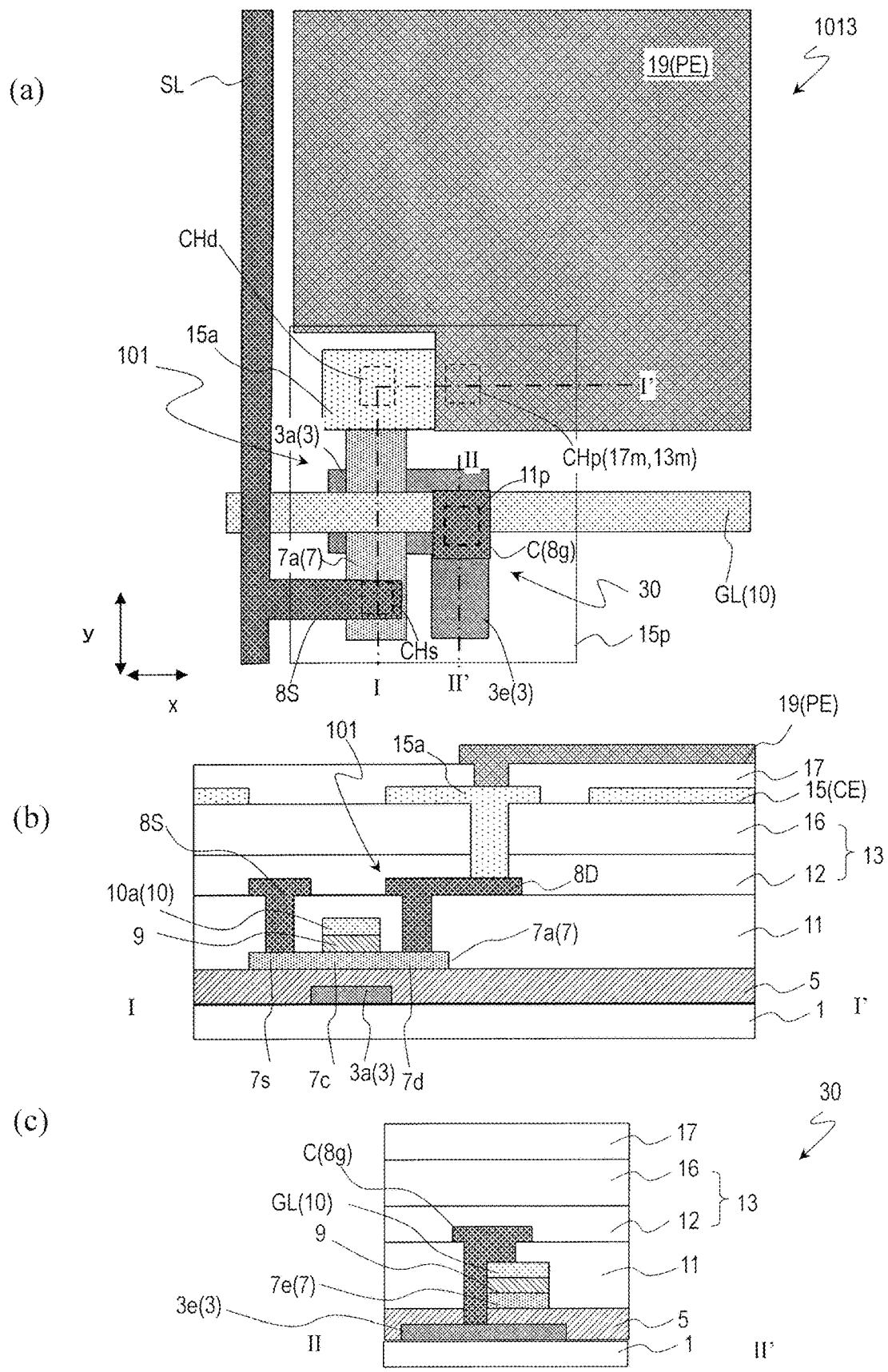
FIG. 14(a) is a plan view illustrating a pixel region PIX of an active matrix substrate 1013 of the second embodiment.
FIG. 14(b) and FIG. 14(c) are schematic cross-sectional views taken along line I-I' and line II-II', respectively.

FIG. 14(a) is a plan view illustrating a pixel region PIX of the active matrix substrate 1013 according to Variation 6 of the present embodiment. FIGS. 14(b) and 14(c) are schematic cross-sectional views taken along line I-I' and line II-II', respectively, of FIG. 14(a).

In Variation 6, in the gate contact portion 30, a single opening 11r that exposes the lower gate extension 3e of the lower gate layer 3 and the upper gate layer 10 (herein, the gate bus line GL) is formed in the first inorganic insulating layer 11 and the lower insulating layer 5. In other words, with the active matrix substrate 1002 shown in FIG. 3A, the opening 11p of the first inorganic insulating layer 11 that exposes a portion of the upper gate layer 10 and the opening 11q that is provided in the first inorganic insulating layer 11 and the lower insulating layer and exposes a portion of the lower gate layer 3 are connected together to form a single opening 11r. The opening 11r is arranged on the upper gate layer 10 (herein, the gate bus line GL) while being spaced apart from the active region 7a. A portion of the opening 11r may overlap with the gate bus line GL and another portion thereof may overlap with the lower gate extension 3e, as seen from the normal direction to the substrate 1.

The island-shaped connecting portion 8g (the gate connecting portion C) is formed from the source conductive film on the first inorganic insulating layer 11 and in the opening 11r. The gate connecting portion C is in contact with both the lower gate extension 3e and the upper gate layer 10 in the opening 11r. Otherwise, the configuration is similar to that of the active matrix substrate 1002.

In Variation 6, it is possible to reduce the area that is required for the gate contact portion 30. Therefore, it is possible to reduce the area of the lower gate extension 3e and the gate connecting portion C, and it is therefore possible to increase the pixel aperture ratio.

Figure 15A:
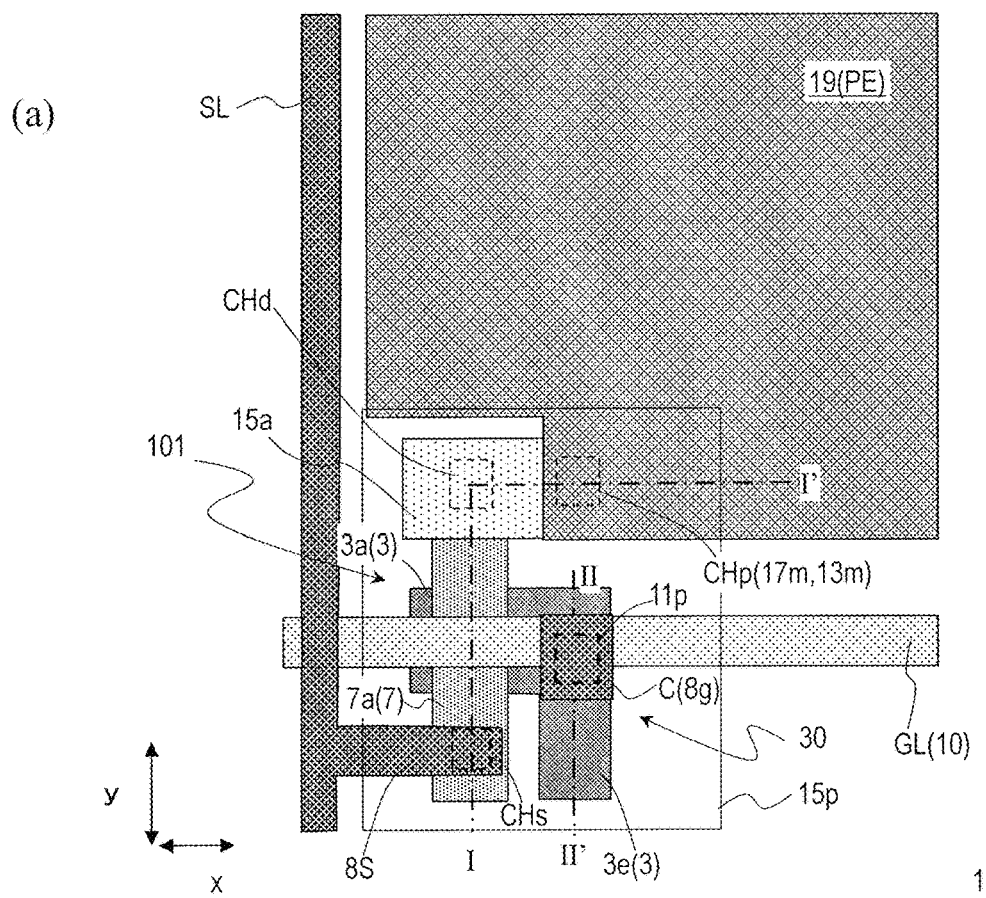
FIG. 15A(a) is a plan view illustrating a pixel region PIX of an active matrix substrate 1014 of the second embodiment, and FIG. 15A(b) and FIG. 15A(c) are schematic cross-sectional views taken along line I-I' and line II-II', respectively.
Figure 15A:
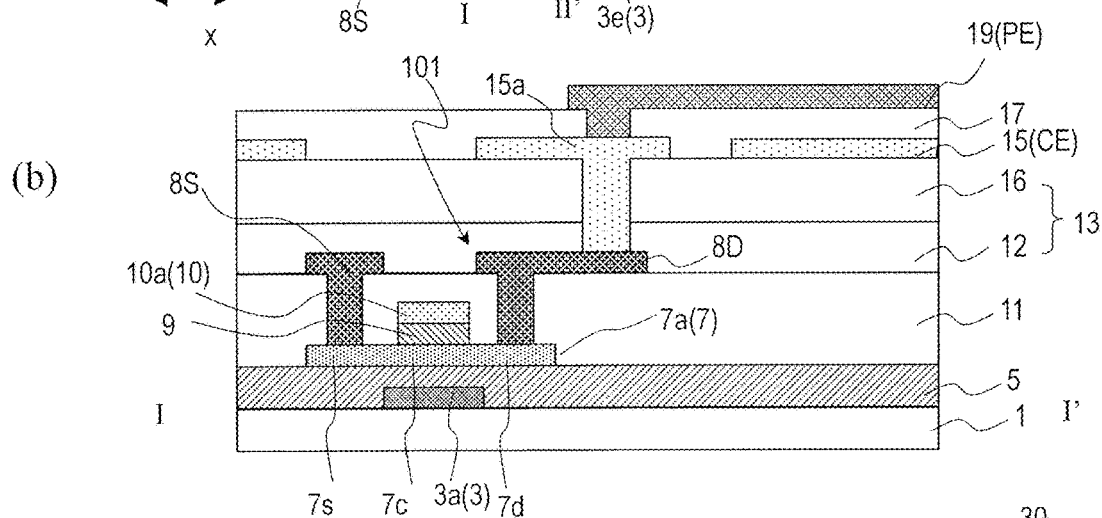
Figure 15A:
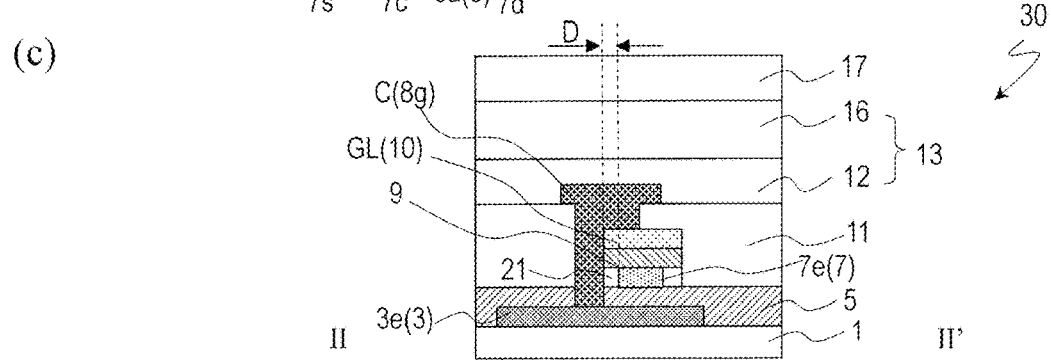

FIG. 15A(a) is a plan view illustrating a pixel region PIX of another active matrix substrate 1014. FIGS. 15A(b) and 15A(c) are schematic cross-sectional views taken along line I-I' and line II-II', respectively, of FIG. 15A(a).

As shown in FIG. 15A, the outer edge of the extension region 7e of the oxide semiconductor layer 7 may be located inside (on the inner side of) the outer edge of the upper insulating layer 9 and the upper gate layer 10, as seen from the normal direction to the substrate 1. In this case, an air layer 21 can be formed in a region that is between the upper insulating layer 9 and the lower insulating layer 5, that overlaps with the upper insulating layer 9 as seen from the normal direction to the substrate 1, and where the oxide semiconductor layer 7 (including the extension region 7e) is absent. The air layer 21 is arranged so as to surround the oxide semiconductor layer 7 between the upper insulating layer 9 and the lower insulating layer 5, for example. Such a configuration can be obtained for example by performing the patterning of the oxide semiconductor film under conditions such that the oxide semiconductor film is over-etched.

With the active matrix substrate 1014, since the air layer 21 is present between the extension region 7e and the gate connecting portion C in the gate contact portion 30, it is possible to suppress the problem of the extension region 7e and the gate connecting portion C coming into contact with, and being electrically connected to, each other. The distance D between the gate connecting portion C and the extension region 7e (the distance D in a plane parallel to the substrate) may be 0.1 µm or more, for example. If 0.1 µm or more, the extension region 7e and the gate connecting portion C can more reliably be electrically separated from each other. Although there is no particular limitation on the upper limit value of the distance D, it may be less than ⅓ the width of the gate bus line GL, for example. The distance D can be adjusted by the conditions under which the oxide semiconductor film is patterned.

FIG. 15B to FIG. 15E are schematic step-by-step diagrams illustrating a method for manufacturing the active matrix substrate 1014. In each figure, (a) is a plan view illustrating a pixel region PIX. In each figure, (b) and (c) are schematic cross-sectional views taken along line I-I' and line II-II', respectively, of FIG. 15A(a).

First, in each pixel region PIX, the lower gate layer 3, the lower insulating layer 5, the oxide semiconductor film 7', an upper insulating film and an upper gate conductive film are formed in this order on the substrate 1.

Figure 15B:
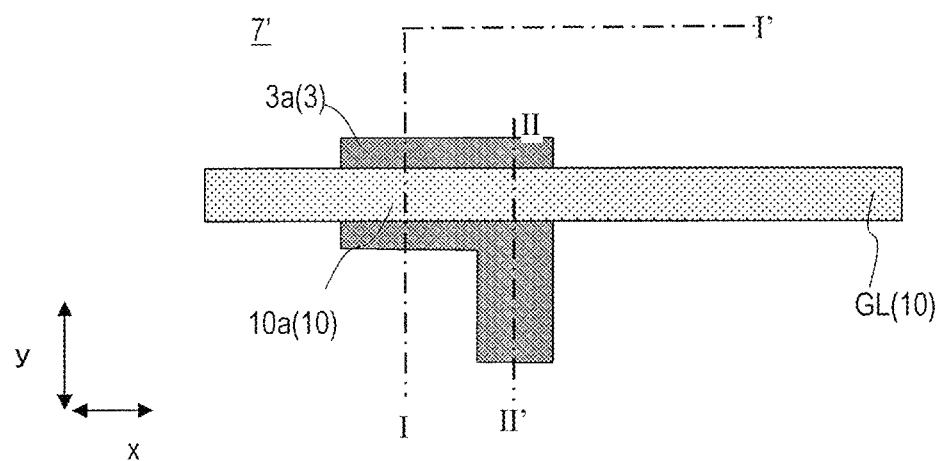
FIGS. 15B(a) to 15B(c) are a plan view and cross-sectional views illustrating a step of a method for manufacturing the active matrix substrate 1014.
Figure 15B:
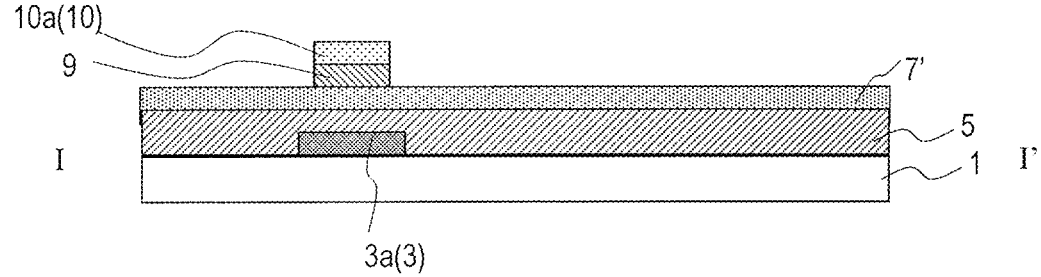
Figure 15B:
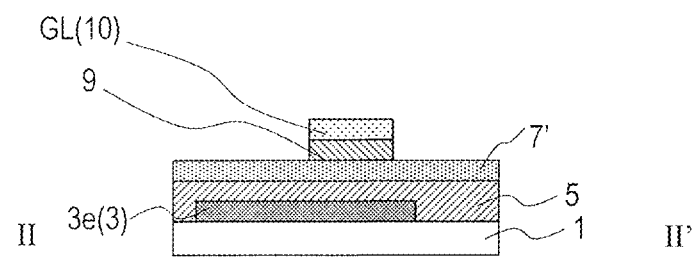

Then, as shown in FIGS. 15B(a) to 15B(c), the upper gate conductive film is patterned by using the first resist mask (not shown) so as to form the upper gate layer 10 including the upper gate electrode 10a and the gate bus line GL. Then, the upper insulating film is patterned using the same first resist mask, thereby obtaining the upper insulating layer 9. As in the embodiments described above, in this patterning step, since the lower insulating layer 5 is covered by the oxide semiconductor film 7', it is possible to suppress the etching of the surface of the lower insulating layer 5. Then, the first resist mask is removed.

Figure 15C:
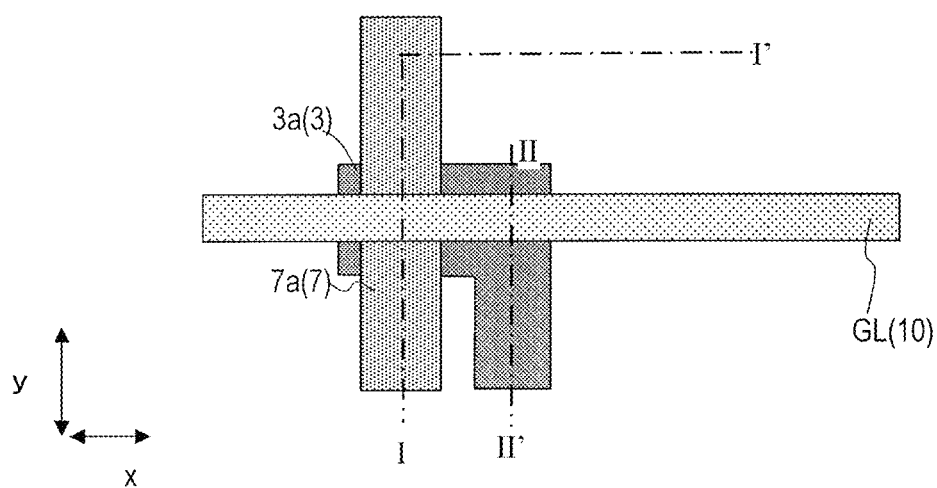
FIGS. 15C(a) to 15C(c) are a plan view and cross-sectional views illustrating a step of the method for manufacturing the active matrix substrate 1014.
Figure 15C:
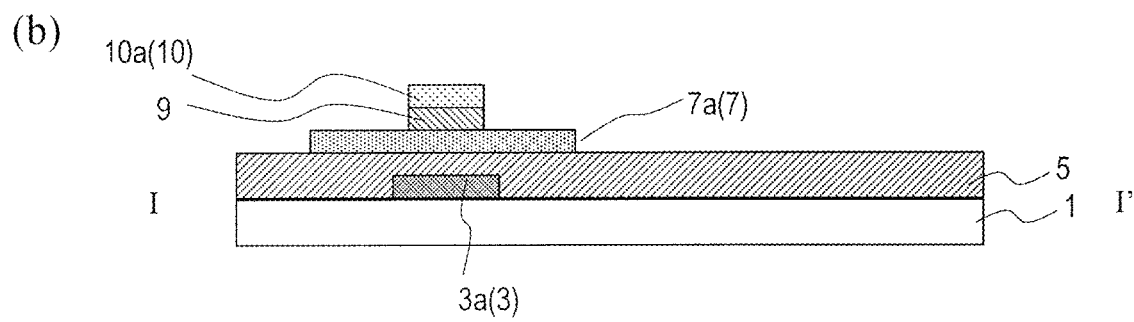
Figure 15C:
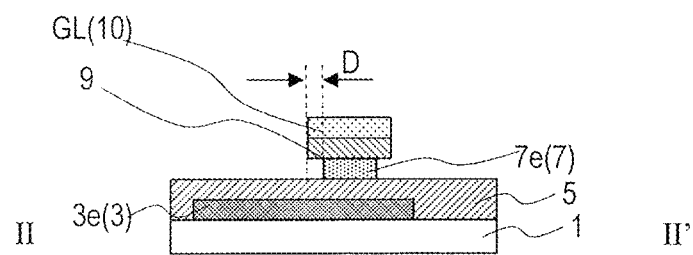

Next, as shown in FIGS. 15C(a) to 15C(c), the oxide semiconductor film 7' is patterned. The patterning of the oxide semiconductor film 7' is performed by wet etching by using a second resist mask, which defines the active region, and the upper gate electrode 10a as an etching mask. In this process, the oxide semiconductor film 7' is over-etched by controlling the etching conditions such as the etchant and the etching time. Thus, the oxide semiconductor layer 7 becomes slightly smaller than a pattern that is defined by the second resist mask or the upper gate electrode 10a. The distance (the over-etching amount) D from the outer edge of the second resist mask or the upper gate layer 10 to the outer edge of the oxide semiconductor layer 7 in the direction parallel to the substrate 1 is preferably controlled within the range described above. Then, the second resist mask is removed. Thus, the oxide semiconductor layer 7 including the active region 7a and the extension region 7e extending under the gate bus line GL is obtained.

Figure 15D:
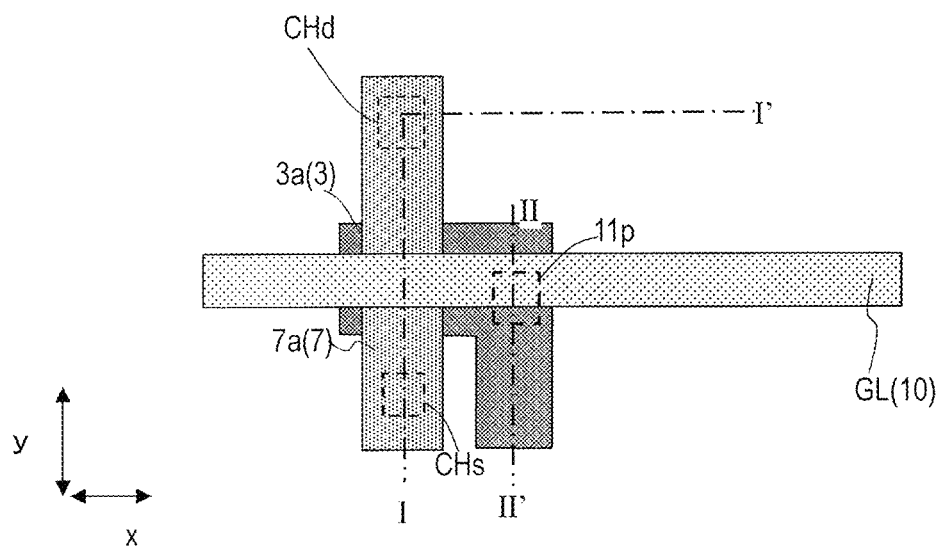
FIGS. 15D(a) to 15D(c) are a plan view and cross-sectional views illustrating a step of the method for manufacturing the active matrix substrate 1014.
Figure 15D:
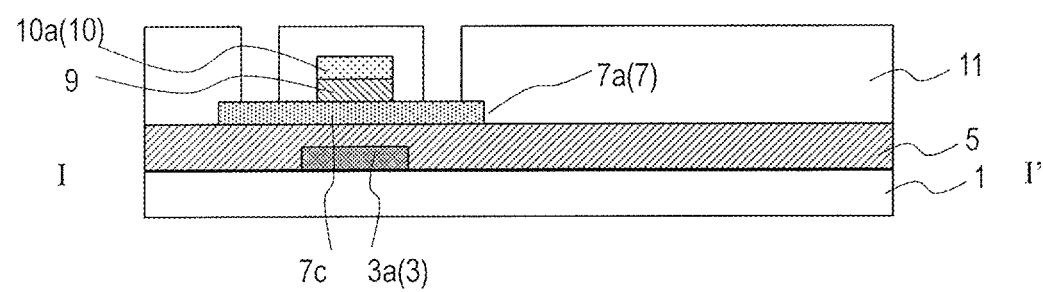
Figure 15D:
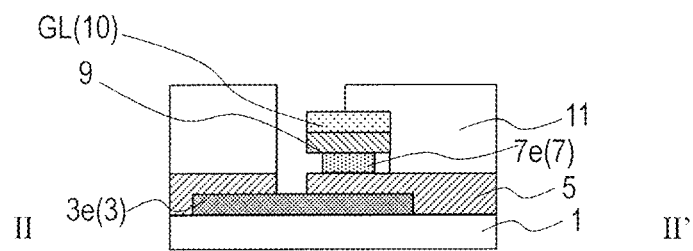

Next, as shown in FIGS. 15D(a) to 15D(c), the first inorganic insulating layer 11 is formed so as to cover the lower insulating layer 5, and the oxide semiconductor layer 7, the upper insulating layer 9 and the upper gate layer 10. Then, the openings CHs and CHd that reach the oxide semiconductor layer 7 and the opening 11p are formed in the first inorganic insulating layer 11. The opening 11p is arranged in the gate contact portion formation region so that a portion of the lower gate layer 3 and a portion of the upper gate layer 10 (herein, the gate bus line GL) are exposed.

Figure 15E:
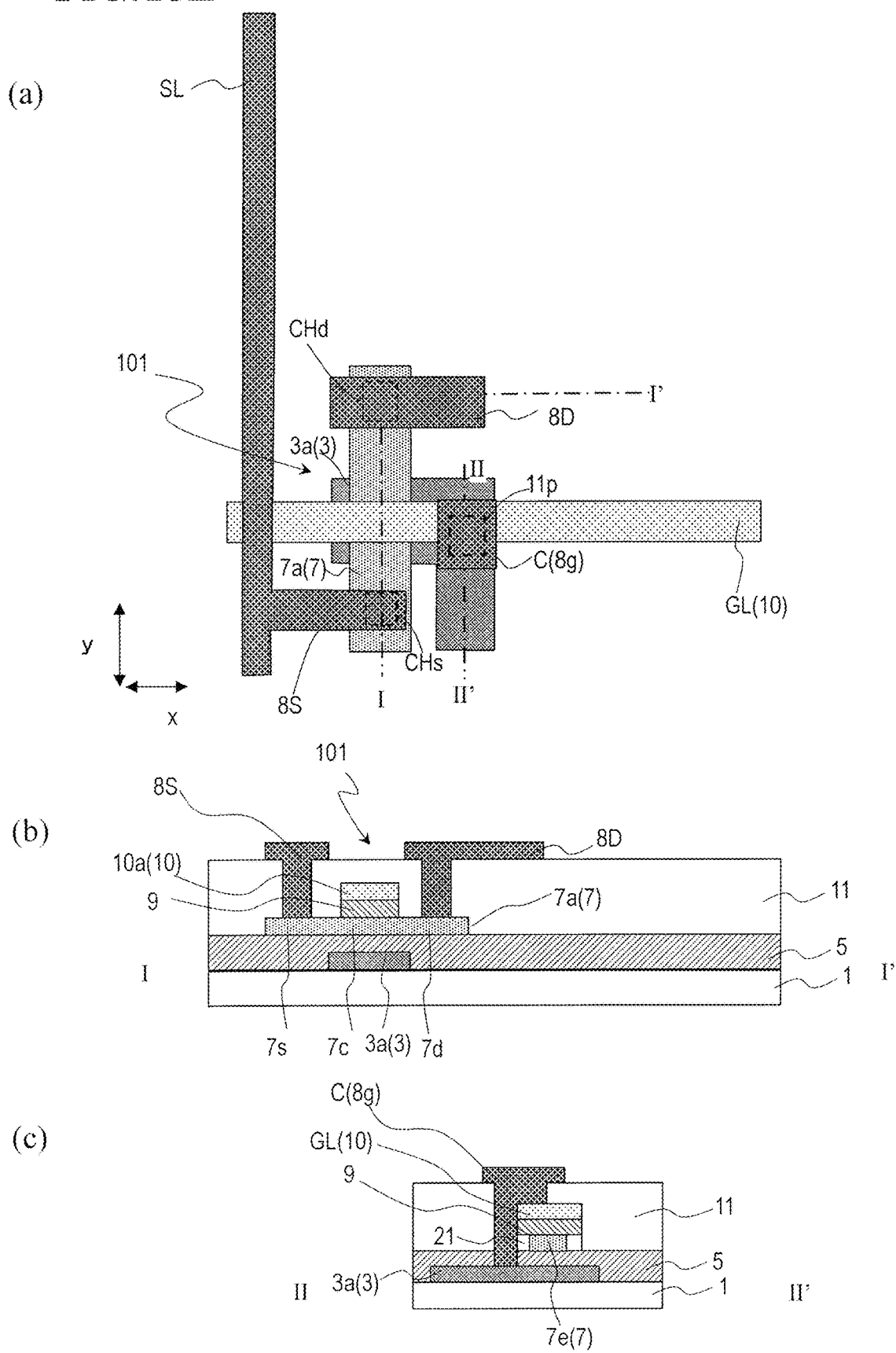
FIGS. 15E(a) to 15E(c) are a plan view and cross-sectional views illustrating a step of the method for manufacturing the active matrix substrate 1014.

Then, as shown in FIGS. 15E(a) to 15E(c), a source metal layer including the source bus line SL, the source electrode 8S, the drain electrode 8D and the gate connecting portion C (the connecting portion 8g) is formed. The connecting portion 8g is arranged so as to be in contact with both the upper gate layer 10 (herein, the gate bus line GL) and the lower gate extension 3e in the opening 11r. The connecting portion 8g is in contact with the upper surface and the side surface of the upper gate layer 10 and the side surface of the upper insulating layer 9 in the opening 11r. On the other hand, since the air layer 21 is present between the connecting portion 8g and the extension region 7e, the connecting portion 8g is not in contact with the side surface of the extension region 7e of the oxide semiconductor layer 7.

Then, as with the active matrix substrate 1002, the interlayer insulating layer 13, the lower transparent conductive layer, the dielectric layer 17 and the upper transparent conductive layer are formed. Thus, the active matrix substrate 1014 shown in FIG. 15A is manufactured.

Figure 16:
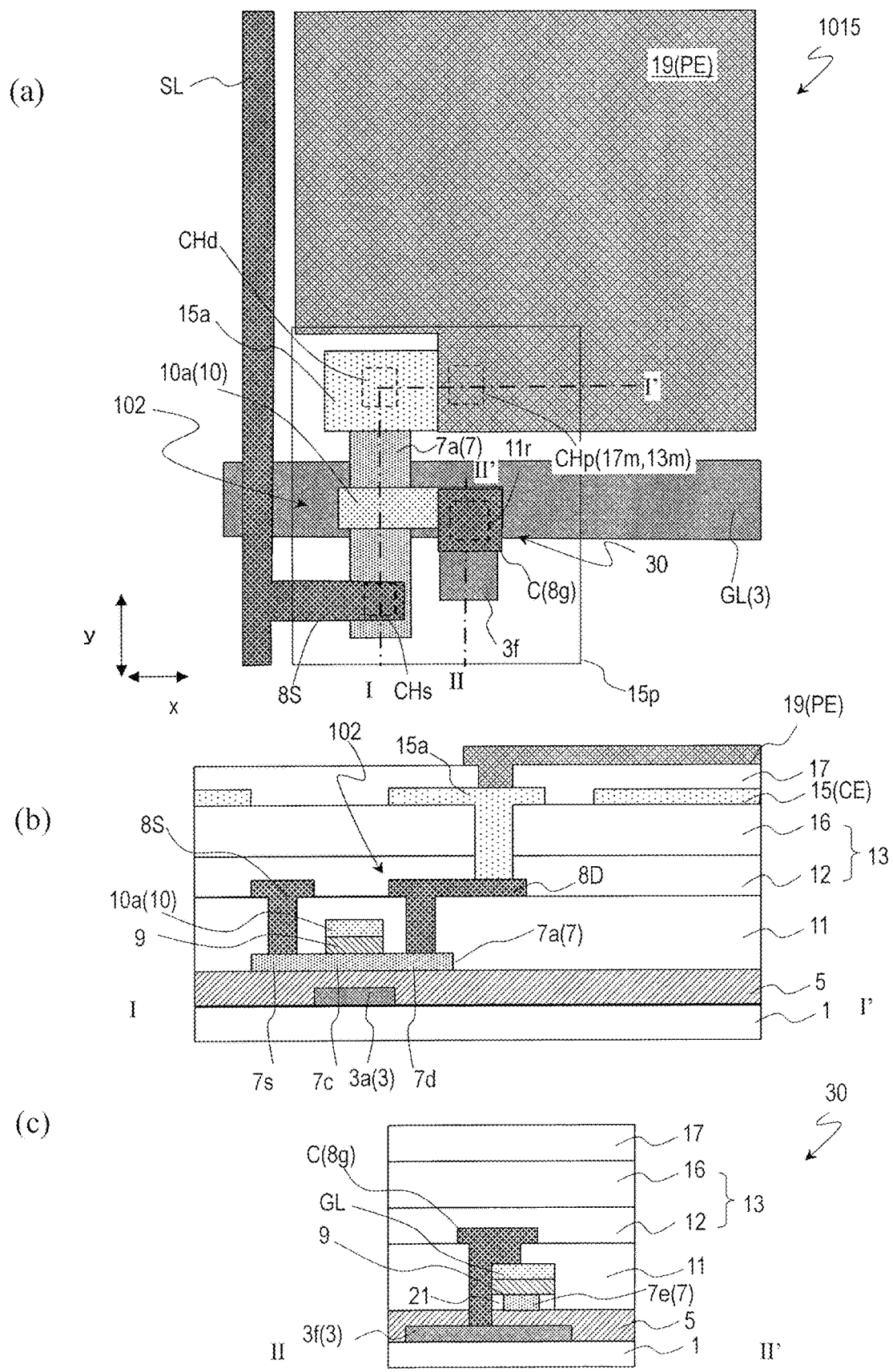
FIG. 16(a) is a plan view illustrating a pixel region PIX of an active matrix substrate 1015 of the second embodiment.
FIG. 16(b) and FIG. 16(c) are schematic cross-sectional views taken along line I-I' and line II-II', respectively.
Figure 17:
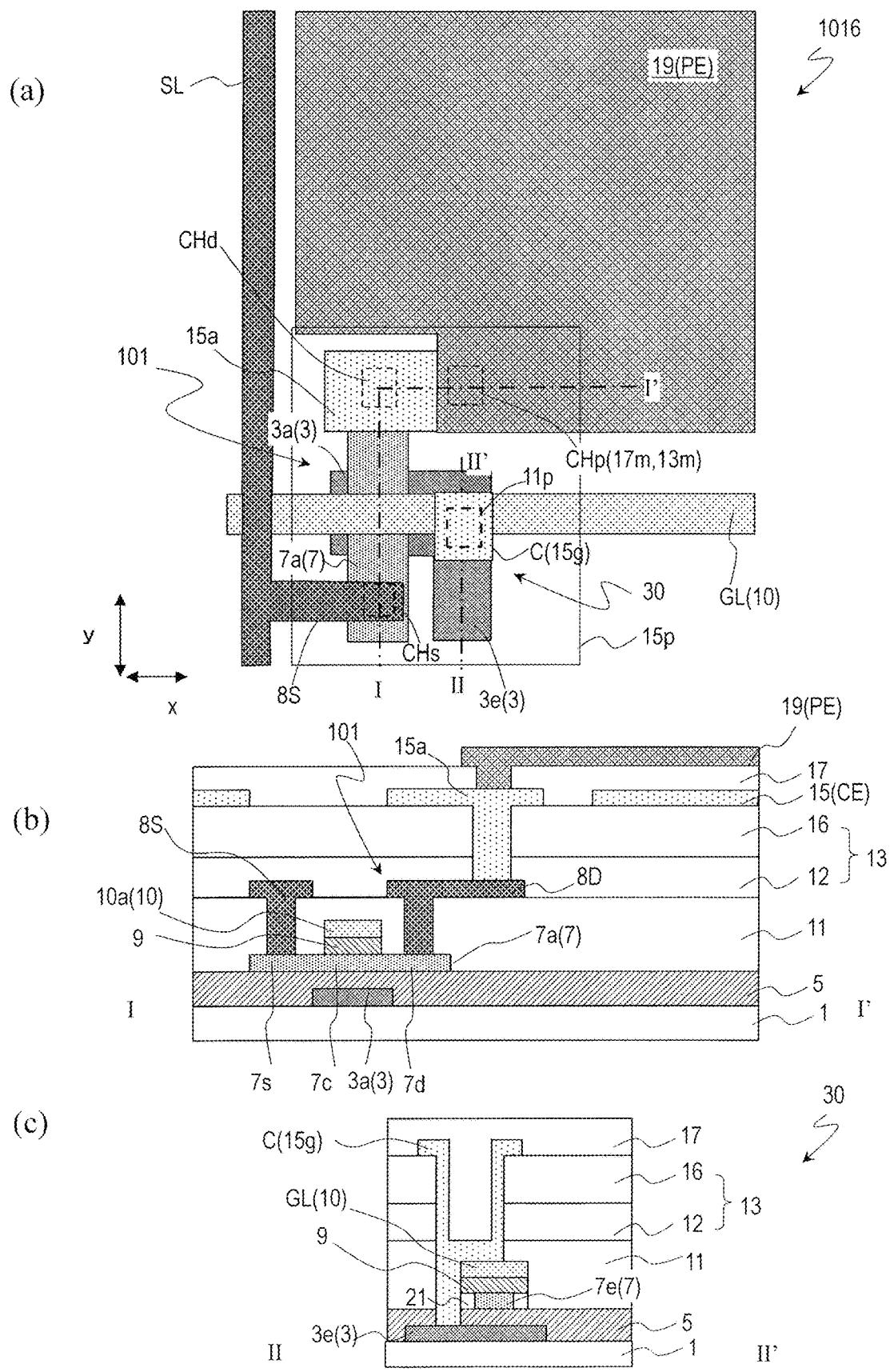
FIG. 17(a) is a plan view illustrating a pixel region PIX of an active matrix substrate 1016 of the second embodiment.
FIG. 17(b) and FIG. 17(c) are schematic cross-sectional views taken along line I-I' and line II-II', respectively.
Figure 18:
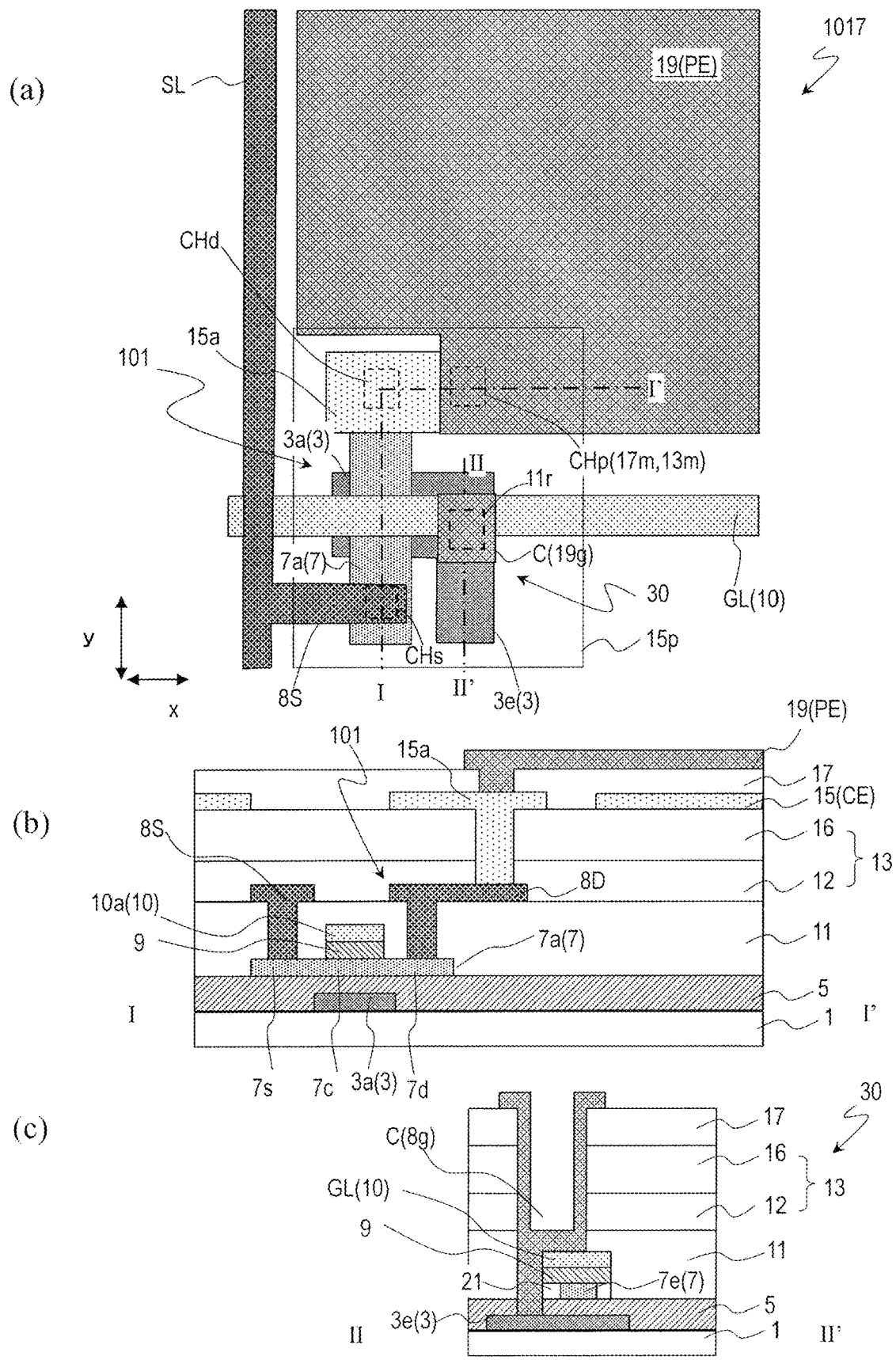
FIG. 18(a) is a plan view illustrating a pixel region PIX of an active matrix substrate 1017 of the second embodiment.
FIG. 18(b) and FIG. 18(c) are schematic cross-sectional views taken along line I-I' and line II-II', respectively.

While the upper gate electrode 10a and the gate bus line GL are formed integral with each other on the active matrix substrate 1014, the lower gate electrode 3a and the gate bus line GL may be formed integral with each other as shown in FIGS. 16(a) to 16(c). The gate connecting portion C may be formed by using the same transparent conductive film as the lower transparent electrode 15 (the first transparent conductive film) as shown in FIGS. 17(a) to 17(c). Alternatively, as shown in FIGS. 18(a) to 18(c), the gate connecting portion C may be formed by using the same transparent conductive film as the upper transparent electrode 19 (the second transparent conductive film). Although not shown in the figures, the gate connecting portion C may be formed by using two or more of the source conductive film, the first transparent conductive film and the second transparent conductive film. The method for manufacturing these active matrix substrates can be similar to the method for manufacturing the active matrix substrates of Variations 1 to 5, though the number and the arrangement of openings provided in the gate contact portion 30 are different. Note that also with these active matrix substrate, it is preferred to more reliably electrically separate the oxide semiconductor layer 7 and the gate connecting portion C from each other by using the over-etching of the oxide semiconductor film.

Note that although not shown in the figures, the gate bus line GL may be formed in a layer that is different from either the upper gate layer 10 or the lower gate layer 3. In such a case, the gate bus line GL may be formed integral with the gate connecting portion C.

Third Embodiment

A semiconductor device according to a third embodiment of the present invention will now be described with reference to the drawings. The semiconductor device of the present embodiment is an active matrix substrate including oxide semiconductor TFTs and crystalline silicon TFTs that are formed on the same substrate.

The active matrix substrate includes a TFT (pixel TFT) for each pixel. The pixel TFT may be an oxide semiconductor TFT that uses an In—Ga—Zn—O-based semiconductor film as the active layer, for example.

A part or whole of a peripheral driving circuit may be formed integral on the same substrate as the pixel TFTs. Such an active matrix substrate is referred to as a driver-monolithic active matrix substrate. With a driver-monolithic active matrix substrate, a peripheral driving circuit is provided in the region (the non-display region or the bezel region) other than the region including a plurality of pixels (the display region). TFTs of the peripheral driving circuit (circuit TFTs) may be crystalline silicon TFTs whose active layer is a polycrystalline silicon film, for example. Thus, when oxide semiconductor TFTs are used as pixel TFTs and crystalline silicon TFTs are used as circuit TFTs, it is possible to lower the power consumption in the display region and it is further possible to reduce the size of the bezel region.

The TFTs 101 and 102 described above with reference to the active matrix substrates 1001 to 1017 of the above embodiments can be used as pixel TFTs. This will be described later.

Next, a more specific configuration of the active matrix substrate of the present embodiment will be described with reference to the drawings.

Figure 20A:
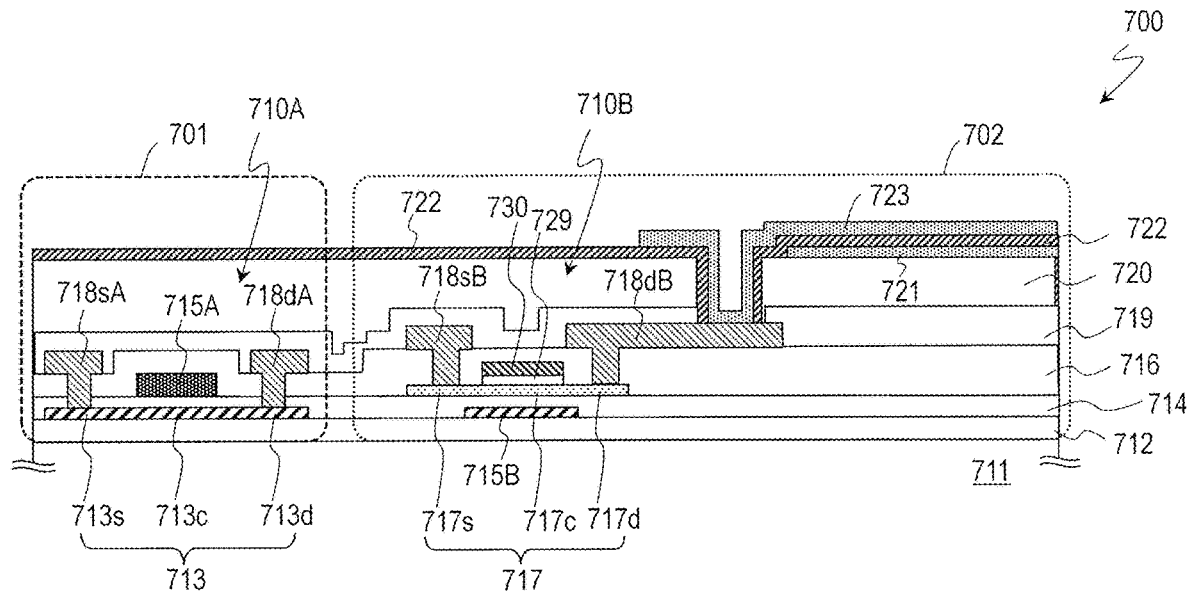
FIG. 20A is a cross-sectional view illustrating an active matrix substrate of a third embodiment.

FIG. 20A is a cross-sectional view showing a cross-sectional structure of a crystalline silicon TFT (hereinafter referred to as a "first thin film transistor") 710A and an oxide semiconductor TFT (hereinafter referred to as a "second thin film transistor") 710B of an active matrix substrate 700.

As described above with reference to FIG. 1, the active matrix substrate 700 has a display region DR including a plurality of pixels and a region (non-display region) FR other than the display region DR. The non-display region FR includes a driving circuit formation region where driving circuits are provided. In the driving circuit formation region, for example, a gate driver circuit GD, a test circuit, an SSD circuit, etc., are provided. The display region DR includes a plurality of gate bus lines GL extending in the row direction and a plurality of source bus lines SL extending in the column direction. Although not shown in the figures, pixels are defined by gate bus lines GL and source bus lines SL, for example. The gate bus lines GL are connected to the respective terminals of the gate driver circuit. The source bus lines SL are connected to the respective terminals of the driver IC mounted on the active matrix substrate 700.

As shown in FIG. 20A, on the active matrix substrate 700, the second thin film transistor 710B is formed as a pixel TFT in each pixel in the display region DR, and the first thin film transistor 710A is formed as a circuit TFT in the driving circuit formation region FR.

The active matrix substrate 700 includes a substrate 711, a base film 712 formed on the surface of the substrate 711, the first thin film transistor 710A formed on the base film 712, and the second thin film transistor 710B formed on the base film 712. The first thin film transistor 710A is a crystalline silicon TFT having an active region that primarily includes a crystalline silicon. The second thin film transistor 710B is an oxide semiconductor TFT having an active region that primarily includes an oxide semiconductor. The first thin film transistor 710A and the second thin film transistor 710B are manufactured integrally on the substrate 711. As used herein, an "active region" refers to a region of a semiconductor layer to be the active layer of the TFT where the channel is to be formed.

The first thin film transistor 710A includes a crystalline silicon semiconductor layer (e.g., a low-temperature polysilicon layer) 713 formed on the base film 712, the first insulating layer 714 covering the crystalline silicon semiconductor layer 713, and a gate electrode 715A provided on the first insulating layer 714. A portion of the first insulating layer 714 that is located between the crystalline silicon semiconductor layer 713 and the gate electrode 715A functions as the gate insulating film of the first thin film transistor 710A. The crystalline silicon semiconductor layer 713 includes a region (active region) 713c where the channel is formed, and a source region 713s and a drain region 713d that are located on opposite sides of the active region. In this example, a portion of the crystalline silicon semiconductor layer 713 that overlaps with the gate electrode 715A with the first insulating layer 714 interposed therebetween serves as the active region 713c. The first thin film transistor 710A includes a source electrode 718sA and a drain electrode 718dA that are connected respectively to the source region 713s and the drain region 713d. The source and drain electrodes 718sA and 718dA may be provided on an interlayer insulating film that (herein, the second insulating layer 716) that covers the gate electrode 715A and the crystalline silicon semiconductor layer 713, and may be connected to the crystalline silicon semiconductor layer 713 in the contact hole formed in the interlayer insulating film.

The second thin film transistor 710B includes a lower gate electrode 715B provided on the base film 712, the second insulating layer 716 covering the lower gate electrode 715B, and an oxide semiconductor layer 717 arranged on the second insulating layer 716. The lower gate electrode 715B may be a metal layer, or may be a polysilicon layer that is formed from the same film as the crystalline silicon semiconductor layer 713. The first insulating layer 714, which is the gate insulating film of the first thin film transistor 710A, may be extended to a region where the second thin film transistor 710B is to be formed. In this case, the oxide semiconductor layer 717 may be formed on the first insulating layer 714. An upper gate electrode 730 is arranged on the oxide semiconductor layer 717 with a fourth insulating layer 729 interposed therebetween. The fourth insulating layer 729 may be arranged only between the oxide semiconductor layer 717 and the upper gate electrode 730. A portion of the second insulating layer 716 that is located between the lower gate electrode 715B and the oxide semiconductor layer 717, and the fourth insulating layer 729 function as the gate insulating film of the second thin film transistor 710B.

The oxide semiconductor layer 717 includes a region (active region) 717c where the channel is formed, and a source contact region 717s and a drain contact region 717d that are located on opposite sides of the active region. In this example, a portion of the oxide semiconductor layer 717 that overlaps with the lower gate electrode 715B or the upper gate electrode 730 with the second insulating layer 716 interposed therebetween serves as the active region 717c. The second thin film transistor 710B further includes a source electrode 718sB and a drain electrode 718dB that are connected respectively to the source contact region 717s and the drain contact region 717d. Note that one may use a configuration where the base film 712 is not provided on the substrate 711.

The thin film transistors 710A and 710B are covered by a passivation film 719 and a flattening film 720. With the second thin film transistor 710B, which functions as a pixel TFT, the lower gate electrode 715B and the upper gate electrode 730 are connected to the gate bus line (not shown). The source electrode 718sB is connected to the source bus line (not shown), and the drain electrode 718dB is connected to a pixel electrode 723. In this example, the drain electrode 718dB is connected to the corresponding pixel electrode 723 in the opening formed in the passivation film 719 and the flattening film 720. A video signal is supplied to the source electrode 718sB via the source bus line, and a necessary electric charge is written to the pixel electrode 723 based on the gate signal from the gate bus line.

Note that as shown in the figure, a transparent conductive layer 721 may be formed, as the common electrode, on the flattening film 720, and a third insulating layer 722 may be formed between the transparent conductive layer (common electrode) 721 and the pixel electrode 723. In this case, a slit-shaped opening may be provided in the pixel electrode 723. The active matrix substrate 700 as described above can be applied to a display device of an FFS mode, for example.

The TFT 101 or the TFT 102 of the first and second embodiments can be used as the second thin film transistor 710B of the present embodiment. When the TFTs 101 and 102 are used, the lower gate electrode 3a, the lower insulating layer 5, the oxide semiconductor layer 7, the source and drain electrodes 8S and 8D, the upper insulating layer 9 and the upper gate electrode 10a of the TFTs 101 and 102 may be associated respectively with the lower gate electrode 715B, the second insulating layer (the gate insulating layer) 716, the oxide semiconductor layer 717, the source and drain electrodes 718sB and 718dB, the fourth insulating layer 729 and the upper gate electrode 730 shown in FIG. 20A.

In the illustrated example, the first thin film transistor 710A has the top gate structure in which the crystalline silicon semiconductor layer 713 is arranged between the gate electrode 715A and the substrate 711 (the base film 712). On the other hand, the second thin film transistor 710B has the double gate structure in which the lower gate electrode 715B and the upper gate electrode 730 are arranged with the oxide semiconductor layer 717 sandwiched therebetween.

The TFT structure of the first thin film transistor 710A and the second thin film transistor 710B is not limited to the structure described above. The first thin film transistor 710A may have the bottom gate structure. With the bottom gate structure, it may be of a channel etch type as is the thin film transistor 710B, or may be of an etch stop type. It may be of a bottom contact type in which the source electrode and the drain electrode are located under the semiconductor layer. Alternatively, the thin film transistor 710A may have a similar double gate structure to that of the thin film transistor 710B.

The second insulating layer 716, which is the gate insulating film of the second thin film transistor 710B, may be extended to a region where the first thin film transistor 710A is to be formed, and may function as the interlayer insulating film that covers the gate electrode 715A and the crystalline silicon semiconductor layer 713 of the first thin film transistor 710A. When the interlayer insulating film of the first thin film transistor 710A and the gate insulating film of the second thin film transistor 710B are formed in the same layer (the second insulating layer) 716, as described above, the second insulating layer 716 may have a layered structure. For example, the second insulating layer 716 may have a layered structure including a hydrogen-donating layer (e.g., a silicon nitride layer) that is capable of supplying hydrogen, and an oxygen-donating layer (e.g., a silicon oxide layer) that is capable of supplying oxygen arranged on the hydrogen-donating layer.

The source and drain electrodes 718sA and 718dA of the first thin film transistor 710A and the source and drain electrodes 718sB and 718dB of the second thin film transistor 710B may be formed in the same layer. As illustrated in FIG. 20A, a crystalline silicon semiconductor layer 713A of the first thin film transistor 710A and the lower gate electrode 715B of the second thin film transistor 710B may be formed in the same layer. Herein, "being formed in the same layer" refers to being formed by using the same film (conductive film). Thus, it is possible to suppress the increase in the number of manufacturing steps and the manufacturing cost.

Figure 20B:
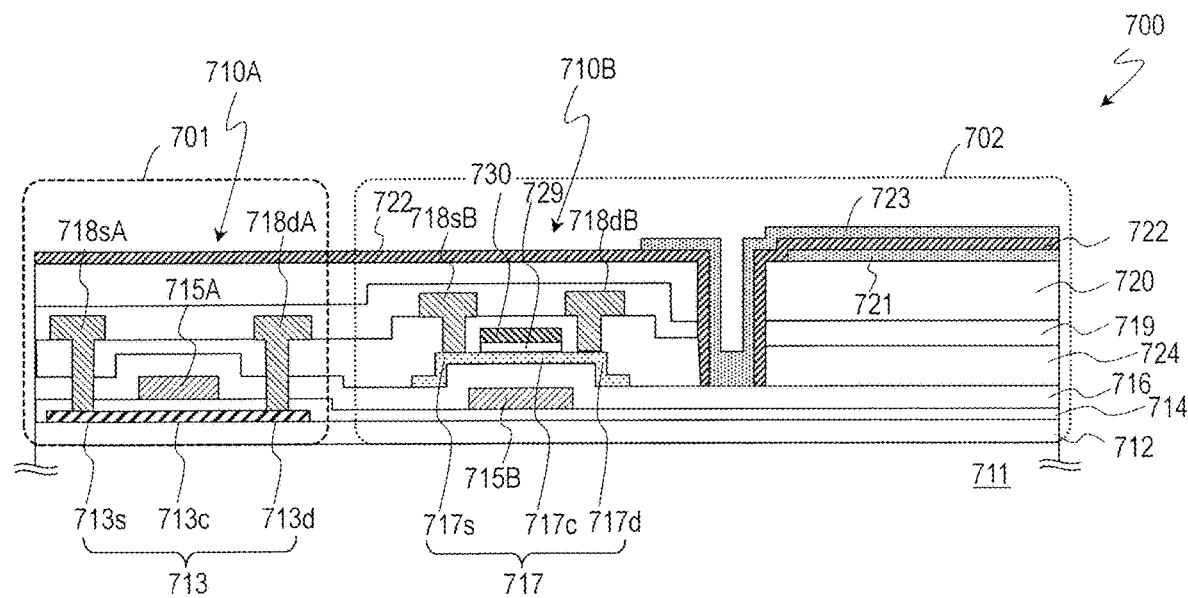
FIG. 20B is a cross-sectional view illustrating another active matrix substrate of the third embodiment.

Note that as illustrated in FIG. 20B, the gate electrode 715A of the first thin film transistor 710A and the lower gate electrode 715B of the second thin film transistor 710B may be formed in the same layer. In such a case, the fourth insulating layer 729, the upper gate electrode 730 and a fifth insulating layer 724 may be provided between the oxide semiconductor layer 717 and the passivation film 719.

(Regarding Oxide Semiconductor)

In all of the embodiments described above, the oxide semiconductor may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer may have a layered structure of two layers or more. When the oxide semiconductor layer has a layered structure, the oxide semiconductor layer may include an amorphous oxide semiconductor layer and a crystalline oxide semiconductor layer. Alternatively, it may include a plurality of crystalline oxide semiconductor layers of different crystalline structures. It may include a plurality of amorphous oxide semiconductor layers. When the oxide semiconductor layer has a two-layer structure including an upper layer and a lower layer, the energy gap of the oxide semiconductor included in the upper layer preferably has a greater energy gap than that of the oxide semiconductor included in the lower layer. Note however that when the difference in energy gap between these layers is relatively small, the energy gap of the oxide semiconductor of the lower layer may be greater than the energy gap of the oxide semiconductor of the upper layer.

The material, the structure, the film formation method of the amorphous oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layer may include at least one metal element from among In, Ga and Zn, for example. In the present embodiment, the oxide semiconductor layer includes an In—Ga—Zn—O-based semiconductor (e.g., indium gallium zinc oxide), for example. Herein, an In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such an oxide semiconductor layer can be formed from an oxide semiconductor film including an In—Ga—Zn—O-based semiconductor. Note that a channel etch-type TFT having an active layer including an oxide semiconductor such as an In—Ga—Zn—O-based semiconductor may be referred to as a "CE-OS-TFT".

An In—Ga—Zn—O-based semiconductor may be amorphous or crystalline. A crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layer may include another oxide semiconductor, instead of an In—Ga—Zn—O-based semiconductor. For example, it may include an In—Sn—Zn—O-based semiconductor (e.g., $In_2O_3$—$SnO_2$—ZnO; InSnZnO). An In—Sn—Zn—O-based semiconductor is a ternary oxide of In (indium), Sn (tin) and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—

Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, etc.

INDUSTRIAL APPLICABILITY

The embodiments of the present invention are widely applicable to various semiconductor devices including oxide semiconductor TFTs. For example, they are applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices. Particularly, they are suitably applicable to high-definition liquid crystal display devices.

REFERENCE SIGNS LIST

1: Substrate
3: Lower gate layer
3a: Lower gate electrode
3e: Lower gate extension
5: Lower insulating layer
7: Oxide semiconductor layer
7a: Active region
7e: Extension region
7c: Channel region
7d: Drain contact region
7s: Source contact region
8D: Drain electrode
8S: Source electrode
8g, 8g1, 8g2: Connecting portion
9: Upper insulating layer
10: Upper gate layer
10a: Upper gate electrode
10e: Upper gate extension
11: First inorganic insulating layer
11p, 11q, 11r: Opening
12: Second inorganic insulating layer
13: Interlayer insulating layer
13m, 13p, 13q: Opening
15: Lower transparent electrode
15a: Transparent connecting portion
15g, 15g1, 15g2: Connecting portion
15p: Opening
16: Organic insulating layer
17: Dielectric layer
17m, 17p, 17q: Opening
19: Upper transparent electrode
19g: Connecting portion
21: Air layer
30: Gate contact portion
31: First portion of gate contact portion
32: Second portion of gate contact portion
1001 to 1017: Active matrix substrate
C: Gate connecting portion
C1 to C5: Connecting portion
CE: Common electrode
CH1: Contact hole
CH2: Contact hole
CHd: Drain opening
CHs: Source opening
CHp: Pixel contact hole
PE: Pixel electrode
PIX: Pixel region
GL: Gate bus line
SL: Source bus line

The invention claimed is:

1. An active matrix substrate having a display region including a plurality of pixel regions,
the active matrix substrate comprising: a substrate; a plurality of gate bus lines and a plurality of source bus lines supported on the substrate; and oxide semiconductor TFTs arranged respectively in the plurality of pixel regions, wherein:
each of the plurality of pixel regions includes:
a lower insulating layer supported on the substrate;
an oxide semiconductor layer arranged on the lower insulating layer, wherein the oxide semiconductor layer includes an active region of the oxide semiconductor TFT;
an upper insulating layer arranged on a portion of the oxide semiconductor layer so as not to be in contact with the lower insulating layer;
an upper gate layer arranged on the upper insulating layer, wherein the upper gate layer includes an upper gate electrode that overlaps with a portion of the active region of the oxide semiconductor layer as seen from a normal direction to the substrate, and one of the plurality of gate bus lines formed integral with the upper gate electrode; and
a source electrode and a drain electrode that are in contact with the active region of the oxide semiconductor layer;
the oxide semiconductor layer further includes an extension region that extends from the active region in a direction different from a channel length direction of the oxide semiconductor TFT as seen from the normal direction to the substrate; and
the extension region is arranged on the substrate side of the one of the plurality of gate bus lines with the upper insulating layer interposed therebetween, and includes a portion that extends so as to overlap with the one of the plurality of gate bus lines as seen from the normal direction to the substrate.

2. The active matrix substrate according to claim 1, wherein in the oxide semiconductor layer, the each extension region extends under the plurality of the one of the gate bus lines so as to connect between the active regions of two adjacent ones of the plurality of pixel regions.

3. The active matrix substrate according to claim 1, wherein an almost entirety of a lower surface of the one of the plurality of gate bus lines is in contact with the upper insulating layer, and an almost entirety of a lower surface of the upper insulating layer is in contact with the oxide semiconductor layer.

4. The active matrix substrate according to claim 1, wherein:
the each of the plurality of pixel regions further includes:
a lower gate layer that is arranged between the substrate and the lower insulating layer; and
a gate contact portion that electrically connects together the lower gate layer and the upper gate layer;
as seen from the normal direction to the substrate, the lower gate layer includes a lower gate electrode that overlaps with at least a portion of the active region of the oxide semiconductor layer, and a lower gate extension that extends from the lower gate electrode to the gate contact portion; and in the gate contact portion, the extension region of the oxide semiconductor layer includes a portion that is arranged on the substrate side of the upper gate layer with the upper insulating layer interposed therebetween.

5. The active matrix substrate according to claim 1, wherein the oxide semiconductor layer includes an In—Ga—Zn—O-based semiconductor.

6. The active matrix substrate according to claim 5, wherein the In—Ga—Zn—O-based semiconductor includes a crystalline portion.

7. An active matrix substrate having a display region including a plurality of pixel regions,
the active matrix substrate comprising: a substrate; a plurality of gate bus lines and a plurality of source bus lines supported on the substrate; and oxide semiconductor TFTs arranged respectively in the plurality of pixel regions, wherein:
each of the plurality of pixel regions includes:
a lower gate layer that is supported on the substrate and includes a lower gate electrode;
a lower insulating layer that covers the lower gate layer;
an oxide semiconductor layer that is arranged on the lower insulating layer and includes an active region of the oxide semiconductor TFT, wherein at least a portion of the active region overlaps with the lower gate layer as seen from a normal direction to the substrate;
an upper insulating layer arranged on a portion of the oxide semiconductor layer so as not to be in contact with the lower insulating layer;
an upper gate layer arranged on the upper insulating layer;
a source electrode and a drain electrode that are in contact with the active region of the oxide semiconductor layer; and
a gate contact portion that electrically connects together the lower gate layer and the upper gate layer;
as seen from the normal direction to the substrate, the upper gate layer includes an upper gate electrode that overlaps with a portion of the active region of the oxide semiconductor layer, and an upper gate extension that extends from the upper gate electrode to the gate contact portion;
the oxide semiconductor layer further includes an extension region that extends from the active region in a direction different from a channel length direction of the oxide semiconductor TFT as seen from the normal direction to the substrate; and
in the gate contact portion, the extension region includes a portion that is arranged on the substrate side of the upper gate extension with the upper insulating layer interposed therebetween.

8. The active matrix substrate according to claim 7, wherein:
the gate contact portion includes a gate connecting portion that is provided in a layer above the upper gate layer;
the gate contact portion includes:
a first portion that connects together the gate connecting portion and the upper gate layer in a first opening that exposes a portion of the upper gate layer; and
a second portion that connects together the gate connecting portion and the lower gate layer in a second opening that exposes a portion of the lower gate layer; and
the first portion and the second portion are arranged spaced apart from each other.

9. The active matrix substrate according to claim 8, wherein as seen from the normal direction to the substrate, the gate connecting portion extends from the first portion to the second portion so as to overlap with the lower gate layer.

10. The active matrix substrate according to claim 8, wherein the gate connecting portion is formed by using a same conductive film as the source electrode.

* * * * *